(12) United States Patent
Gonzalez et al.

(10) Patent No.: US 10,114,554 B1
(45) Date of Patent: Oct. 30, 2018

(54) ARRANGEMENTS FOR STORING MORE DATA IN FASTER MEMORY WHEN USING A HIERARCHICAL MEMORY STRUCTURE

(71) Applicants: Juan Guillermo Gonzalez, Weston, FL (US); Santiago Andres Fonseca, Doral, FL (US); Rafael Camilo Nunez, Aventura, FL (US)

(72) Inventors: Juan Guillermo Gonzalez, Weston, FL (US); Santiago Andres Fonseca, Doral, FL (US); Rafael Camilo Nunez, Aventura, FL (US)

(73) Assignee: Intellectual Property Systems, LLC

( * ) Notice: Subject to any disclaimer, the term of this patent is extended or adjusted under 35 U.S.C. 154(b) by 0 days.

(21) Appl. No.: 15/249,627

(22) Filed: Aug. 29, 2016

Related U.S. Application Data

(63) Continuation of application No. 15/187,768, filed on Jun. 20, 2016, now abandoned, which is a
(Continued)

(51) Int. Cl.
*G06F 12/00* (2006.01)
*G06F 3/06* (2006.01)
(Continued)

(52) U.S. Cl.
CPC ............ *G06F 3/061* (2013.01); *G06F 3/0647* (2013.01); *G06F 3/0683* (2013.01);
(Continued)

(58) Field of Classification Search
CPC ............ G06F 12/0246; G06F 13/1657; G06F 3/0604; G06F 2212/1016; G06F 2212/1036; G06F 2212/7202
(Continued)

(56) References Cited

U.S. PATENT DOCUMENTS 6,240,431 B1    5/2001   Dyer
6,253,222 B1    6/2001   Dyer
(Continued)

OTHER PUBLICATIONS

J. Demmel, L. Grigori, M. F. Hoemmen, and J. Langou. Communication-optimal parallel and sequential QR and LU factorizations. Tech. Report No. UCB/EECS-2008. Berkeley, CA, USA.
(Continued)

*Primary Examiner* — Mardochee Chery

(57) ABSTRACT

Data employed in computations is processed so that during computations more of the data can be fit into or maintained in a smaller but higher speed memory than an original source of the data. More specifically, a sensitivity value is determined for various items of the data which reflect the number of bits in the data items that are not garbage bits, and only information in the data items that are indicated by the sensitivity value to not be garbage bits are necessarily effectively retained. At least the information that is not garbage bits and the corresponding associated sensitivity are packed together. The results of computations that are performed using the data items as at least one of the operands for the computation are associated with a sensitivity that is derived from the individual sensitivities of the operands used in the computation.

35 Claims, 51 Drawing Sheets

Related U.S. Application Data continuation of application No. 15/000,866, filed on Jan. 19, 2016, now abandoned.

(60) Provisional application No. 62/105,243, filed on Jan. 20, 2015.

(51) Int. Cl.
   *G06F 12/02* (2006.01)
   *G06F 13/16* (2006.01)

(52) U.S. Cl.
   CPC ........ *G06F 3/0604* (2013.01); *G06F 12/0246* (2013.01); *G06F 13/1657* (2013.01); *G06F 2212/1016* (2013.01); *G06F 2212/1036* (2013.01); *G06F 2212/7202* (2013.01)

(58) Field of Classification Search
   USPC .......................................................... 711/117
   See application file for complete search history.

(56) References Cited

U.S. PATENT DOCUMENTS

| | | | |
|---|---|---|---|
| 6,396,420 | B1 | 5/2002 | Augustine |
| 7,907,069 | B2 | 3/2011 | Oberdorfer |
| 8,301,803 | B2 | 10/2012 | Wegener |
| 8,368,568 | B2 | 2/2013 | Deslandes |
| 8,631,055 | B2 | 1/2014 | Wegener |
| 9,489,837 | B1* | 11/2016 | ElHilali ................. G08C 19/00 |
| 2002/0090141 | A1 | 3/2002 | Kenyon |
| 2009/0234973 | A1* | 9/2009 | Giordano ................ H03M 7/24 709/247 |

OTHER PUBLICATIONS

C. Rubio-Gonzalez, C. Nguyen, H. Nguyen, J. Demmel, W. Kahan, K. Sen, D. Bailey, C. Iancu, D. Hough. Precimoniuous: Tuning assistant for floating-point precision. SC'13.

M. O. Lam, J. K. Hollingsworth, and G. W. Stewart. Dynamic floating-point cancellation detection. Parallel Computing. vol. 39, Issue 3, 2013. Elsevier Science Publishers B.V.

A. W. Brown, P. H. J. Kelly, and W. Luk. Profiling floating point value ranges for reconfigurable implementation. Proc. of the 1st HiPEAC Workshop on Reconf. Computing, 2007.

Eva Darulova and Viktor Kuncak. Trustworthy numerical computation in Scala. OOPSLA 2011. Portland, Oregon, USA.

F. Dinechin, C. Lauter, and G. Melquiond. Certifying the floating-point implementation of an elementary function using Gappa. IEEE Transactions on Computers. Issue1. Feb. 2011.

D. Abadi, S. Madden, and M. Ferreira. Integrating compression and execution in column-oriented database systems. Proc. of the 2006 ACM SIGMOD. New York, NY, USA.

Eric Schkufza, Rahul Sharma, and Alex Aiken. Stochastic optimization of floating-point programs with tunable precision. OIDI'14. Jun. 2014. Edinburgh, UK.

J. Ke, M. Burtscher, and E. Speight. Runtime compression of MPI messages to improve the performance and scalability of parallel applications. SC'14. Washington, DC, USA.

R. Filgueira, D. Singh, A. Calderon, J. Carretero.CoMPI: Enhancing MPI based applications performance and scalabillity using run time compression.16th European PVM/MPI Meeting.

R. Filgueira, et. al. Adaptive CoMPI: Enhancing MPI-based applications—Performance and scalability by using adaptive compression. Int. J. of High Performance Computing App.

R. Filgueira, J. Carretero, D. Singh, A. Calderon, and A. Nunez. Dyanamic-CoMPI: Dynamic optimization techniques for MPI parallel computations. Journal of Supercomputing, 2010.

D. Lemire and L. Boytsov. Decoding billions of integers per second through vectorization. Software: Practice and experience. vol. 45, issue 1. Jan. 2015.

P. Lindstrom. Fast and efficient compression of floating-point data. IEEE Transactions on Visualization and Computer Graphics. vol. 12, issue 5. Sep.-Oct. 2006.

Steve Sullivan. Wavelet compression for floating point data—Sengcom. Oct. 11, 2012.

\* cited by examiner

```
void WaxpyWithSensitivity( double a,
                           unsigned long *X_Compressed,
                           unsigned long *Y_Compressed,
                           unsigned long *W_Compressed,
                           unsigned int N,
                           unsigned int PackingType,
                           unsigned int BlockSize ) {

// Declare and initialize variables; temporary variables are not defined here,
    // they should be declared as global and their initialization is external to this
    // function.
        int i, j; double Wj;
        unsigned int BitPointer_Xc, BitPointer_Yc, BitPointer_Wc;
        unsigned int Index_Xc, Index_Yc, Index_Wc;
        unsigned long Xe, Ye, We;
        BitPointer_Xc = 1;  BitPointer_Yc = 1;  BitPointer_Wc = 1;
        Index_Xc = 0;  Index_Yc = 0;  Index_Wc = 0;

// Main loop
        for ( i = 0;  i < N;  i = i + BlockSize ) {

// Read data from memory
                ReadFromMemoryWithSensitivity( X_Compressed, BlockSize, X, Xv,
                                               &Index_Xc, &BitPointer_Xc, PackingType,
                                               se, sec, vm, Xr );
                ReadFromMemoryWithSensitivity( Y_Compressed, BlockSize, Y, Yv,
                                               &Index_Yc, &BitPointer_Yc, PackingType,
                                               se, sec, vm, Xr );

// Compute AXPY and sensitivity
                for ( j = 0;  j < BlockSize;  j++ ) {
                    W[j] = a*X[j] + Y[j];
                    Xe = (  ( ( (unsigned long) X[j] )<<1 ) >> 53  ) - BIAS;
                    Ye = (  ( ( (unsigned long) Y[j] )<<1 ) >> 53  ) - BIAS;
                    We = (  ( ( (unsigned long) W[j] )<<1 ) >> 53  ) - BIAS;
                    Wv[j] = max(  0, We - max(  We - Xv[j], Ye - Yv[j]  )  );
                }

// Write results in memory
                WriteToMemoryWithSensitivity( W, BlockSize, Wv, W_Compressed,
                                              &Index_Wc, &BitPointer_Wc, PackingType,
                                              se, sec, vm, Wr );
        }
        return;
}
```

FIG. 9

```
void WaxpyWithSensitivity_UnpackedOutput( double a,
                                          unsigned long *X_Packed,
                                          unsigned long *Y_Packed,
                                          unsigned long *W,
                                          unsigned int N,
                                          unsigned int PackingType,
                                          unsigned int BlockSize ) {

// Declare and initialize variables; temporary variables are not defined here,
    // they should be declared as global and their initialization is external to this
    // function.
        int i, j;
        unsigned int BitPointer_Xc, BitPointer_Yc;
        unsigned int Index_Xc, Index_Yc;
        unsigned long Xe, Ye;
        BitPointer_Xc = 1;  BitPointer_Yc = 1;
        Index_Xc = 0;  Index_Yc = 0;

// Main loop
        for ( i = 0;  i < N;  i = i + BlockSize )  {

// Read data from memory
                ReadFromMemoryWithSensitivity( X_Packed, BlockSize, X, Xv,
                                               &Index_Xc, &BitPointer_Xc, PackingType,
                                               se, sec, vm, Xr );
                ReadFromMemoryWithSensitivity( Y_Packed, BlockSize, Y, Yv,
                                               &Index_Yc, &BitPointer_Yc, PackingType,
                                               se, sec, vm, Xr );

// Compute AXPY and sensitivity
                for ( j = 0;  j < BlockSize;  j++ )  {
                    W[i*BlockSize+j] = a*X[j] + Y[j];

}
        return;
}
```

FIG. 12

```
void CompressY( int *Y, int N, int *Y_Compressed, int *M ) {
  int i;  int j = 0;  int p = 0;  int d;  int L;  int last = 0;
  for ( i = 0; i < N; i++ ) {
    // Predict
      d = Y[i] - last;
      last = Y[i];
    // Count leading zeros
      L = __builtin_clz( abs(d) );
    // Encode
      PushToArray( L, 28, 32, Y_Compressed, &j, &p ); // leading zeros
      PushToArray( d, 1, 1, Y_Compressed, &j, &p );   // sign of d
      PushToArray( d, L+1, 32, Y_Compressed, &j, &p ); // truncated d
  }
  *M = j;
  return;
}
```

```
void DecompressY( int *Y_Compressed, int M, int *Y, int *N ) {
  int i = 0;  int j = 0;  int p = 0;  int d; int L; int last = 0;
  do {
      // Decode
        L = PullFromArray( Y_Compressed, &j, &p, 5 );
        sign = (-1) * PullFromArray( Y_Compressed, &j, &p, 1 );
        d = sign * PullFromArray( Y_Compressed, &j, &p, L );
      // Compute Y and predict next element
        Y[i] = last - d;
        last = Y[i];
        i++;
  } while( i < N );
  return;
}
```

```
void DiscriminateAndPack( int *Y, int Ny,
                          int *Y_ToSend, int *N, int b)  {
    int i;
    int Incrementk = 0;   int P = 0;   int k = 0;   int y1, y2;
    Y_ToSend[k] = 0;
    for ( i = 0;   I < Ny;   i++ ) {
        y1 = ( y[i]<<b ) >> P;
        if ( (P-b) >0 ) {
            y2 = y[i] << (32-P);
            Incrementk = 1;
        } else {
            y2 = 0;
            P += (32-b);
        }
        Y_ToSend[k] += y1;
        Y_ToSend[k+1] = y2;
        if ( Incrementk ) {
            k++;
            Incrementk=0;
            y_ToSend[k]=0;
        }
    }
    *N=k;
    return;
}
```

FIG. 32

```
void DiscriminateAndRewrite( int *Y, int Ny,
                             int *Y_ToSend, int *N, int b ) {
    int i;
    int Mask=0xFF;
    Mask= (Mask << b)>> b;
    for (  i = 0; I < Ny; i++   ) {
        Y_ToSend[i] = Y[i]&Mask;
    }
    *N = Ny;
    return;
}
```

```
:
:
for (  i = 0; i < N; i++ )
{
    Y_ToSend[i] = abs( Y[i] );
}
CompressAndSend( Y_ToSend, N, destination );
:
:
```

```
void Unpack( int *Y_Received, int N, int *Y, int Ny, int b )
{
    int i;
    int y1, y2;
    int p = 0
    int Incrementk = 0;
    int k = 0
    for ( i = 0; I < Ny; i++ )
    {
        y1 = Y_Received[k] << p;
        if ( (p-b) > 0 )
        {
            y2 = Y_Received[k+1] >> (p+1);
            p = p - b;
            Incrementk = 1;
        }
        else
        {
            y2 = 0
            p = ( (p+32-b) % 32 ) + 1;
        }
        y[i] = y1 + y2;
        if ( IncrementK ){
            k++;
            Incrementk=0;
        }
    }
    return;
}
```

FIG. 35

```c
void PackWithSensitivity_BitElimination( double*Y, double*X,
                                    unsigned long N,
                                    unsigned long *s,
                                    unsigned long *Ns,
                                    unsigned long *e,
                                    unsigned long *Ne,
                                    unsigned long *m,
                                    unsigned long *Nm,
                                    unsigned long *sensitivity
                                    unsigned long *Nsensitivity)
{
    int i, Ps, Pe, Pm, Psensitivity;
    double delta;
    unsigned long delta_AsInterger, sign, exponent, mantissa;
    unsigned long sensitivity;
    Ps = 0;  Pe = 0;  Pm = 0;  Psensitivity = 0;
    *Ns = 0;  *Ne = 0;  *Nm = 0;  *Nsensitivity = 0;
    for (i=0; i<N; i++)
    {
      Delta = Y[i]-X[i];
      delta_AsInteger = (unsigned long) delta;
      sign = delta_AsInteger >> 63;
      exponent = (delta_AsInteger<<1) >> 54;
      mantissa = (delta_AsInteger<<12) >> 12;
      if (  fabs(delta) < fabs(Y[i]) )
      {
        sensitivityT=((((unsigned long)X[i])<<1)>>54))-exponent;
      }
      else
      {
        sensitivity = 52;
      }
      Mantissa = mantissa >> (52-sensitivityT);
      PushToArray( sign, 1, s, Ns, &Ps );
      PushToArray( exponent, 11, e, Ne, &Pe );
      PushToArray( mantissa, sensitivityT, Nm, &Pm );
      PushToArray( sensitivityT, 6, sensitivity, Nsensitivity,
                   &Psensitivity);
    }
    return;
}
```

FIG. 40

```
void  PackWithSensitivity_BitReplacing(double *Y, double *X,
                                       unsigned long N,
                                       unsigned long *s,
                                       unsigned long *Ns,
                                       unsigned long *e,
                                       unsigned long *Ne,
                                       unsigned long *m,
                                       unsigned long *Nm)
{
   int i, Ps, Pe, Pm, Psensitivity;
   double delta;
   unsigned long delta_AsInteger, sign, exponent, mantissa;
   unsigned long sensitivity;
   Ps=0; Pe=0; Pm=0; Psensitivity=0;
   *Ns=0; *Ne=0; *Nm=0; *Nsensitivity=0;
   for (i=0; i<N; i++)
   {
      Delta = Y[i]-X[i];
      delta_AsInteger = (unsigned long) delta;
      sign = delta_AsInteger>>63;
      exponent = (delta_AsInteger<<1)>>54;
      mantissa = (delta_AsInteger<<12)>>12;
      if ( fabs(delta) < fabs(Y[i]))
      {
         sensitivityT=((((unsigned long)X[i])<<1)>>54))-exponent;
      }
      else
      {
         sensitivity = 52;
      }
      mantissa=(mantissa>>(52-sensitivityT))<<(52-sensitivityT);
      PushToArray( sign, 1, s, Ns, &Ps );
      PushToArray( exponent, 11, e, Ne, &Pe );
      PushToArray( mantissa, 52, Nm, &Pm );
   }
   return;
}
```

FIG. 42

```
void  UnpackWithSensitivity ( unsigned long *s,
                              unsigned long Ns,
                              unsigned long *e,
                              unsigned long Ne,
                              unsigned long *m,
                              unsigned long Nm,
                              unsigned long *sensitivity,
                              unsigned long Nsensitivity,
                              unsigned long *delta,
                              unsigned long N )
{
    unsigned long i;
    unsigned long sign, exponent, mantissa, sensitivityT;
    unsigned long i_s, i_e, i_m, i_sensitivity;
    unsigned long Ps, Pe, Pm, Psensitivity;
    unsigned long delta_AsInteger;

i_s = 0;  i_e = 0;  i_m = 0;  i_sensitivity= 0 ;
    Ps = 0;  Pe = 0;  Pm = 0;   Psensitivity = 0;

for ( i = 0;  i < N;  i++ )
    {
        sign = PullFromArray( s, 1, &i_s, &Ps );
        sign = sign << 63;
        exponent = PullFromArray( e, 11, &i_e, &Pe );
        exponent = exponent << 54;
        sensitivity = PullFromArray( sensitivity, 6,
                    &i_sensitivity, &Psensitivity );
        mantissa = PullFromArray( m, sensitivityT, &_m, &P_m );
        mantissa = mantissa << (52-sensitivityT);
        delta_AsInteger = sign + exponent + mantissa;
        delta[i] = (double)delta_AsInteger;
    }
    return;
}
```

FIG. 46

```
void WriteToMemoryWithSensitivity(
    double *X,                      // Input array
    unsigned int Nx,                // Number of elements in X
    unsigned long *Xv,              // Sensitivities of numbers in X
    unsigned long *Xc,              // Output (sensitivity-packed) array
    unsigned int *Index_Xc,         // First element of Xc available for writing
    unsigned int *BitPointer_Xc,    // First bit (from MSB to LSB) of
                                    // Xc[*Index_Xc] available for writing
    unsigned int PackingType,       // Type of packing
    unsigned long *se,              // Array of combined sign-exponent (aux)
    unsigned long *sec,             // Array of compressed se (aux)
    unsigned long *vm,              // Array of combined sensitivity-mantissa
                                    // (auxiliary variable)
    double *Xr,                     // Array of sensitivity-based modified X
                                    // (auxiliary variable)
                                    ) {
    // Declare and initialize variables
        int i;      // Index for loops
        int j = 0; int k = 0;       // Indices for data packing
        int p = 1; int q = 0;       // Pointers for data packing
        int M;      // Size of compressed arrays
        unsigned long X_AsInteger;   // Casts values of X as integers // Optional: Use predictor (e.g., delta encoder) for elements in X // Packing with bit elimination
        if ( PackingType == BIT_ELIMINATION_WITH_COMPRESSED_SIGN_AND_EXPONENTS ) {
            for ( i = 0; i < Nx; i++ ) {
                X_AsInteger = (unsigned long) X[i];
                // Read sign and exponents
                    PushToArray( X_AsInteger, 1, 12, se, &j, &p );
                // Pack mantissas with sensitivity information
                    PushToArray( Xv[i], 59, 64, vm, &k, &q );
                    PushToArray( X_AsInteger, 13, (13+(Xv[i]-1)), vm, &k, &q );
            }

// Compress sign and exponents
                Compress( se, (j+1), sec, &M );

// Pack into a single array Xc
                PushToArray( M, 1, 64, Xc, Index_Xc, BitPointer_Xc );
                PushArrayToArray( sec, 1, 64*M, Xc, Index_Xc, BitPointer_Xc );
                PushToArray( k, 1, 64, Xc, Index_Xc, BitPointer_Xc );
                PushToArray( j, 1, 64, Xc, Index_Xc, BitPointer_Xc );
                PushArrayToArray( vm, 1, 64*k + q, Xc, Index_Xc, BitPointer_Xc);
        }

// Packing with bit replacing
        else if ( PackingType == BIT_REPLACING )  {
            for ( i = 0; i < Nx; i++ ) {
                X_AsInteger = (unsigned long) X[i];
                // Replace LSBs with zeros
                    X_AsInteger = ( X_AsInteger >> (52-Xv[i]) ) << (52-Xv[i]);
                Xr[i] = X_AsInteger;
            }
            Compress( Xr, N, vm, &M );
            PushArrayToArray( vm, 1, 64*M, Xc, Index_Xc, BitPointer_Xc);

}

// Other packings
        else {
            // Other packings
        }

// Return
        return;
}
```

FIG. 49

```
void ReadFromMemoryWithSensitivity(
    unsigned long *Xc,          // Input, ssensitivity-packed array
    unsigned int Nx,            // Number of elements in X
    double *X,                  // Output array
    unsigned long *Xv,          // Sensitivities of numbers in X
    unsigned int *Index_Xc,     // First element of Xc to be read
    unsigned int *BitPointer_Xc,// First bit (from MSB to LSB) of
                                // Xc[*Index_Xc] to be read
    unsigned int PackingType,   // Type of packing
    unsigned long *se,          // Array of combined sign-exponent (aux)
    unsigned long *sec,         // Array of compressed se (aux)
    unsigned long *vm,          // Array of combined sensitivity-mantissa
                                // (auxiliary variable)
    double *Xr,                 // Array of sensitivity-based modified X
                                // (auxiliary variable)
) {
// Declare and initialize variables
    int i;                      // Index for loops
    int j = 0; int k = 0;       // Indices for data packing
    int p = 1; int q = 1;       // Pointers for data packing
    int M, Nse;                 // Size of compressed arrays
    unsigned long X_AsInteger;  // Casts values of X as integers // Packing with bit elimination
    if ( PackingType == BIT_ELIMINATION_WITH_COMPRESSED_SIGN_AND_EXPONENTS ) {
        // Unpack into a combined sign-exponent and sensitivity-mantissa
        // arrays
            M = PullFromArray( Xc, Index_Xc, BitPointer_Xc, 64 );
            PullArrayFromArray( Xc, Index_Xc, BitPointer_Xc, sec, 64*M );
            j = PullFromArray( Xc, Index_Xc, BitPointer_Xc, 64 );
            p = PullFromArray( Xc, Index_Xc, BitPointer_Xc, 6 );
            PullArrayFromArray( Xc, Index_Xc, BitPointer_Xc,
                                vm, 64*(j-1) + p );
            j = 0; p = 1;

// Decompress sign and exponents
            Decompress( sec, M, se, &Nse );

for ( i = 0;  i < Nx;  i++ ) {
            // Read sign and exponents
                X_AsInteger = ( PullFromArray( se, &j, &p, 12) ) << 52;

// Unpack mantissas with sensitivity information
                Xv[i] = PullFromArray( ve, &k, &q, 6 );
                X_AsInteger = X_AsInteger
                            + PullFromArray( ve, &k, &q, Xv[i] );

// Cast as double
                X[i] = (double)X_AsInteger;
        }
    }

// Packing with bit replacing
    else if ( PackingType == BIT_REPLACING ) {
        M = PushFromArray( Xc, Index_Xc, BitPointer_Xc, 64 );
        PushArrayFromArray( Xc, Index_Xc, BitPointer_Xc, Xr, 64*M );
        Decompress( Xr, M, X, &Nx );
    }

// Other packings
    else {
        // Other packings
    }

// Return
    return;
}
```

FIG. 51

ARRANGEMENTS FOR STORING MORE DATA IN FASTER MEMORY WHEN USING A HIERARCHICAL MEMORY STRUCTURE

CROSS-REFERENCE TO RELATED APPLICATIONS

This application is a Continuation of co-pending U.S. patent application Ser. No. 15/187,768, entitled SYSTEMS AND METHODS FOR REDUCING DATA MOVEMENT IN HIERARCHICAL MULTILEVEL MEMORIES, filed on Jun. 20, 2016, which is a Continuation of U.S. patent application Ser. No. 15/000,866, entitled SYSTEMS AND METHODS FOR REDUCING DATA MOVEMENT IN HIERARCHICAL MULTILEVEL MEMORIES, filed on Jan. 19, 2016, which claims priority to U.S. Provisional Patent Application No. 62/105,243, entitled SYSTEMS AND METHODS FOR REDUCING DATA MOVEMENT IN HIERARCHICAL MULTILEVEL MEMORIES, filed on Jan. 20, 2015, the disclosures of which are herein incorporated by reference in their entirety.

This application is related to the U.S. Provisional Patent Application No. 61/910,010, entitled SYSTEMS AND METHODS OF WACSING AND ANCHORING FOR REDUCING DATA TRAFFIC IN DISTRIBUTED COMPUTING SYSTEMS, filed on Nov. 27, 2013, U.S. patent application Ser. No. 14/556,098, entitled SYSTEMS AND METHODS FOR REDUCING DATA MOVEMENT IN COMPUTER SYSTEMS, filed on Nov. 28, 2014, U.S. Patent Application No. 62/101,347, SYSTEMS AND METHODS FOR REDUCING BIT LENGTH IN COMPUTER SYSTEMS, filed on Jan. 8, 2015, U.S. Provisional Patent Application No. 62/105,398, entitled "SYSTEMS AND METHODS FOR REDUCING BIT LENGTH IN COMPUTER SYSTEMS", filed on Jan. 20, 2015, and U.S. patent application Ser. No. 14/990,747, entitled "SYSTEMS AND METHODS FOR REDUCING BIT LENGTH IN COMPUTER SYSTEMS", filed on Jan. 7, 2016, the disclosures of which are herein incorporated by reference in their entirety.

STATEMENTS REGARDING FEDERALLY SPONSORED RESEARCH OR DEVELOPMENT

N/A.

BACKGROUND

Technical Field

The present invention relates generally to the field of computing. More specifically, the present invention is related to bit length reduction in computer systems.

Representing Numerical Data in Computer Applications

Computer applications, including algorithms and software that is executed in computer and/or digital systems are used in many fields today, e.g., solution of linear equations, solution of partial differential equations, analysis of financial market statistics, weather modeling, mechanical design, aircraft design, automotive design, structural design, among many others. Virtually every computer application requires the use of digital representations of numbers.

In digital/computer systems, numbers are encoded by means of binary digits or bits. There are multiple formats or encodings available for representing numerical data (i.e., numbers) in computer applications. Some examples include, among others: integers, fixed point, floating point, and logarithmic representations. In general, these formats define a number of bits (usually known as "precision") and a format for storage of information that represent numerical data. Users or designers of computer applications may select formats and precisions based on several criteria, such as desired accuracy of the solutions rendered by the application, available capacity for data storage, etc.

Regardless of the format or encoding of a number, it is desired to use as less bits as possible for its representation. Reasons for this goal may include: maximizing the use of storage capacity, reducing access times, reducing communication time, reduce time to solution, reducing power consumption, etc. These problems may be addressed using data compression and/or mixed precision techniques. This patent provides solutions for further reducing the number of bits (i.e., bit length) that are transmitted between any two levels of hierarchical memory systems.

Floating Point Representations of Numerical Data

As an example of formats used for representing numbers, here we briefly describe the floating point format. In general, the representation of a given number x in floating point is based on four parameters, namely: a sign s, a significant f, an exponent base b, and an exponent e. A number x in floating point format is expressed in the following manner:

$$x = \pm f \times b^e.$$

There are many alternative floating point representation formats. For illustration purposes, we focus on the ANSI/IEEE 754 format for the description of the embodiments described in this document, although it should be apparent to someone skilled in the art that the embodiments will also work for other floating point and non-floating point formats, in general. The standard representation specified by ANSI/IEEE 754 specifies the following:
  a) The exponent base is 2 (i.e., b=2).
  b) The sign is either +1 or −1, and it is represented by a sign bit s set to 1 if the sign is −1, and 0 if it is +1.
  c) The significant is f=1.m, where m is a binary number usually referred to as mantissa, which may be of length 23 bits for single-precision floating point numbers, or 52 bits for double-precision floating point numbers.
  d) The exponent is a biased binary number of length 8 bits for single-precision floating point numbers, and length 11 bits for double-precision floating point numbers. In its decimal representation, the bias is 127 in single precision floating point numbers, and 1023 in double precision floating point numbers.
  e) Special cases are also encoded into the floating point standard: 0, NaN, Inf, and −Inf.

Addition and subtraction are basic operations for floating point numbers. The addition of two floating point numbers $x_1$ and $x_2$ may be described as follows (note that the following explanation also describes the subtraction, as the subtraction may be converted into an addition by flipping the sign of the number to be subtracted). Consider the addition:

$$(\pm 1.m_1 \times 2^{e1}) + (\pm 1.m_2 \times 2^{e2}) = \pm 1.m \times 2^e.$$

In a typical arithmetic processing unit, the two numbers are aligned by shifting to the right the mantissa of the number with the smaller exponent. Without loss of generality, assume that $e_1 \geq e_2$. In this case, the second number (i.e., $x_2$) is shifted and becomes:

$$\pm 1.m_2 \times 2^{e2} = (\pm 1.m_2)/(2^{e1-e2}) \times 2^{e1}.$$

The operation above is equivalent to shifting $1.m_2$ to the right by $(e_1 - e_2)$ bits. After the operands are aligned, the addition proceeds as follows:

$$(\pm 1.m_1 \times 2^{e1}) + (\pm 1.m_2 \times 2^{e2}) = (\pm 1.m_1 + 1.m_2/2^{e1-e2}) \times 2^{e1}$$

$$= (\pm f_3) \times 2^{e1}.$$

In typical implementations, this result goes through a process of normalization to produce the result in a format that complies with the floating point standard. That is to say, the addition renders $x_3 = (\pm f_3) \times 2^{e1} = (\pm 1.m_3) \times 2^e$.

Storing and Moving Data in Memory

Computer systems may count with several types of memory, with particular types being distinguished by characteristics such as access time, power consumption, capacity (i.e., total number of bits/data elements that may be stored in the memory), cost, etc. When more than one type of memory is available, the memories may be classified according to their performance (e.g., response time, complexity, capacity) in levels or hierarchies. Memories at the lower part of the hierarchy may have fast access speeds for data retrieval, as well as low energy consumption, but are usually more expensive and hence usually come in smaller capacities. Memories located at the higher part of the hierarchy may be larger in capacity, but have slower access times and consume larger (average) amounts of energy per bit moved.

The memory hierarchies of today's computing systems may be composed of (ascending from the lowest level in the hierarchy to the highest): a system of registers, a group of cache memories (such as L0, L1, L2, L3, etc.), a system of local memories (such as RAM), and a system of external storage (such as hard disk drives, solid state drives, cloud storage, etc.) In general, the time it takes to access data in a memory levels increase as the level increases (e.g., the time it takes for retrieving a given data from L1 is less than the time it takes for retrieving said data from L2, L3, L4, etc.).

In computer applications, it is common practice to try to keep as much data movement as possible around the lower levels of the memory hierarchy, thus minimizing costs, both in access time and power consumption. When data is moved to a higher level of the hierarchy, a higher cost in access time and power consumption is paid. Thus, there exists a constant need of moving fewer bits to the memories in higher levels of the hierarchy.

SUMMARY OF THE DISCLOSURE

The present invention provides systems and methods for reducing data movement between levels of a hierarchical memory system, or, in general, reducing data movement in computer systems.

BRIEF DESCRIPTION OF THE SEVERAL VIEWS OF THE DRAWINGS

A more complete understanding of the invention, and the attendant advantages and features thereof, will be more readily understood by reference to the following detailed description when considered in conjunction with the accompanying drawings wherein:

FIGS. 6-12 show embodiments.
FIGS. 31-51 show embodiments.

DETAILED DESCRIPTION

Figure 1:
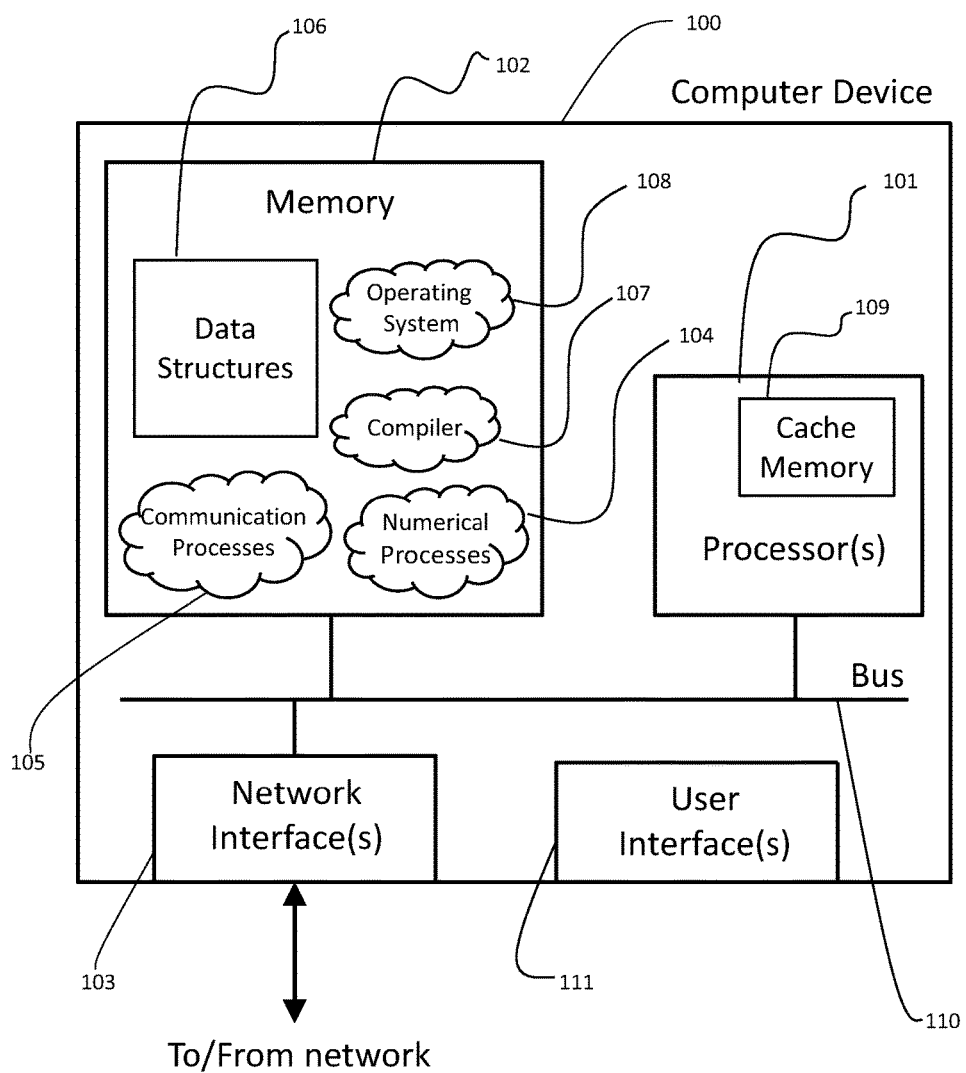
FIG. 1 illustrates an example computer device.

Reference will now be made in detail to exemplary embodiments of the present invention, examples of which are illustrated in the accompanying drawings, wherein like reference numerals refer to the like elements throughout. The exemplary embodiments are described below to explain the present invention by referring to the figures.

As used in the description of this application, the terms "a", "an", and "the" may refer to one or more than one of an element (e.g., item or act). Similarly, a particular quantity of an element may be described or shown while the actual quantity of the element may differ. The terms "and" and "or" may be used in the conjunctive or disjunctive sense and will generally be understood to be equivalent to "and/or". References to "an" or "one" embodiment are not necessarily all referring to the same embodiment. Elements from an embodiment may be combined with elements of another. No element used in the description of this application should be construed as critical or essential to the invention unless explicitly described as such. Further, when an element is described as "connected", "coupled", or otherwise linked to another element, it may be directly linked to the other element, or intervening elements may be present.

As discussed in the background, numerical processes, codes, or algorithms often rely on moving and/or storing large amounts of data. This data may be inputs, outputs, or intermediate variables, parameters, or, in general, numbers or signals, generated during the execution of numerical processes. This data movement or storage may occur at different levels in computer systems. For example, data may be moved from a storage device, from external memory to cache memory in a personal computer, or among computer devices in a supercomputer network. The present invention provides systems and methods for reducing the number of bits transferred between levels of a hierarchical memory model in computer systems.

Overview of the Components of an Implementation

FIG. 1 is a schematic block diagram of an example computer device 100 that may be used with one or more embodiments described herein. The computer device may comprise at least one processor 101, a memory 102, and one or more network interfaces 103. The memory 102 may comprise a plurality of storage locations that are addressable by the processor 101 and the network interface 103. The memory 102 may be used for storing software programs, numerical processes 104, communication processes 105, and data structures 106 associated with the embodiments described herein. When data structures 106 are separated among several computer devices 100, the computer system may be called "distributed memory system". The memory 102 may also store portions of an operating system 108, which are executed by the processor and which functionally organize the computer device by invoking operations in support of software processes and/or services executing on the device. The memory 102 may also store portions of a compiler 107, which is software that converts object or code programs into a set of instructions to be executed by a processor 101 (e.g., programs that implement embodiments). The processor 101 may comprise hardware elements or hardware logic adapted to execute the software programs and manipulate the data structures. The processor 101 may have one or more cache memories 109. The time for accessing to data stored in a cache memory 109 is typically shorter than the time for accessing said data in memory 102. In computer devices that include both cache memory 109 and memory 102, the cache memory 109 is usually referred to as a lower hierarchy memory, and the memory 102 is referred to as a higher hierarchy memory.

The computer device 100 may comprise a user interface 111. A user interface 111 is an item or combination of items for a user to provide input (e.g., text, voice, position) and/or receive output (e.g., text, images, video, audio) to/from the computer device. Examples of items for a user to provide inputs in a user interface 111 include keyboards, mice, and microphones. Examples of items for a user to receive outputs in a user interface 111 include monitors, printers, and speakers. Through a user interface 111, a user may provide data and/or parameters to software programs, numerical processes 104, communication processes 105, and data structures 106 associated with the embodiments described herein.

The network interfaces 103 may be configured to transmit and/or receive data using a variety of different communication protocols. Data may be organized into data packets for transmission through a network interface 103, according to a network communication protocol. Examples of network communication protocols are IEEE standard 802.15.4, WiFi, Bluetooth, etc. A software program, numerical process 104, communication process 105 may be generated by compiling a set of instructions written in some programming language. Examples of programming languages are C, FORTRAN, VHDL, PHP, Python, etc. Operations in a communication process 105 may be defined using standard software libraries, protocols, and standards, such as Message Passing Interface (MPI), OpenMP, etc.

Figure 2:
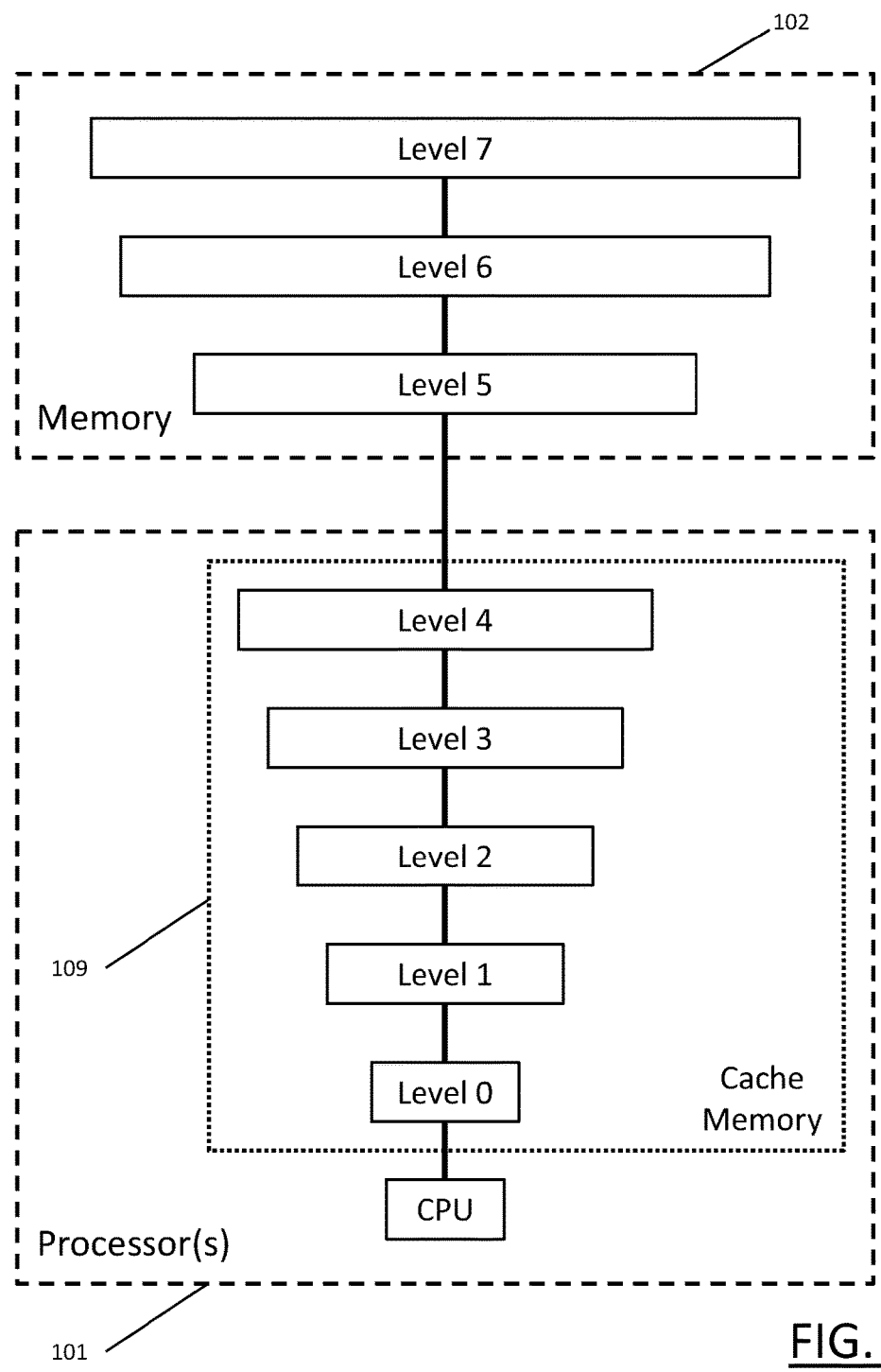
FIG. 2 illustrates a memory hierarchy model.

A group of memories (e.g., memory 102 and cache memory 109, as well as their internal components) may be organized by levels in a hierarchical memory model. FIG. 2 shows an example hierarchical memory model that may be used in an embodiment. Lower levels are characterized by having lower access time, and may have lower power consumption, but lower levels may also be more expensive. This makes that, in typical hierarchical models, the lower the level the lower the capacity (in bits) of the memory. An example classification by levels includes levels 0 to 7 as follows: Level 0 are the registers of a CPU in a processor 101; level 1 are specialized instructions and data cache memory; level 2 includes a shared instructions/data cache memory; levels 3 and 4 may be bigger cache memories which may be shared by multiple CPUs and/or processors 101; level 5 is the main memory (e.g., RAM); level 6 is disk storage; and level 7 is any tertiary storage such as optic devices, network drives, cloud-based storage, etc.

Data transfers between levels of a hierarchical memory model may occur as part of the execution of an algorithm. An algorithm may be any sequence of data, steps, or processing elements that are used for solving a numerical problem. Examples of numerical problems are the solution of linear equations, partial differential equations, weather forecast, engineering structural analysis, etc.

Exemplary embodiments described herein assume data transfers between one or more cache-level (i.e., lower hierarchy) memories, which may include any of the memories in levels 0 to 4, and one or more higher hierarchy memories (e.g., levels 5 to 7). However, one skilled in the art should notice that embodiments may be used for reducing data transfers between any two levels of a memory hierarchy model. One skilled in the art would also appreciate that the invention may be used in various environments other than in hierarchical memory models. For example, the embodiments may be used for reducing data transfers in asymmetric distributed systems. In yet another exemplary scenario, a computer device may reduce the number of bits that represent a set of data elements for storage (e.g., in memory, disc) in a computer device.

Bit-Garbage in Numerical Data

Binary representations of numbers in computer devices vary in format and characteristics. For example, the ANSI/IEEE 754 format defines floating point numbers, where specific formats for 32-bit and 64-bit representations of numbers are defined. ASCII defines the encoding of 128 characters using 7 bits. Similarly, other formats standardized or not, may be used in computer devices. The selection of appropriate formats to represent numbers in an algorithm or application is typically done by a designer or user of the device, whom may use particular knowledge or criteria related to the application that will use the binary representation, or simply arbitrarily selecting formats. For example, one criterion for the selection of binary representations may be enabling faster computations. Even when data formats are carefully selected, typical scenarios in applications of computer systems/devices may contain binary representations of data elements that include some bits that are either not used, or that may contain corrupted data.

Figure 3A:
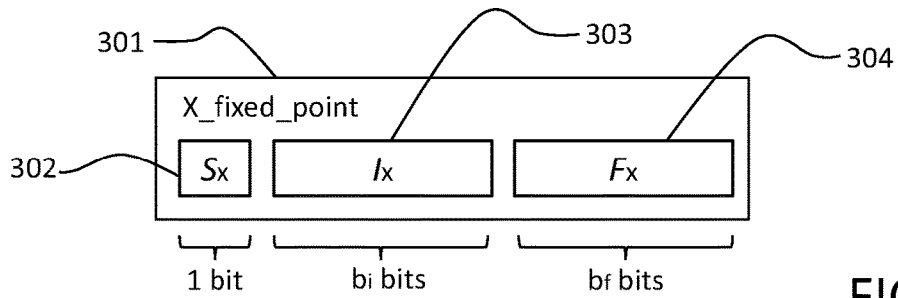
FIGS. 3A-4C illustrate example data representations and bit garbage.
Figure 3B:
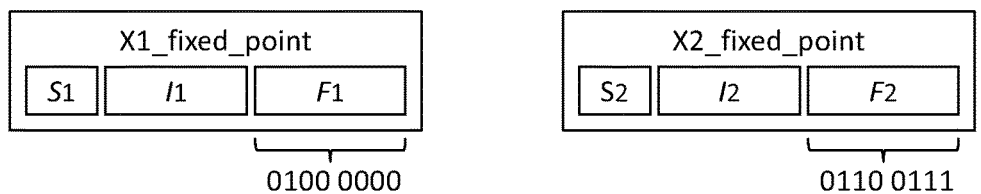
Figure 3C:
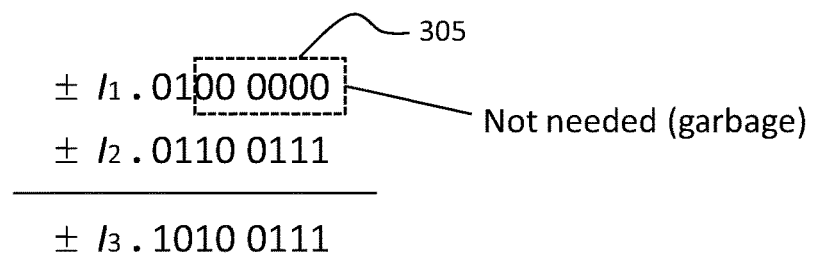

FIGS. 3A, 3B, and 3C illustrate a scenario where some bits may not be used in arithmetic computations in a computer device. This scenario shows an arithmetic operation with binary numbers using a fixed-point representation. A data element X may be represented as X_fixed_point (i.e., element 301) in fixed point arithmetic, as illustrated in FIG. 3A. The exemplary data element X_fixed_point in FIG. 3A is made of three components, namely, a sign bit $S_x$ (element 302), an integer part $I_x$ of $b_i$ bits (element 303), and a fractional part $F_x$ containing $b_f$ bits (element 304). Based on the format illustrated in FIG. 3A, FIG. 3B shows fixed point representations $X_1$_fixed_point and $X_2$_fixed_point corresponding to two data elements $X_1$ and $X_2$, respectively. For illustration purposes, consider the case of the fractional part of $X_1$ containing the bits $F_1$='01000000', and the fractional part of $X_2$ containing the bits $F_2$='01100111'. FIG. 3C illustrates the bit-alignment of data in $X_1$_fixed_point and $X_2$_fixed_point for an addition/subtraction operation. Note that, in this addition operation, the set of bits 305 are zeros. If bits 305 were not included in the arithmetic operation shown in FIG. 3C, or if these bits 305 were not stored in a fixed point representation $X_1$_fixed_point, the result of the arithmetic operation in FIG. 3C would not be affected. We may refer to sets of bits that may not be used as "garbage" bits.

Figure 4A:
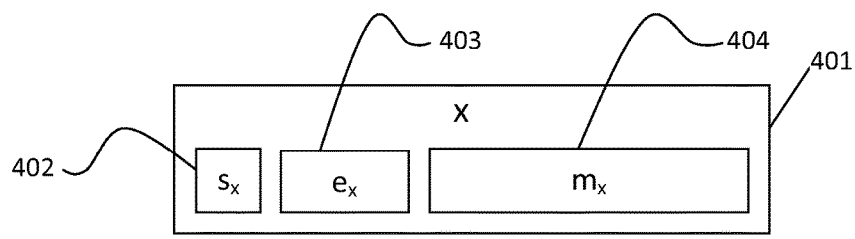
Figure 4B:
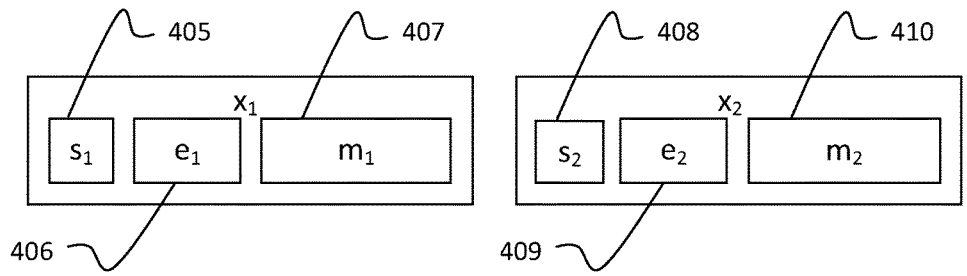
Figure 4C:
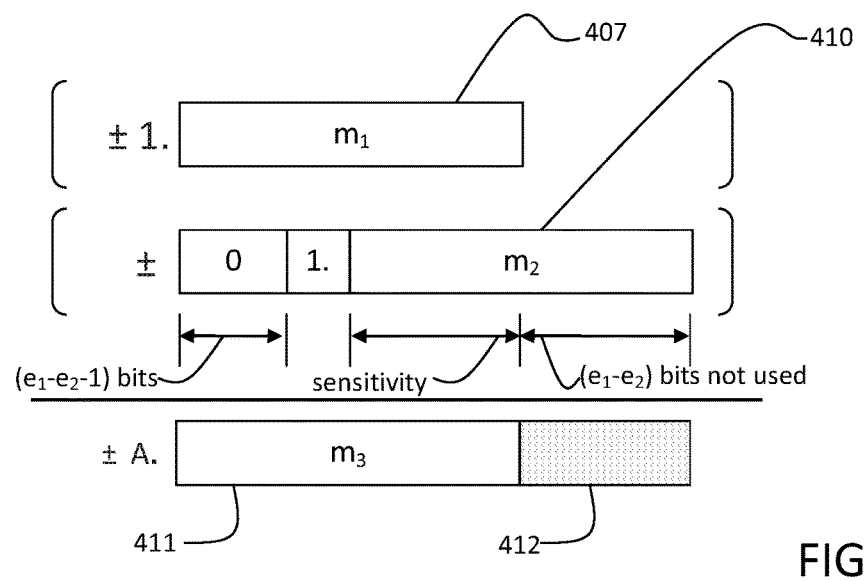

Similarly, another exemplary scenario that illustrates the presence of garbage bits in binary representations of data is shown in FIGS. 4A, 4B, and 4C. FIG. 4A illustrates a typical representation of the components of a floating point number 401: a sign bit s, 402, an exponent "$e_x$," 403, and a mantissa "$m_x$," 404. The number of bits and particular formats of each of these components are defined by floating point standards such as ANSI/IEEE 754. Based on the exemplary format shown in FIG. 4A, FIG. 4B illustrates the components $s_1$, $e_1$, and $m_1$, of a floating point number $x_1$, and the components $s_2$, $e_2$, and $m_2$, of a floating point number $x_2$. FIG. 4C illustrates an operation that occurs in a floating point addition and that involves mantissas $m_1$ and $m_2$. As part of a standard floating point addition $x_3=x_1+x_2$, the mantissa of the smaller number is shifted to the right. FIG. 4C illustrates this shifting in an example in which $x_1>x_2$, which requires shifting $m_2$ by $(e_1-e_2)$ bits to the right. Once the mantissa $m_2$ is shifted, both mantissas are added, producing a mantissa $m_3$, which is represented by 411. An additional group of bits 412 may be generated, which are produced only by the rightmost bits of $m_2$. The group of bits 412, which originally belonged to $m_2$, is not used when only the output $m_3$ is needed for characterizing the mantissa of a resulting floating point number $x_3$. This means that the group of bits 412 may then be eliminated from $m_2$ or replaced by any convenient pattern of bits (e.g., zeros) without affecting the result of the floating point addition. According to an aspect of the description, groups of bits that may be eliminated or replaced without affecting the result of a floating point operation (e.g., multiplication), such as 412, may also be identified for other arithmetic operations, and may be called "garbage" bits.

Similar to the above described scenarios, other scenarios may exist in which garbage bits are embedded as part of the binary representation of numbers in computer systems/devices. An embodiment may use information about garbage for reducing the bit length of data elements in computer systems/devices.

According to the spirit of the invention, the number of bits of garbage at the rightmost part of the representation of a number may be characterized by a parameter. We may call this parameter the "sensitivity" of the number. In general, according to the spirit of the invention, sensitivity information and/or rules that define its computation may be provided by a user. An alternative for receiving the sensitivity parameter is through a user interface 111 in an embodiment (e.g., keyboard-monitor, speech recognition system, selection list, configuration file, among others). Sensitivity information may be given as a number directly defined by a user or defined based on a default configuration, or whose value may be estimated from formulas, methods, or systems, with said formulas, methods, or systems being defined by a user and input into an embodiment. According to an aspect of the invention, the sensitivity parameter indicates a bit number, from MSB to LSB, that separates a group of bits that should be used in binary representations of numerical data elements, from a group of LSBs that may be considered as garbage bits. For a floating point number, for example, the sensitivity parameter V of a number indicates that the least significant bits of the mantissa beginning with the "(V+1)-th" up to the LSB (or, alternatively, to a bit defined by a maximum sensitivity parameter called "$V_{max}$" have very little information that is useful, or that eliminating such bits will not introduce substantial error into the subsequent computations of an application. In other words, for a floating point number, the sensitivity parameter/value of a number indicates that the bits (V+1)-th of the mantissa and all subsequent mantissa bits beyond the (V+1)-th are considered, for practical effects, as garbage, in the sense that a user, either directly or indirectly by not altering default sensitivity configuration in an embodiment, is not interested in exploiting the information in those bits, or the user has reasons to believe that those bits will not be relevant for the numerical quality of the computations within an overall application.

According to an aspect of the invention, the sensitivity parameter may be used when encoding a data element for storage (e.g., in memory, cache memory, disc, or any other digital media), for transmission, for memory read/write operations, or for any operation that may occur as part of the execution of an algorithm. Sensitivity information of a number may depend on several factors, such as the type of arithmetic operation, other numbers that are operated with it, the purpose for which the result of the arithmetic operation will be used, among others. Sensitivity information of an arbitrary number $x_1$ may not be the same of other arbitrary number $x_2$. Sensitivity information of a number may change in time when arithmetic operations that include the number are executed. In an embodiment, the dynamic nature of sensitivity may be used for dynamically adapting the number of bits in binary representation of numbers that may be eliminated or replaced by other bit patterns, when sensitivity information represents the number of MSBs that should be used for encoding, transmitting, storing, or operating said data elements numbers. For example, in FIG. 4C, we may set a value called "sensitivity of $m_2$" to indicate the number of bits in $m_2$ that are used in the floating point addition $x_3=x_1+x_2$ described above.

In an embodiment, sensitivity information of a number may be used throughout the execution of an application for reducing the number of bits in data movement, or data storage, or both. A user of an application may define sensitivity information of numbers using rules, methods, or systems for computing sensitivity values of numbers, in such a way that the number of bits indicated by the sensitivity values is used in one or more points during the execution of the application, in order to make decisions that will potentially improve the resource usage by the application. For example, a sensitivity value may be used for deciding the number of bits of the mantissa of a floating point number to be transferred from a higher-level memory to a lower-level memory (or equivalently the number of bits of the mantissa that may be discarded without compromising too much the accuracy of the results); or sensitivity information may be used for deciding stop criteria in an iterative algorithm.

Forward Sensitivity Analysis

An embodiment may implement sensitivity analysis/tracking computations in an application that runs in a computer system/device or a distributed computer system by doing at least one of the following: (i) Set the sensitivities values of the application's data element to initial values indicated by the user; if the user does not indicate an initial sensitivity value for a given input number, then set the sensitivity value for said number to a default, typically $V_{max}$; (ii) Set the sensitivities values of each constant data element (i.e., data elements whose value do not change during the execution of an application) used internally by the application, to specific values indicated by the user; if the user does not indicate a sensitivity value for a given internal constant data element, then said value is set to a default, typically $V_{max}$; (iii) for every specific operation in the application, compute the sensitivities values of the operation's output data element or data elements, using a method, formula, system, or rule indicated by the user; if the user does not indicate a method, formula, system, or rule for computing the sensitivity value of a particular operation output, then set said sensitivity value to a default, typically $V_{max}$.

Recall that within the spirit of the invention, a variable may be any scalar value or data element of an array in a numerical algorithm. Note that the sensitivity value of a variable may or may not change in time as the application makes different computations for the variable at different instances of time. For example, if there is an operation of a variable x early during the execution of the application, with said operation resulting in the computation of a new value for x, described as "Operation 1: x=x+1", and there is a subsequent operation at some instance in time, operating again over variable x, and described as "Operation 2: x=x+1", then the sensitivity value of x at the output of operation 1 may be different from the sensitivity value of x at the output of operation 2 because different formulas may have been defined by the user for computing sensitivities in 1 and 2, or because the input data and/or input sensitivities of operation 1 may be different to those of operation 2. A user may define different formulas, rules, mechanisms, or methods for computing sensitivities for any number being computed at any point in time, based on what the user considers may be more convenient at any given case.

In an exemplary embodiment, the system performs sensitivity computations only for a limited subset of the operations and/or variables and/or data elements in the application, as indicated by the user. In such an embodiment, the operators not selected by the user do not perform any type of sensitivity computation, which may save resources or simplify the implementation of the system. For example in a system where most of the application's data movement time is consumed by the processing within a particular subsystem, the user may define sensitivity computations only for the operations and variables inside said subsystem, and ignore for purposes of sensitivity computation, all the operations and variables outside the subsystem. The user may use the technique of making the sensitivity values of all input data to the subsystem equal to $V_{max}$, so to effectively isolate sensitivity computation inside the subsystem without the need for sensitivity computation outside the subsystem. This type of isolation of sensitivity computations may help save computational resources and simplify implementation.

In an exemplary embodiment, there is a set of methods, formulas, systems, or rules that define the computations or updates of the sensitivity values, with different methods, formulas, systems, or rules being defined for different specific operations, and said definitions depending on at least: (1) the type of operation being performed, (2) the data values at the input of the operation, and (3) the sensitivity values of said input data. For example, there may be a formula for sensitivity computations that is to be applied whenever two floating point numbers are added inside the application, another formula for sensitivity computations whenever two floating point numbers are multiplied, etc.

We refer in general to a given set of methods, formulas, systems, or rules for computing sensitivities as "algebra of sensitivities".

In an exemplary embodiment, we denote the algebra of sensitivities as "0-conservative" and define it as follows. Let $E_i$, $V_i$, and $V_i^*$ denote the exponent, sensitivity, and "absolute sensitivity", respectively, of a floating point number. Let the absolute sensitivity of the floating point number be defined as $V_i^* = E_i - V_i$. It should be apparent for someone skilled in the art that the absolute sensitivity is an indicator of "absolute precision" for the floating point number in the case the $(V_{max} - V_1)$ least significant bits of the mantissa are truncated. Let $x_1, x_2, x_3$ be in general floating point numbers. Then, the following rules and formulas make the definition of the 0-conservative algebra:
  i) For $x_1 = x_2 + x_3$ (addition): $V_1 = E_1 - V_1^*$, with $V_1^* = \max(V_2^*, V_3^*)$, $V_2^* = E_2 - S_2$, and $V_3^* = E_3 - S_3$. If $V_1 < 0$ then $S_1 = 0$. If $V_1 > V_{max}$, then $V_1 = V_{max}$.
  ii) For $x_1 = x_2 \times x_3$ (multiplication): $V_1 = \min(V_2, V_3)$. If $V_1 < 0$ then $V_1 = 0$. If $V_1 > V_{max}$, then $V_1 = V_{max}$.
  iii) For any other operations, set the sensitivities of any and all outputs to $V_{max}$.

The 0-conservative algebra is a "garbage tracking consistent" algebra. We define a garbage tracking consistent algebra as an algebra that for the operations in which it is explicitly defined (mainly addition and multiplication in the definition above), the following holds true: If the sensitivities of the inputs are "consistent", then the resulting sensitivities of the outputs will be consistent as well. We define the sensitivity "V" of a number as "consistent" if the user has reasons to believe that the least significant bits of the mantissa beginning with the "(V+1)-th" up to the "$V_{max}$-th" bit have very little information that is useful, or equivalently, that eliminating such bits will not introduce substantial error into the subsequent computations of the application. In other words, the sensitivity value of a number is defined as consistent if the bits (V+1)-th of the mantissa and all subsequent mantissa bits beyond the (V+1)-th are considered, for practical effects, as garbage by the user, in the sense that the user is not interested in exploiting the information in those bits. As an example, suppose that a sensor measures a physical variable and provides the result of the measurement as a number in 64-bit floating point arithmetic with 52 bits of mantissa. The user knows, for example, that the precision of the sensor, as defined by its manufacturer, is a relative precision of $2^{-10}$, in the sense that the manufacturer guarantees that relative errors of the measurement will always be less than $2^{-10}$. In view of that information, a certain user might feel comfortable discarding bits 11-th to 52-nd in the mantissa of the number and thus would define V=10 as a consistent sensitivity for that number. Another more conservative user might not feel comfortable with that value of the sensitivity and might want to use the first 14 bits in the mantissa instead of only the first 10 bits. For this user, V=14 would be a consistent sensitivity for the number. Likewise, V=15, 16, etc., up to 52, would also be consistent values of sensitivity of the number for that same user. There may also be another user who knows for example how the measurements made by the sensor will be used by the application, and, based on that information in, would be comfortable with a more aggressive truncation, say using V=8. For this latter user, V=8 would be a consistent sensitivity for the measurement, as would be V=9, 10, . . . , 52. Note that sensitivity computations defined in item ii) above for multiplication operations, are likely to produce consistent sensitivities (for a given user) for the number $x_1$, provided that said user considers $x_2$ and $x_3$ to be consistent. This is because bits $(V_2+1)$-th, $(V_2+2)$-th, etc. of the mantissa of $x_2$ will have direct incidence on the values of bits $(V_2+1)$-th, $(V_2+2)$-th, etc. of the mantissa of $x_1$, and similarly, bits $(V_3+1)$-th, $(V_3+2)$-th, etc. of the mantissa of $x_3$ will have direct incidence on bits $(V_3+1)$-th, $(V_3+2)$-th, etc. of the mantissa of $x_1$. At the same time, the aforementioned bits in $x_2$ and $x_3$ will have no incidence at all on bits 1, 2, etc., up to bit $\min(V_2, V_3)$ of the mantissa of $x_1$. So, if both bits $(V_2+1)$ and beyond, in $x_2$, and bits $(V_3+1)$ and beyond, in $x_3$, are considered as potential garbage by the user, then the user may feel compelled, and with strong mathematical reasons, to consider bits $(V_1+1)$ and beyond in the mantissa of $x_1$ as potential garbage as well. Hence the sensitivity computation formula in item ii) above may be considered "garbage tracking consistent" by some users. It should be apparent to a person skilled in the art that analogous considerations for the sensitivity computation proposed for the addition operation in item i) above would lead to consider that formulation as "garbage tracking consistent" as well.

It should be apparent to someone skilled in the art, that the algebra of sensitivities defined above is not the only way to track garbage consistently, and that many other algebra formulations to achieve consistent garbage tracking may be formulated. For example, similar considerations may be used to produce formulations that work effectively for other non floating point formats, such as fixed point, integer, logarithmic arithmetic format, etc. It should also be apparent for someone skilled in the art that many different structures or algebras of sensitivities may be proposed for additions and multiplications, and for other possible operators. In another exemplary embodiment, an algebra that we call an "N-conservative" algebra, where N is a positive integer number, is used. Within this algebra, sensitivities are computed as N plus the result delivered by the "0-conservative" algebra. In yet another exemplary embodiment denoted "N-aggressive", where N is an integer number, sensitivities may be computed as N subtracted from the result delivered by the "0-conservative" algebra. In both the N-conservative and the N-aggressive algebras the sensitivities may be bounded between 0 and $V_{max}$ to allow consistency of operation with any bit elimination and packing subsystems that would use sensitivity information.

A user may use experimentation or a priori information about the application to determine which garbage tracking algebras to adopt. A user may also use theoretical concepts and mathematical analysis to produce convenient garbage tracking algebras that may be accepted as consistent for the user. A user may then incorporate sensitivity values and/or rules through a user interface 311.

Backward Sensitivity Analysis

According to an aspect of the invention, sensitivity estimation/tracking may be defined based on how data elements are going to be used. Hence, the sensitivity values of a number may be defined by a user through methods, formulas, systems, or rules that consider how the data elements will be used in an application, in what we call "backward sensitivity" analysis.

An embodiment may define backward sensitivity analysis of floating point numbers as follows. Given a set of data elements $Y=[y_1, \ldots, y_n]$, with $n \geq 1$, the sensitivity values $V_Y=[v_{y1}, \ldots, v_{yn}]$ of the data elements Y is computed as: $v_{yi}=\max(0, V_{max}-(E_{max}-E_{yi}))$, with $E_{yi}$ being the exponent of data element $y_i$, $i=1, \ldots, n$, and $E_{max}=\max(E_{y1}, \ldots, E_{yn})$. We call this definition 0-conservative backward sensitivity.

Another embodiment may define backward sensitivity analysis of floating point numbers as follows. Given a set of data elements $Y=[y_1, \ldots, y_n]$, with $n \geq 1$, split the set into subsets $Y_k$ of size $s_{Yk}$ of each subset $Y_k$ satisfying $s_{Yk} \leq n$, and with $\Sigma_k s_{Yk}=n$. Then, compute the sensitivity value of each element of a subset $Y_k$ using 0-conservative backward sensitivity on the subset $Y_k$ (i.e., considering only the elements of the subset $Y_k$ for computing $E_{max}$). We call this definition the "windowed 0-conservative backward sensitivity". For example, a vector $Y=[y_1, y_2, y_3, y_4, y_5]$ may be split into two subsets $Y_1=[y_1, y_2, y_3]$ and $Y_2=[y_4, y_5]$. Then, according to the windowed 0-conservative backward sensitivity analysis, 0-conservative backward sensitivity may be used independently in $Y_1$ and $Y_2$ instead of in the full vector Y.

An embodiment may define backward sensitivity analysis of floating point numbers as follows. Given a set of data elements $Y=[y_1, \ldots, y_n]$, with $n \geq 1$, compute the sensitivity value of each element $y_i$ as the 0-conservative backward sensitivity defined on the subset $Y_k=[y_1, \ldots, y_i]$, for $i=1, \ldots, n$. We call this definition the "progressive 0-conservative backward sensitivity".

It should be apparent to someone skilled in the art, that the algebras of backward sensitivities defined above are not the only way to define backward sensitivities. For example, N-conservative and N-aggressive definitions may also be defined, similar to the way described for forward sensitivity analysis above. The definitions may also be used and/or adapted for sensitivity analysis of other types of data, such as fixed-point, logarithmic, etc. Furthermore, forward and backward sensitivity may be combined in an embodiment, with the sensitivity value being selected based on the smaller of the sensitivity values given by one or more forward and/or backward sensitivity algebras.

Massively Asymmetric Precision (MAP) Data Representations

In an exemplary embodiment, the number of bits used for encoding and/or packing data elements of a numerical variable or array may vary from element to element. Since the number of bits used for representing a numerical variable is commonly known as "precision", we may refer to said encoding as Massively Asymmetric Precision (MAP). MAP allows more flexibility in assigning precisions for the representation of numerical variables than other techniques such as "Mixed Precision". Recall that, in mixed precision, even though operations may be done between arrays of data that have different representations (e.g., for two arrays $x_1$ and $x_2$, where $x_1$ may be encoded as an array of 32 bit numbers, and $x_2$ as an array of 64 bit numbers), all the data elements of an array share the representation that defines said array (e.g., if the array $x_1$ is defined on a 32-bit encoding, then all the elements of $x_1$ are 32-bit numbers; likewise, if the array $x_1$ is defined on a 64-bit encoding, then all the elements of $x_1$ are 64-bit numbers). In a MAP representation, the precision of each data element may change in time as the execution of an algorithm progresses.

The flexibility in data representations enabled by MAP may support attaining higher compression gains for the representation of numbers in computer devices and/or memory systems. Although exemplary embodiments described herein are based on floating point formats, any equivalent modifications and variations according to the spirit of the invention that use other data formats are to be included within the scope of the claims stated below.

Figure 5A:
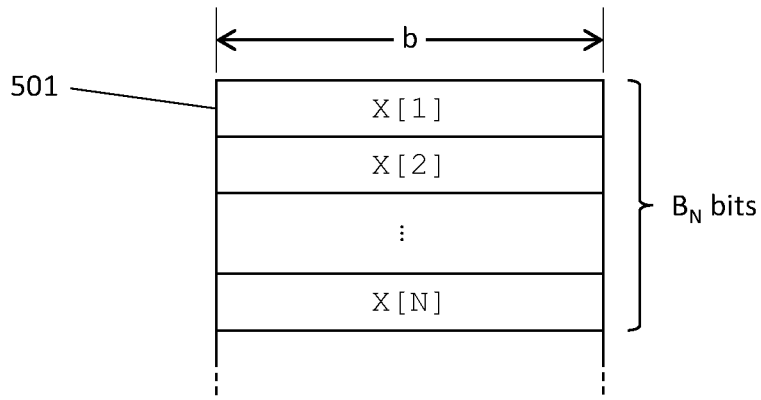
FIGS. 5A-5C illustrate example data storage formats.
Figure 5B:
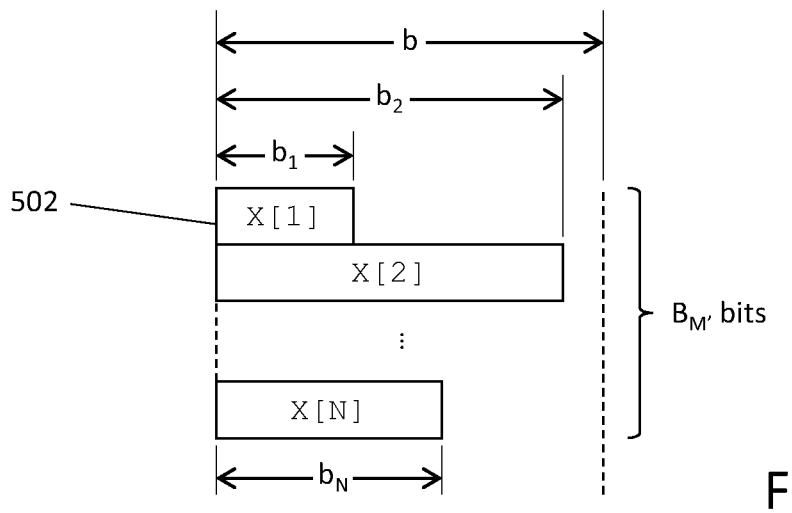
Figure 5C:
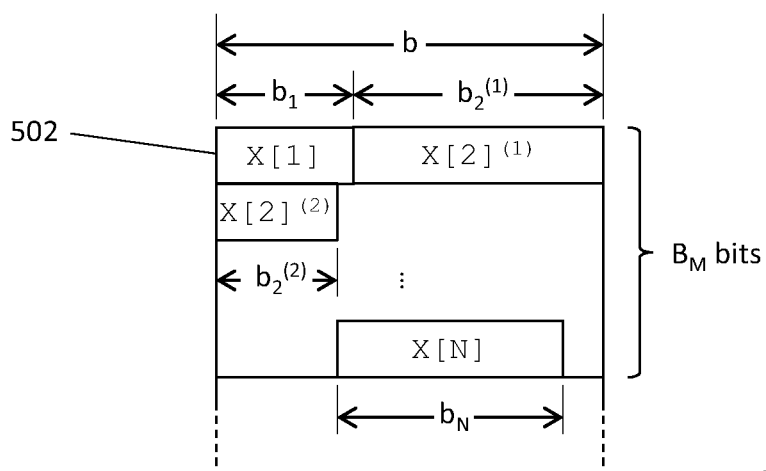

FIG. 5A illustrates an alternative for the storage of a set of data elements $X=\{X[1], X[2], \ldots, X[N]\}$, $N \geq 1$, in a memory system (e.g., memory 102, cache memory 109). Arrays or sets of data elements are typically stored in a computer device 100 using some type of data format. Examples of data formats include, among others, char, integer, float, and double. In general, the definition of a type of data format indicates the number of bits of elements of the array. This number of bit is commonly referred to as the word size. In FIGS. 5A-5C, the word size is "b". Examples of word sizes are, among others, 8 bits for char data type, 32 bits for float, and 64 bits for double. Data storage 501, which is the storage alternative illustrated in FIG. 5A, is defined by all N elements having the same word size b. Then, when data storage 501 is used, the number of bits used for storing the dataset X is $B_N=b \times N$.

FIG. 5B illustrates a possible storage of X using MAP. We may refer as data storage 502 to indicate that a set of data X is stored using MAP. As mentioned above, when MAP is used, the number of bits for storing different elements of data set X may vary. For example, in FIG. 5B, X[1] may be stored using $b_1$ bits, X[2] using $b_2$ bits, etc. The number of bits $b_i$, $1 \leq i \leq N$, may be less than, equal, or larger than some word size b. When data storage 502 is used, the number of bits used for storing the dataset X is $B_M=\Sigma_i b_i=b_1+b_2+\ldots+b_N$.

Data storage 502 may be organized in memory in various forms. For example, data may be stored as shown in FIG. 5B, or using the MSB of bits each word in an arrangement like the one illustrated in FIG. 5A. Data 502 may also be organized in memory as independent arrays of signs, exponent, and mantissas. Storage of data 502 may comprise parameters and complementary information to indicate, for example, the lengths $b_i$, $1 \leq i \leq N$. Another example is illustrated in FIG. 5C, where the first bit of each data element is positioned right after the last bit of its previous data element, and where data is split into words of some size b. When data storage 502 is organized in memory using the format illustrated in FIG. 5C, the number of bits used for storing is at most $B_M = \lceil B_M/b \rceil$. If a reduced number of bits is desired, for example, to reduce data transfers between memory hierarchies, then, $B_M$ should be less than $B_N$. If other target is pursued (for example, obtaining higher accuracy in the results of a numerical algorithm), then $B_M$ may be larger than $B_N$.

Reducing Data Movement Between Memory Hierarchies

Figure 6:
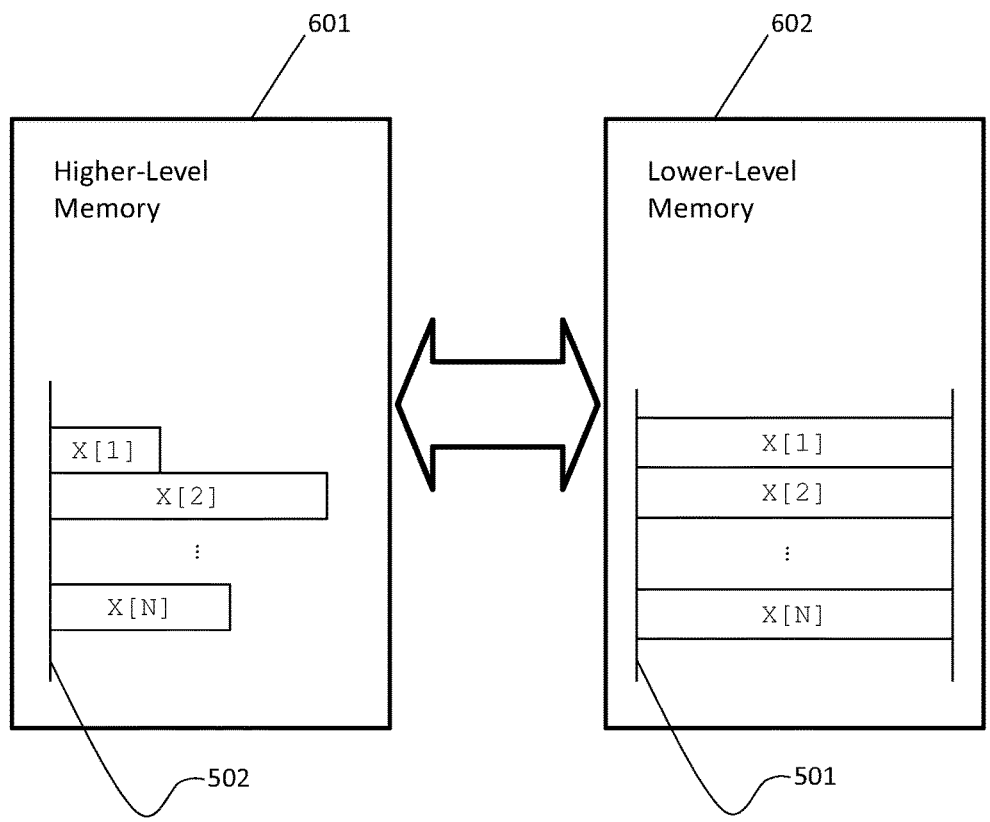

According to an aspect of the invention, data transfers may be reduced by storing a data set X using data storage 502 (i.e., MAP) in a higher memory hierarchy, and rendering its corresponding data storage 501 (i.e., full/native/some default precision) in a lower memory hierarchy (e.g., cache) when data X is going to be operated. FIG. 6 shows an exemplary embodiment in which X is stored in a higher-level memory using data storage 502 (i.e., MAP), and X is stored in a lower-level hierarchy (e.g., cache) using data storage 501. The operations for conversions between data storages 501 and 502 may be done in a processor 101, so that data traveling from a memory 102 to a processor 101 through a bus 110 corresponds to the potentially smaller number of bits enabled by data storage 502. We may refer to the operations for conversions from a native data storage format 501 to MAP format 502 as "packing" or "packing into MAP". We may refer to the converse case, i.e., operations for conversions from MAP format 501 to native format 501 as "unpacking" or "unpacking from MAP". A number of exemplary embodiments that may be used for packing and/or unpacking are shown later in this description.

Packing into MAP may be done using sensitivity information. In an algorithm, packing into MAP may generate shorter representations of a data set X in a higher-level memory. These shorter representations allow for transmission of a reduced number of bits between memory hierarchies, resulting in potential accelerations in the execution of said algorithm. Shorter representations may also allow for increasing the capacity of a memory.

Figure 7:
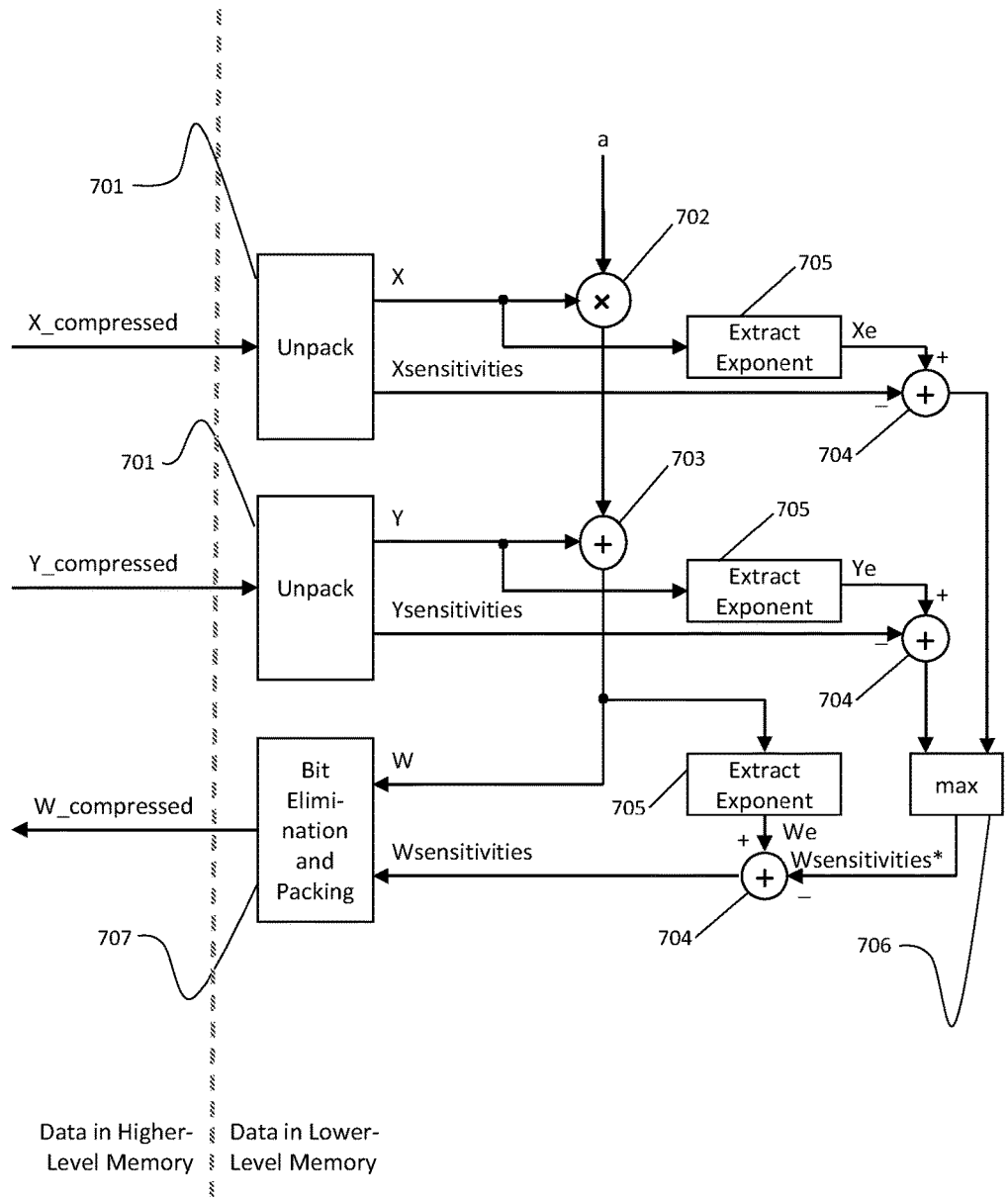

FIG. 7 shows an exemplary embodiment for acceleration of memory read/write operations within a WAXPY operator, based on MAP and sensitivity information. A WAXPY operator computes a vector W=aX+Y, where "a" is a scalar, and X, Y, and W are vectors of equal size. In the exemplary embodiment of FIG. 7, the elements of vectors X and Y are floating point numbers that are packed along with each component's sensitivity in a higher level memory (e.g., RAM, memory 302) of a computer device. Unpack systems 701 unpack the data and output X, Xsensitivities, Y, and Ysensitivities, element by element. The exponents of X and Y, Xe and Ye, respectively, are extracted and their floating point exponent bias is subtracted by "extract exponent" components 705. Xe and Ye are operated with their corresponding sensitivities Xsensitivities and Ysensitivities by integer adders 704, followed by an operator 706 that computes the maximum of two integers. The output of the operator 706 contains W*sensitivities, the absolute sensitivities of W computed based on a 0-conservative algebra. The elements of X, Y, and scalar "a" are operated using a floating point multiplier 702 and a floating point adder 703 to obtain W=aX+Y. The unbiased exponent of W, $W_e$, is extracted from W using an "extract exponent" component 705. $W_e$ and W*sensitivities are operated using an adder 704 to obtain the sensitivity values of the elements of W, Wsensitivities. The elements of both W and Wsensitivities are computed one at a time and are then fed to a bit elimination and packing subsystem 701. All of these operations are done in fast low-level hierarchy memory, typically registers of the computer system. Once a full memory word or a group of memory words has been packed in reduced length format it may be sent to a higher level memory (e.g., local RAM, memory 302) for storing of results. It should be apparent to someone skilled in the art that using methods or systems similar in spirit to those depicted in FIG. 7 would allow all vector data to be resident in RAM memory in shorter (packed) formats and thus resulting in savings of memory space, potential savings of power consumption, and potential speedups for the computations by virtue of the reduction in the total number of bits to be transferred from/to local RAM memory to/from the processor unit of the computer system. In a computer device 101, transfer of data in X_Compressed, Y_Compressed, and W_Compressed between different memory hierarchies may be handled automatically by components in a processor 101 and/or operating system 108.

Figure 8:
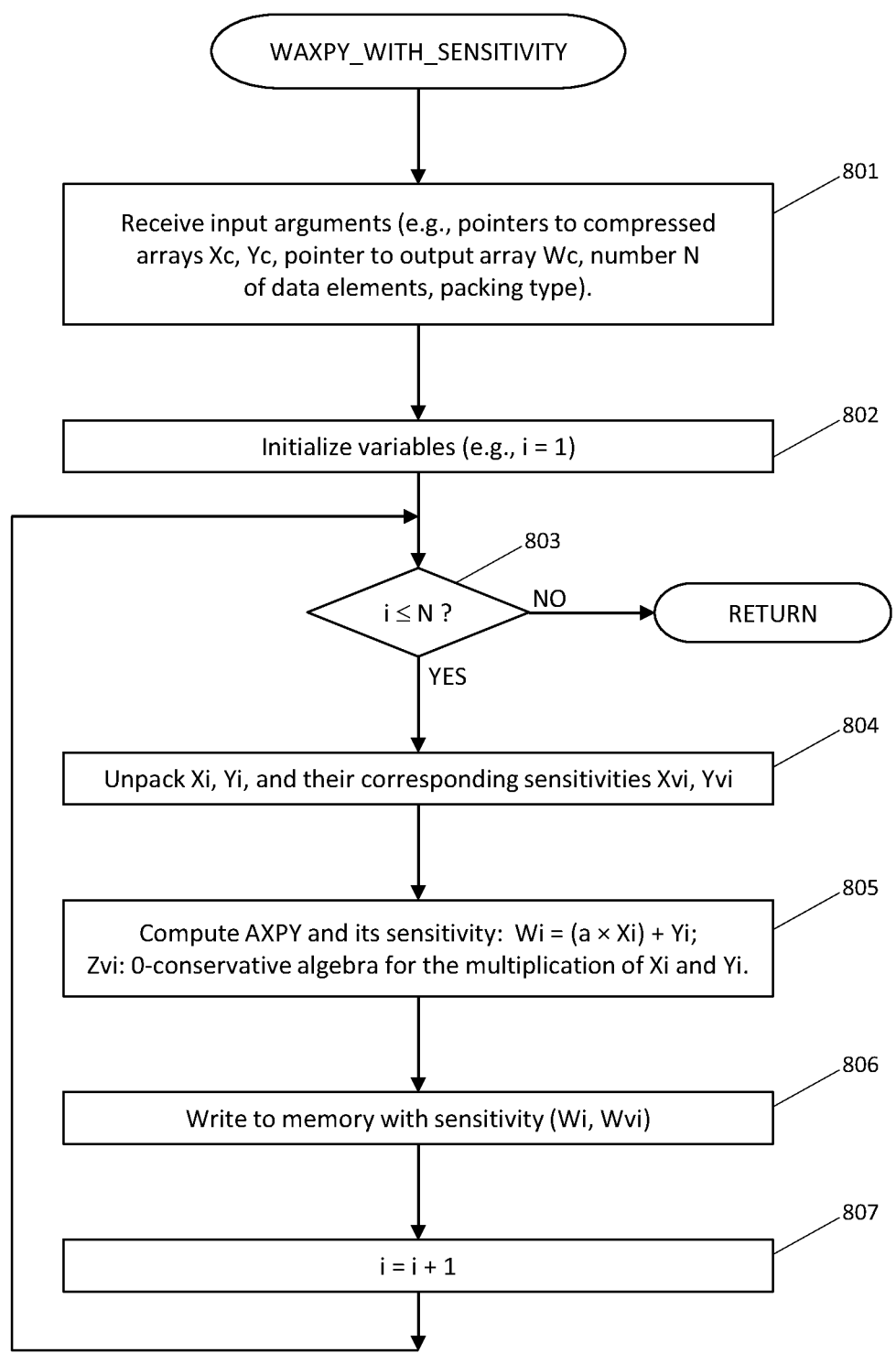

FIG. 8 illustrates an exemplary embodiment for the computation of a WAXPY operation using data that has been packed using sensitivity information, and storing the result into an array packed using sensitivity information. The embodiment of FIG. 8, which is called "WAXPY_WITH_SENSITIVITY" starts by reading input arguments in 801. Examples of input arguments are pointers to input arrays of packed data $X_c$, $Y_c$, pointer to an array of packed data $W_c$ that will contain the result of the WAXPY operation, an integer N indicating the number of elements in the input arrays, the type of data elements (e.g., floating point, integer, fixed point), and type of packing, among others. Then, some variables or signals may be initialized in 802. For example, an index i to an element of the arrays $X_c$, $Y_c$, and $W_c$ may be set to 1. Then, this index i may be compared with the size of the arrays N in 803, in such a way that if i>N then WAXPY_WITH_SENSITIVITY returns, otherwise the embodiment continues with element 804. In 804, elements $X_i$ and $Y_i$ as well as their corresponding sensitivities $X_{vi}$ and $Y_{vi}$ are unpacked from $X_c$ and $Y_c$. Then, in 805, the WAXPY operation corresponding to the elements i is executed, i.e., the operation $W_i = a*X_i + Y_i$ is executed. Sensitivity information of the result may also be computed using, for example, the 0-conservative sensitivity algebra. Then, in 806, the result $W_i$ may be packed and stored into memory using sensitivity information indicated by $W_{vi}$. Finally, the index i is updated in 807, and the condition 803 is evaluated to assess if WAXPY_WITH_SENSITIVITY continues or returns.

FIG. 9 shows an exemplary embodiment described in the C programming language, and that may be compiled and executed in a computer device 101. The embodiment in FIG. 9 is a function called "WaxpyWithSensitivity", and receives a number of parameters: a double precision floating point scalar "a"; pointers to arrays of 64-bit integers containing the inputs X_Compressed, Y_Compressed, and the output W_Compressed; an unsigned integer N indicating the size of the arrays X, Y, and W; an integer indicating the type of packing that should be used for read/write of data in/to memory; and an integer number BlockSize that indicates the size of each batch of elements of X, Y, and W that may be processed with each combination of memory read/write operations. Memory allocation of arrays may be done prior to calling this function to reduce the execution time of the function. The function WaxpyWithSensitivity calls the functions ReadFromMemoryWithSensitivity and WriteToMemoryWithSensitivity for reading and writing, respectively from/to higher-level memory. The function WaxpyWithSenstivity may be further optimized for faster execution. One skilled in the art should notice that the function WaxpyWithSenstivity may be defined using other programming languages, instructions, encodings, data types, etc., while maintaining the spirit of the invention.

Figure 10:
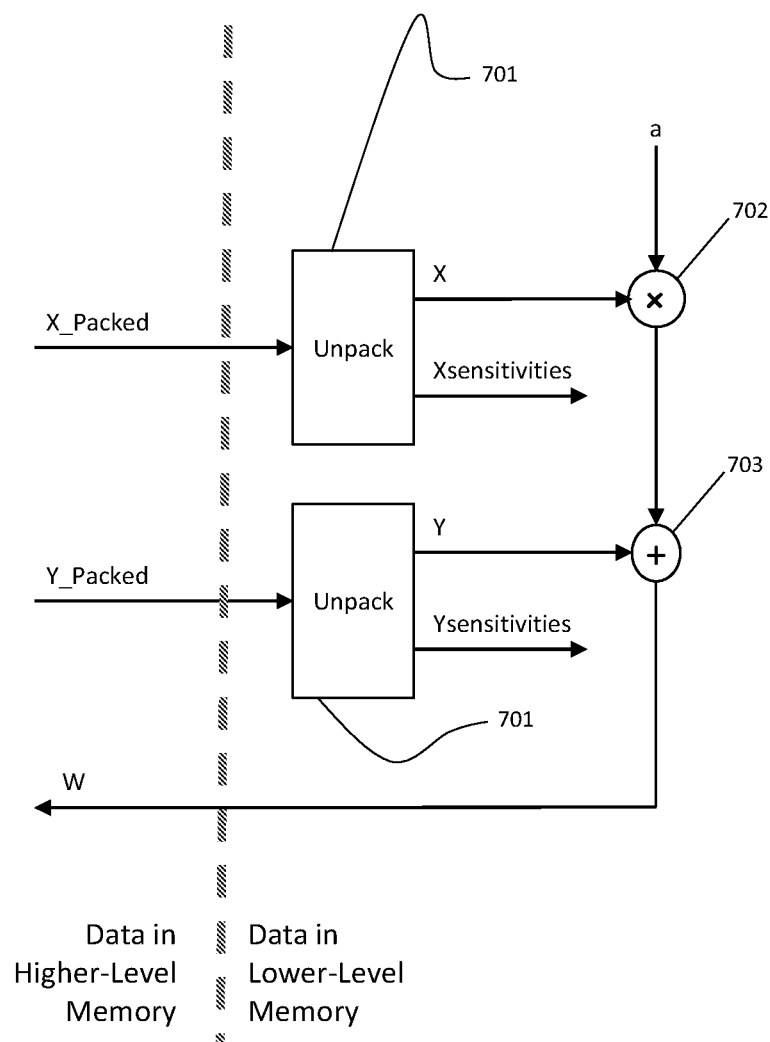

FIG. 10 shows another exemplary embodiment for acceleration of memory read/write operations within a WAXPY operator, based on MAP and sensitivity information, but in this case the output of W the WAXPY operator is not packed into MAP. In the exemplary embodiment of FIG. 10, the elements of vectors X and Y are floating point numbers that are packed along with each component's sensitivity in a higher level memory (e.g., RAM, memory 302) of a computer device. Unpack systems 701 unpack the data and output X, Xsensitivities, Y, and Ysensitivities, element by element. The unpacked elements of X, Y, and scalar "a" are operated using a floating point multiplier 702 and a floating point adder 703 to obtain W=aX+Y. The elements of W are computed one at a time. All of these operations are done in fast low hierarchy memory, typically registers of the computer system. Once an element or a group of elements of W is computed, it may be sent to a higher level memory (e.g., local RAM, memory 302) for storing of results.

Figure 11:
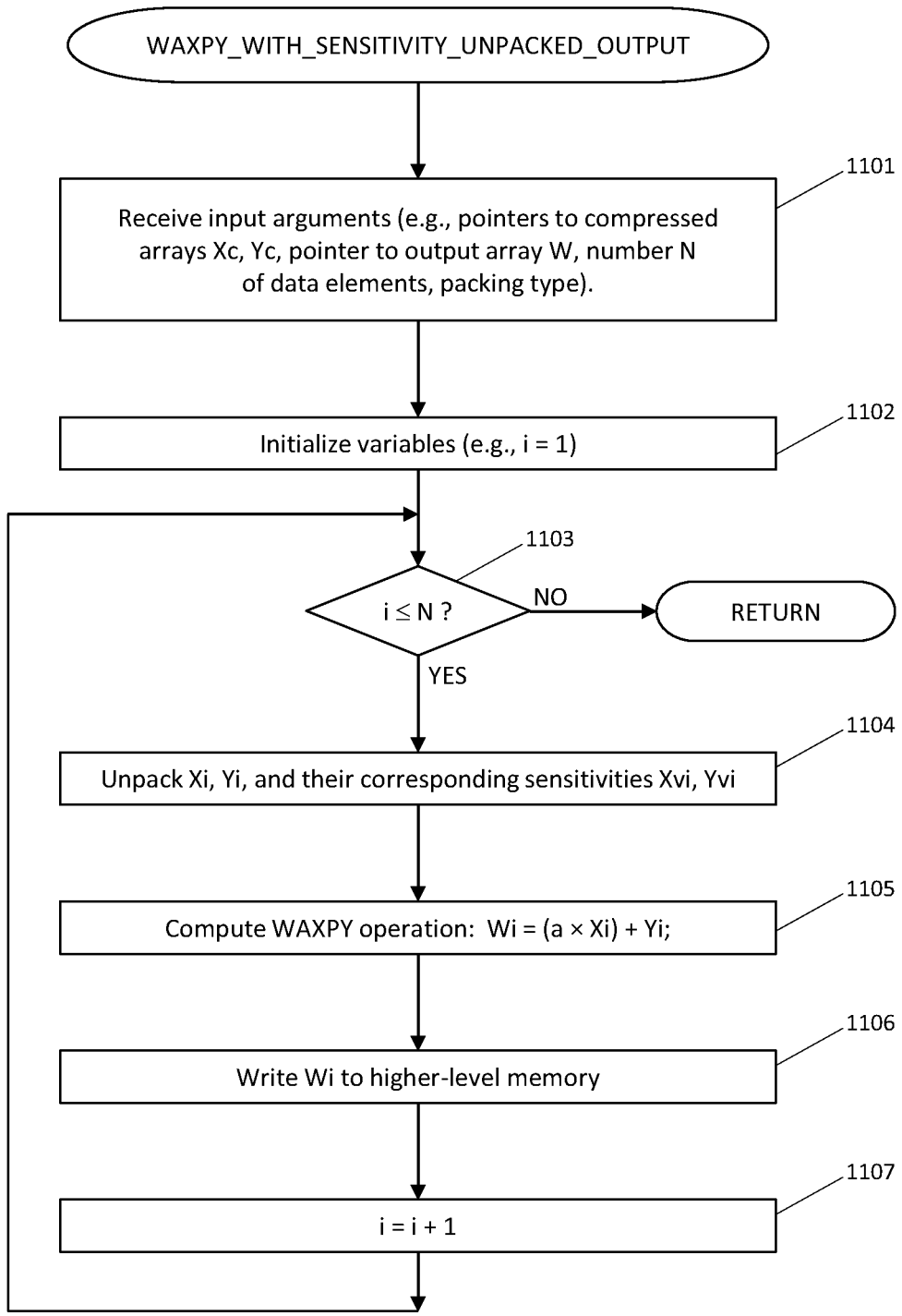

FIG. 11 illustrates an exemplary embodiment for the computation of a WAXPY operation using data that has been packed using sensitivity information, and storing the result into an unpacked (i.e., native/default data type) array. The embodiment of FIG. 11, which is called "WAXPY_WITH_SENSITIVITY_UNPACKED_OUTPUT" starts by reading input arguments in 1101. Examples of input arguments are pointers to input arrays of packed data $X_c$, $Y_c$, pointer to an array of data W that will contain the result of the WAXPY operation, an integer N indicating the number of elements in the input arrays, the type of data elements (e.g., floating point, integer, fixed point), and type of packing, among others. Then, some variables or signals may be initialized in 1102. For example, an index i to an element of the arrays $X_c$, $Y_c$, and W may be set to 1. Then, this index i may be compared with the size of the arrays N in 1103, in such a way that if i>N then WAXPY_WITH_SENSITIVITY_UNPACKED_OUTPUT returns, otherwise the embodiment continues with element 1104. In 1104, elements $X_i$ and $Y_i$ as well as their corresponding sensitivities $X_{vi}$ and $Y_{vi}$ are unpacked from $X_c$ and $Y_c$. Then, in 1105, the WAXPY operation corresponding to the element i is executed, i.e., the operation $W_i=a*X_i+Y_i$ is executed. Then, in 1106, the result $W_i$ may be stored into higher-level memory. Finally, the index i is updated in 1107, and the condition 1103 is evaluated to assess if WAXPY_WITH_SENSITIVITY_UNPACKED_OUTPUT continues or returns.

FIG. 12 shows an exemplary embodiment described in the C programming language, and that may be compiled and executed in a computer device 101. The embodiment in FIG. 12 is a function called "WaxpyWithSensitivity_UnpackedOutput", and receives a number of parameters: a double precision floating point scalar "a"; pointers to arrays of 64-bit integers containing the inputs X_Packed, Y_Packed, and the output W; an unsigned integer N indicating the size of the arrays X, Y, and W; an integer indicating the type of packing that should be used for read/write of data in/to memory; and an integer number BlockSize that indicates the size of each batch of elements of X, Y, and W that may be processed with each combination of memory read/write operations. Memory allocation of arrays may be done prior to calling this function to reduce the execution time of the function. The function WaxpyWithSensitivity calls the function ReadFromMemoryWithSensitivity for reading packed data from higher-level memory. The function WaxpyWithSenstivity_UnpackedOutput may be further optimized for faster execution. One skilled in the art should notice that the function WaxpyWithSenstivity_UnpackedOutput may be defined using other programming languages, instructions, encodings, data types, etc., while maintaining the spirit of the invention.

Reducing Data Movement Between Memory Hierarchies when One or More Data Elements are Packed in a Higher-Level Memory As illustrated by the exemplary embodiments in FIGS. 7-12, and according to the spirit of the invention, many combinations of packed/unpacked inputs and outputs of numerical algorithms may be done so to reduce the number of bits transferred between memories in different levels of a hierarchical memory model. One common scenario is one in which only an input or a group of inputs of and arithmetic operators and/or algorithm are packed. This scenario may provide accelerations in the execution of algorithms when data transfer between memory levels in a hierarchical memory model is a bottleneck. Consider, as an example, the execution of a Conjugate Gradient (CG) algorithm.

Figure 13:
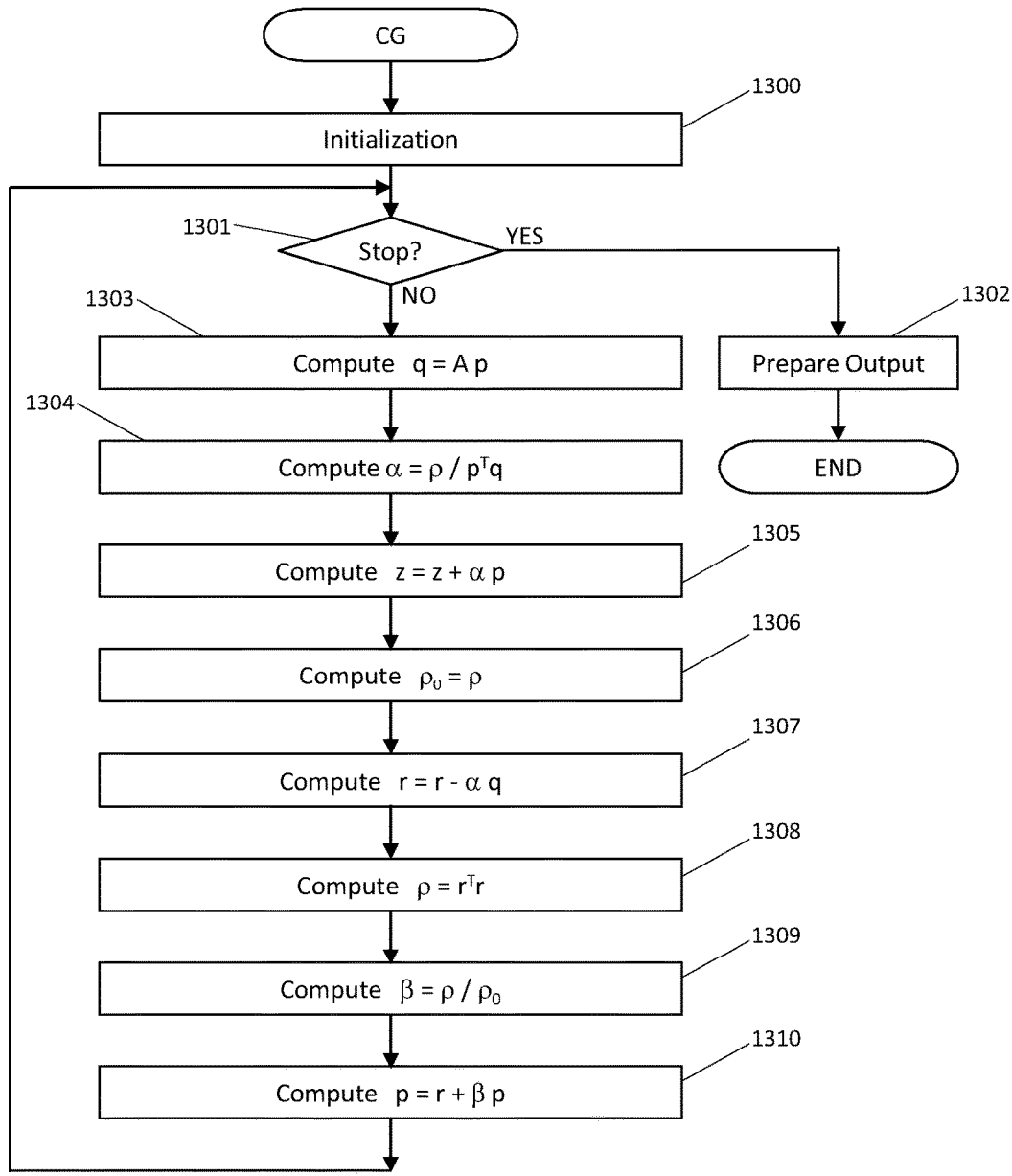
FIG. 13 illustrates a CG algorithm.
Figure 14:
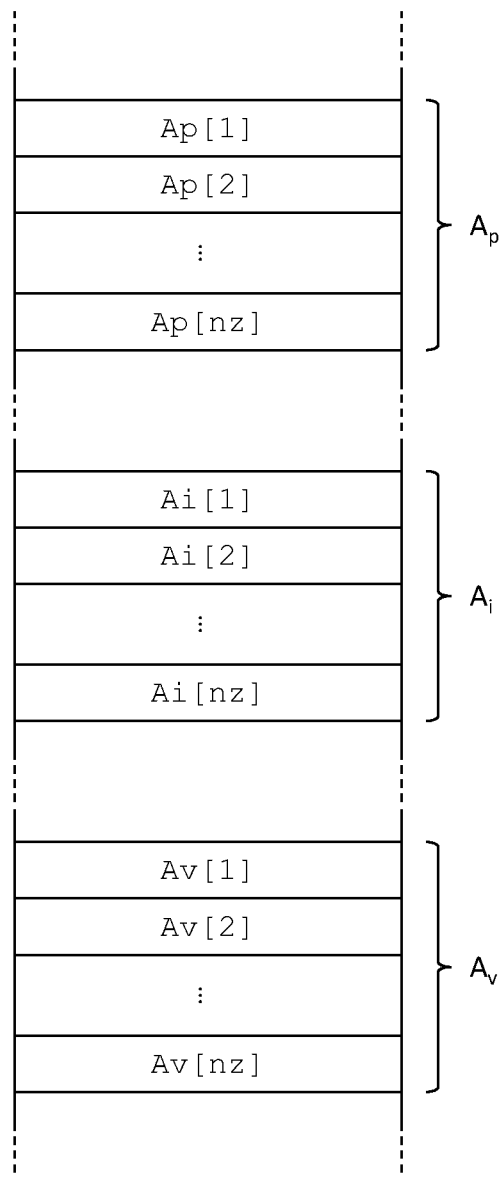
FIG. 14 illustrates an exemplary matrix storage format.

CG is a well-known numerical algorithm in the High Performance Computing (HPC) community for finding a vector z that solves the matrix equation Az=b. An implementation using CG may be combined with the preconditioners for faster computations. FIG. 13 shows the typical main steps in a simple CG algorithm. There are many formats for storing the problem matrix A in memory. For the case of sparse data, for example, the matrix A is typically stored using formats such as Compressed Row Sparse (CRS) or Compressed Column Sparse (CCS). These formats use one array $A_v$ to store all the nonzero values of the matrix, and auxiliary vector arrays of column/row indices $A_i$ and row/column start pointers $A_p$. $A_v$ may be an array of floating point numbers, and both $A_i$ and $A_p$ are typically arrays of integers. FIG. 14 illustrates the organization of Ap, Ai, and Av in memory for a matrix A that contains a number "nz" of nonzero entries. Item 1300 initializes the variables of the CG algorithm, and sets the so-called residual vector r to r=b, the "rho" scalar to $\rho=r^Tr$, the result vector z to z=0 (i.e., each element of the vector z is set to 0), and the so-called direction vector p to p=r. Subsequently, a series of operations are repeated until a stop condition 1301 is satisfied. The stop condition may be defined by the user to any formulation that the user deems convenient. A stop condition commonly used is, for example, when the L2 norm of the residual vector r is less than a predetermined small value called "tolerance" which is set by the user. These operations that are repeated include, in 1303, a matrix-vector multiplication that multiplies the matrix A times the vector p to produce a resulting vector q. Operations in 1304 to 1310 are scalar and/or vector operators that complete the solution of the matrix problem. At the point in time when the stop condition 1301 is satisfied, the vector z contains the solution to the linear system of equations; then, the output is prepared at item 1302, and then the CG ends.

Figure 15:
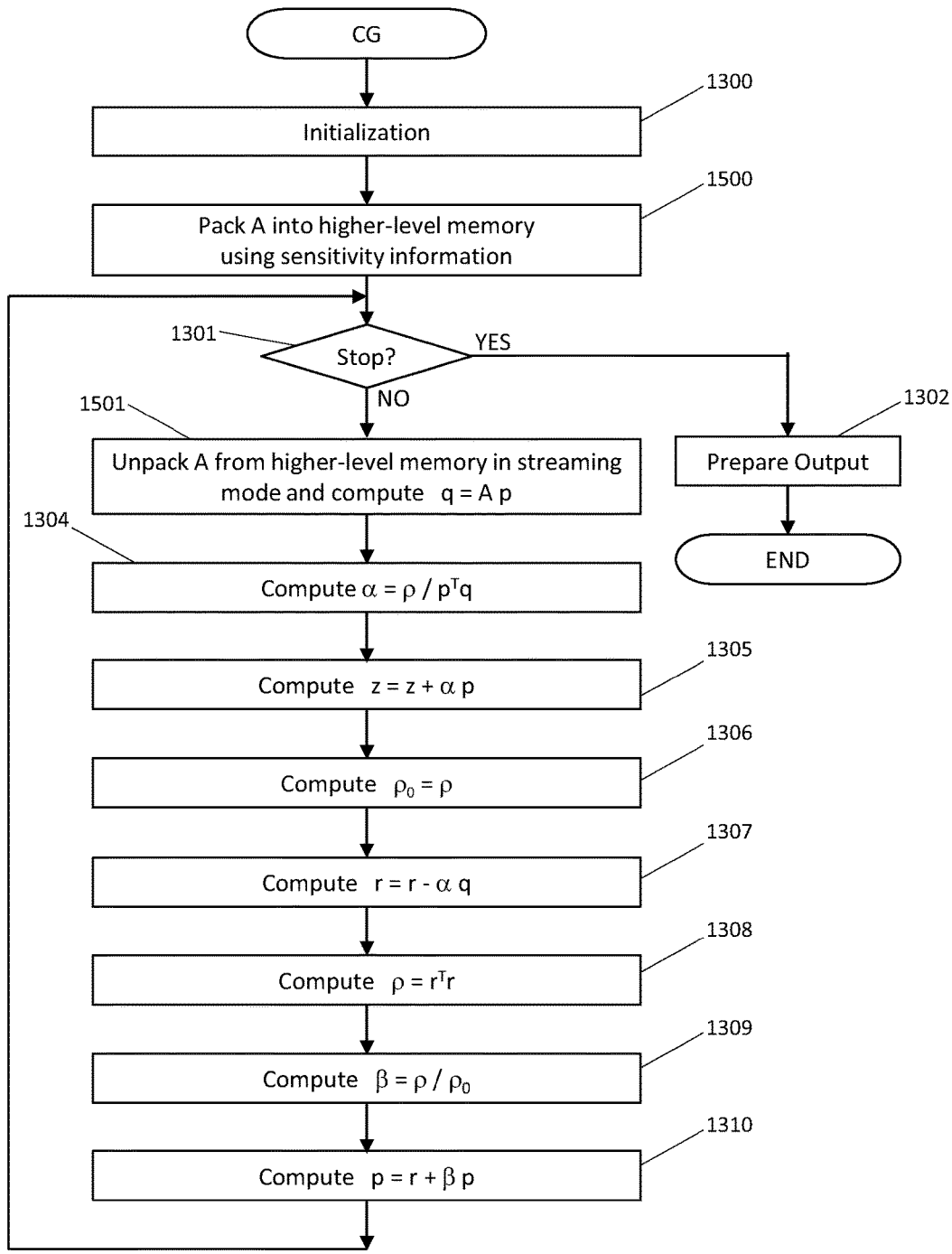
FIGS. 15-19 show embodiments.
Figure 16A:
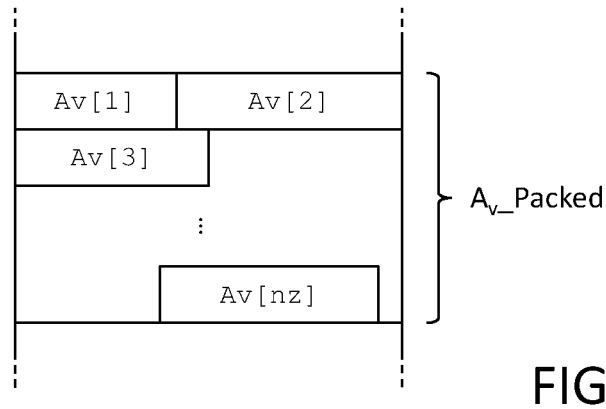
Figure 16B:
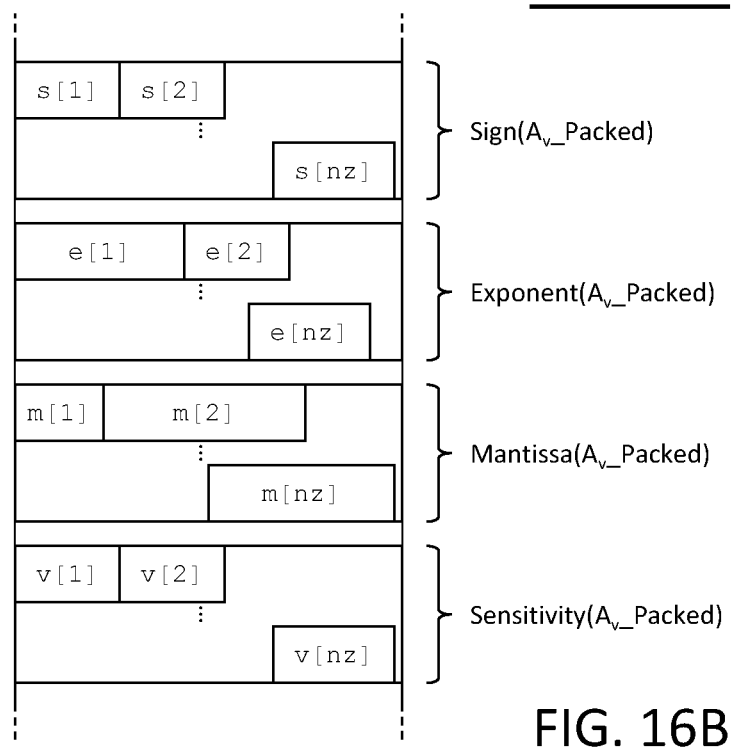
Figure 16C:
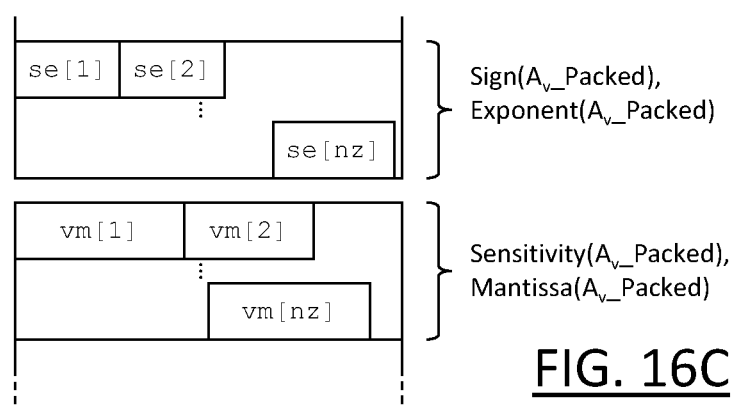

A matrix vector multiplication is typically the bottleneck of CG. In the exemplary implementation of CG illustrated in FIG. 13, for example, this matrix vector multiplication occurs at item 1303. In the computation of this matrix vector multiplication, however, the largest array of inputs does not change at every iteration, i.e., the value of A does not change during the computation of the CG. The elements of matrix A, however, may not fit in a low-level memory (e.g., cache memory), making reading of the matrix A from a higher-level memory a bottleneck of the matrix vector multiplication. According to an aspect of the invention, the matrix A may be packed into MAP using sensitivity information. FIG. 15 shows an exemplary embodiment of a CG comprising MAP packing for the values of the matrix A. The initialization in 1300 includes the same operations as in the embodiment of FIG. 13. Then, in item 1500, the matrix A is packed into a higher-level memory (e.g., RAM memory) using sensitivity information. There may be multiple options for packing A. For example, the array of matrix values Av in a sparse matrix may be packed as shown in FIGS. 16A-16C, which illustrate each element packed individually, signs, exponents, mantissas, and sensitivities packed as independent arrays, or joint arrays of sign-exponent (se) and sensitivity-mantissa (vm), respectively. Similarly, the arrays Ai and Ap may be packed using, for example, the methods described in the article "An Extended Compression Format for the Optimization of Sparse Matrix-Vector Multiplication" by Karakasis, et. al, 2013, which are incorporated herein by reference. The matrix A may be packed already in a high-level memory, if it was packed during the generation of its elements. However, if it is packed in 1500, the time spent in this packing is not a significant overhead considering that there may be one packing operation and multiple unpackings in the CG, which amortizes the initial overhead. Through a user interface or during the implementation of an embodiment, the user has the option of indicating which values of $V_{Aij}$ to assign, or by default if the user does not assign any value, all the sensitivity values may be set to the default Vmax. Subsequently, if a stop condition 1301 (as in the embodiment of FIG. 13) is satisfied, the algorithm prepares the output in 1302 and ends; otherwise, the algorithm continues with a set of operations. In 1501, the vector q is computed using a matrix vector operator that receives A in packed mode, and unpacks its elements prior to operating them with the elements of p. Once the vector q is computed, CG may continue with 1304 to 1310 as in the embodiment of FIG. 13. The resulting potential reduction in bit length for the transfer of the elements of A may reduce the bits transferred between memory hierarchies, which in turn may result in a speedup of the CG, in savings of power consumption, in memory capacity for solving larger problems, or for all or combination of these options. If the matrix data is organized or has a structure that makes reading of the vector p not to become a bottleneck (e.g., banded matrices), this embodiment renders good compression rates for MAP packing, which enables reducing data transfers between memory hierarchies.

Sensitivity information for packing data into MAP format may be obtained during the generation of the matrix data (e.g., using sensitivity analysis), or may be defined by the user using a priori knowledge, experimentation, or through other means. For example, in many matrix problems, it is known that the diagonal elements may contribute more to the solution of the problem (for example, rendering stability and accuracy to the algorithm) than the off diagonal elements. This is the case, for example, of matrices that arise in finite elements problems. Then, a user may decide to assign larger sensitivity values to the diagonal elements than to the off diagonal elements.

Sensitivity Grouping and Blocking for Increased Performance

Figure 17:
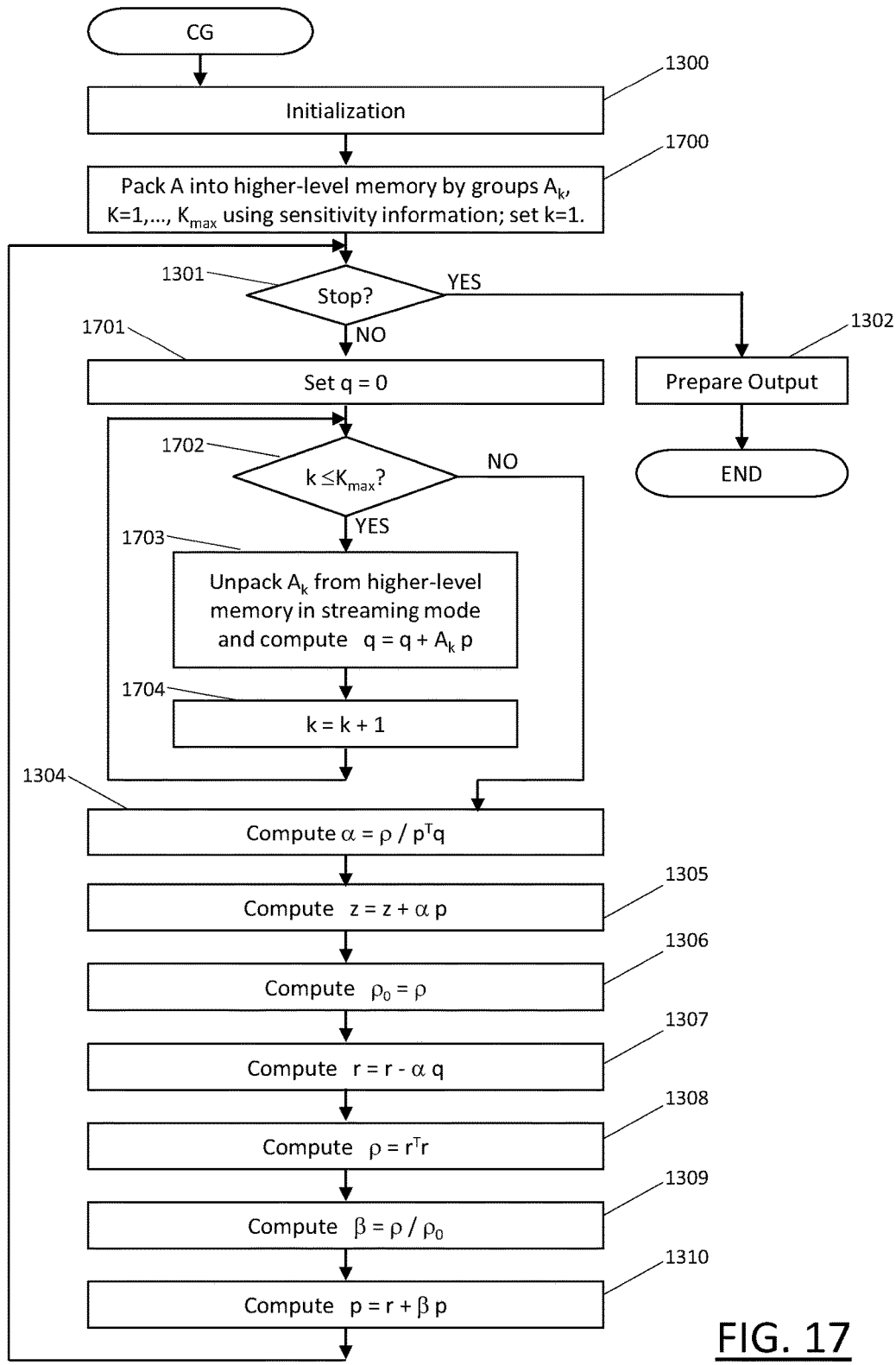

According to an aspect of the invention, data elements that share the same sensitivity information may be grouped into a single array. FIG. 17 illustrates an exemplary embodiment of a CG in which matrix data is packed using groups. An initialization 1300 sets initial values for internal variables in CG. Then, the elements of a matrix A may be stored in a number of groups, where each group is characterized by elements that have equal sensitivity information. For example, there may be "Kmax" groups, with group k=1 containing elements of A whose sensitivity is given by a value $v_1$, a group k=2 containing elements of A whose sensitivity is given by a value $v_2$, etc. In an embodiment the subset of elements of A in a group k may be denoted as $A_k$. A problem matrix A then may be recovered by an operation $A=A_1+A_2+\ldots+A_{Kmax}$. One skilled in the art should note that by grouping elements in this manner, sensitivity information may not be stored because it is implicit by the group index k. Then, any overhead due to unpacking sensitivity information is avoided, and the overall result is further acceleration for the computation of operations that use encoded MAP data grouped by sensitivity information, as illustrated in the exemplary embodiment for the matrix A. After packing of submatrices $A_1, A_2, \ldots, A_{Kmax}$ into a higher-level memory, CG continues with 1301, where a stop condition is evaluated. This stop condition may be defined as indicated for the previously described embodiments of CG. Then, the computation of q through the matrix vector multiplication q=Ap is executed by items 1701, 1702, 1703, and 1704. In 1702, a condition is evaluated to indicate if the matrix vector multiplication has finalized. In the exemplary embodiment of FIG. 17, this condition is a comparison of an index variable k against the maximum value Kmax. Then, if k≤Kmax, the CG continues with 1703. In 1703, the partial value of q given by the matrix vector multiplication $A_k$ p is computed and added to the previous accumulated values of the elements of q. For this operation, the elements of $A_k$ (and not all the matrix A) need to be unpacked. Then CG continues to item 1704 where the index k is updated. If the condition 1702 indicates that the computation of q has finalized, CG continues to items 1304-1310, as in the previously described implementations of CG. One may notice that the computation of the matrix vector operation in 1702-1703 may be expressed as $q=A_1p+A_2p+\ldots+A_{Kmax}p$. However, other expressions and implementations that use input packed data grouped according to sensitivity information may be used.

According to an aspect of the invention, an embodiment may arrange data and effectuate arithmetic operations using blocking. Blocking is a well known technique in numerical computing in which the execution of operations in an array (e.g., matrix) is replaced by the execution of operations in subarrays of said array (e.g., submatrices), which are blocks of data. The organization of operations on subarrays may accelerate the execution of a numerical code because a subarray may be moved to a lower-level memory, and its elements may be repeatedly used, resulting in reduced data movement from a higher-level memory to a lower-level memory. Blocking takes advantage of data locality. Combining blocking (which enables fewer memory reads) with MAP-based encoding (which enables shorter memory reads), an algorithm may be executed in less time and/or reduce its power consumption.

Map Encoding when Sensitivity Information is not Available

Sensitivity information may not always be readily available for packing data into a MAP format. For example, if sensitivity values for the elements of a matrix A in a CG were not computed when said matrix A was generated, or if a user does not know the type of problem the matrix A represent, sensitivity information may not be available. In those cases, other tools may be used.

Figure 18:
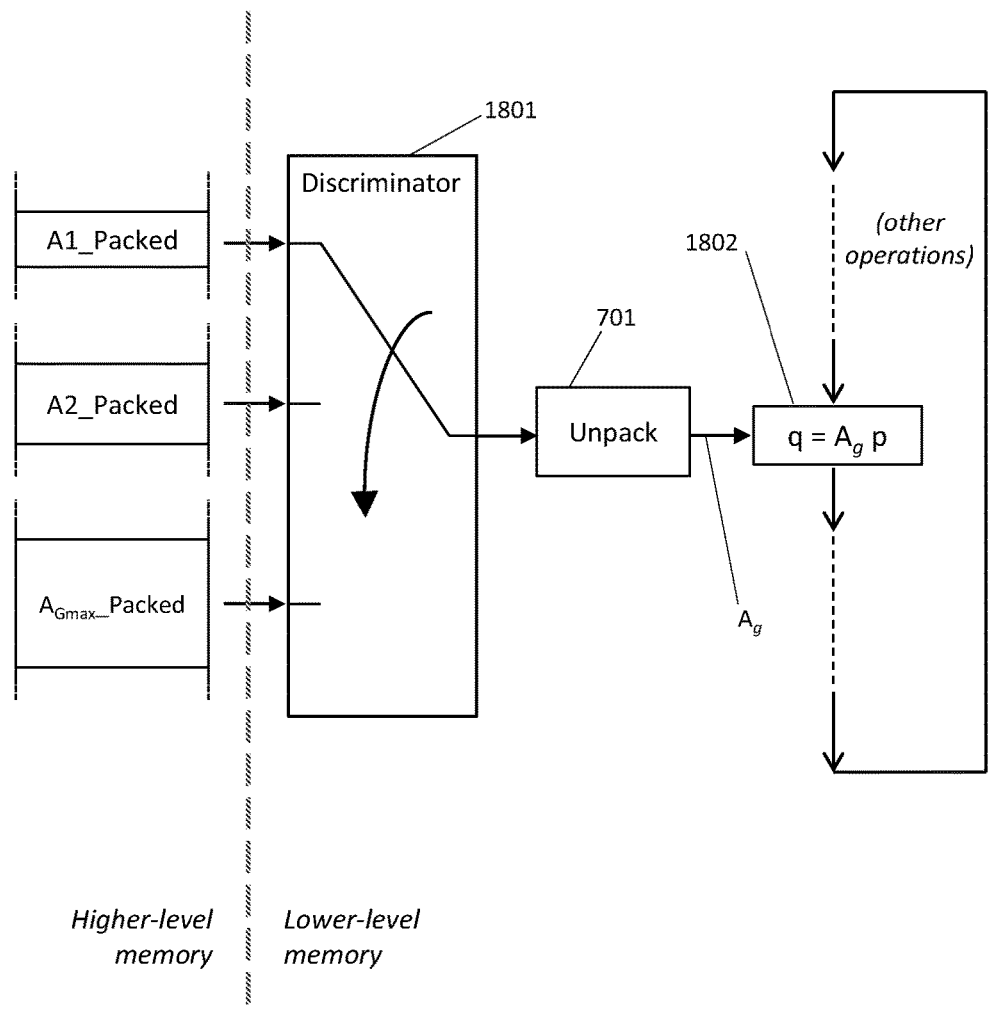

An exemplary embodiment that comprises data packing when sensitivity information is not readily available is shown in FIG. 18. This embodiment, which we call "progressive granularity" may be used in an iterative algorithm. In a progressive granularity embodiment, problem data (e.g., matrix data A) may be stored as independent arrays $A_1$, $A_2, \ldots, A_{Gmax}$, and each array $A_i$, $i=1, \ldots,$ Gmax may comprise data from arrays $A_{i-1}, A_{i-2}, \ldots, A_1$. In the embodiment of FIG. 18, sensitivity values $v_1, v_2, \ldots, v_{Gmax}$ corresponding to sensitivity information for each of the matrices $A_1, A_2, \ldots, A_{Gmax}$, respectively, may satisfy the condition $v_1 \leq v_2 \leq \ldots \leq v_{Gmax}$. A discriminator 1801 may select a matrix from the set A1_Packed, A2_Packed, . . . , $A_{Gmax\_}$Packed, which are different versions of the matrix A but packed with different sensitivities or combinations of sensitivities. A discriminator 1801 may decide which matrix to select base on different criteria, including, for example, the iteration number, the L2 norm of the error at a given iteration, etc. Particular conditions for a discriminator 1801 to change from one matrix representation to other may be defined using experimental results from typical problem scenarios, or provided a priori by a user. Once a discriminator 1801, an unpack 701 may unpack the matrix data to be provided to a matrix vector multiplier in an iterative algorithm.

Figure 19:
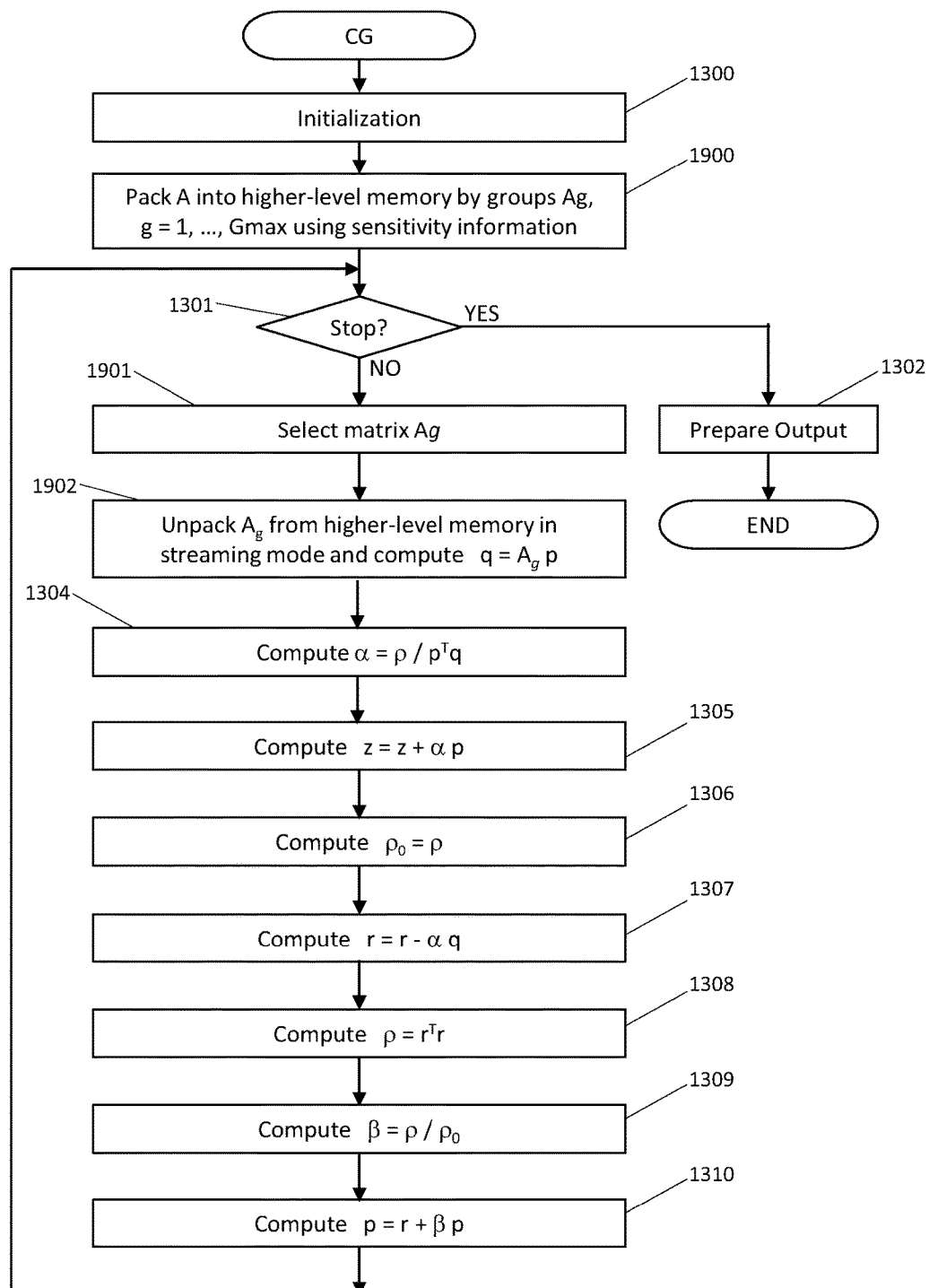

FIG. 19 illustrates an exemplary embodiment in which CG uses progressive granularity. After initialization 1300, matrix data is packed into a high-level memory by groups of matrices $A_1, A_2, \ldots, A_{Gmax}$. Then, after the stop condition 1301 of the CG is evaluated, and if said condition indicates that CG should not stop yet, then the embodiment continues to 1901. In 1901, the matrix $A_g$ to use in the matrix vector multiplication in the current iteration is selected. Subsequently, in 1902, said matrix $A_g$ is unpacked from higher-level memory and used to compute $q=A_g p$. After the value of q is computed, the CG continues with 1304-1310, as in the previously described CG implementations.

Reducing Data Movement Between Memory Hierarchies when Using Preconditioners

Figure 20:
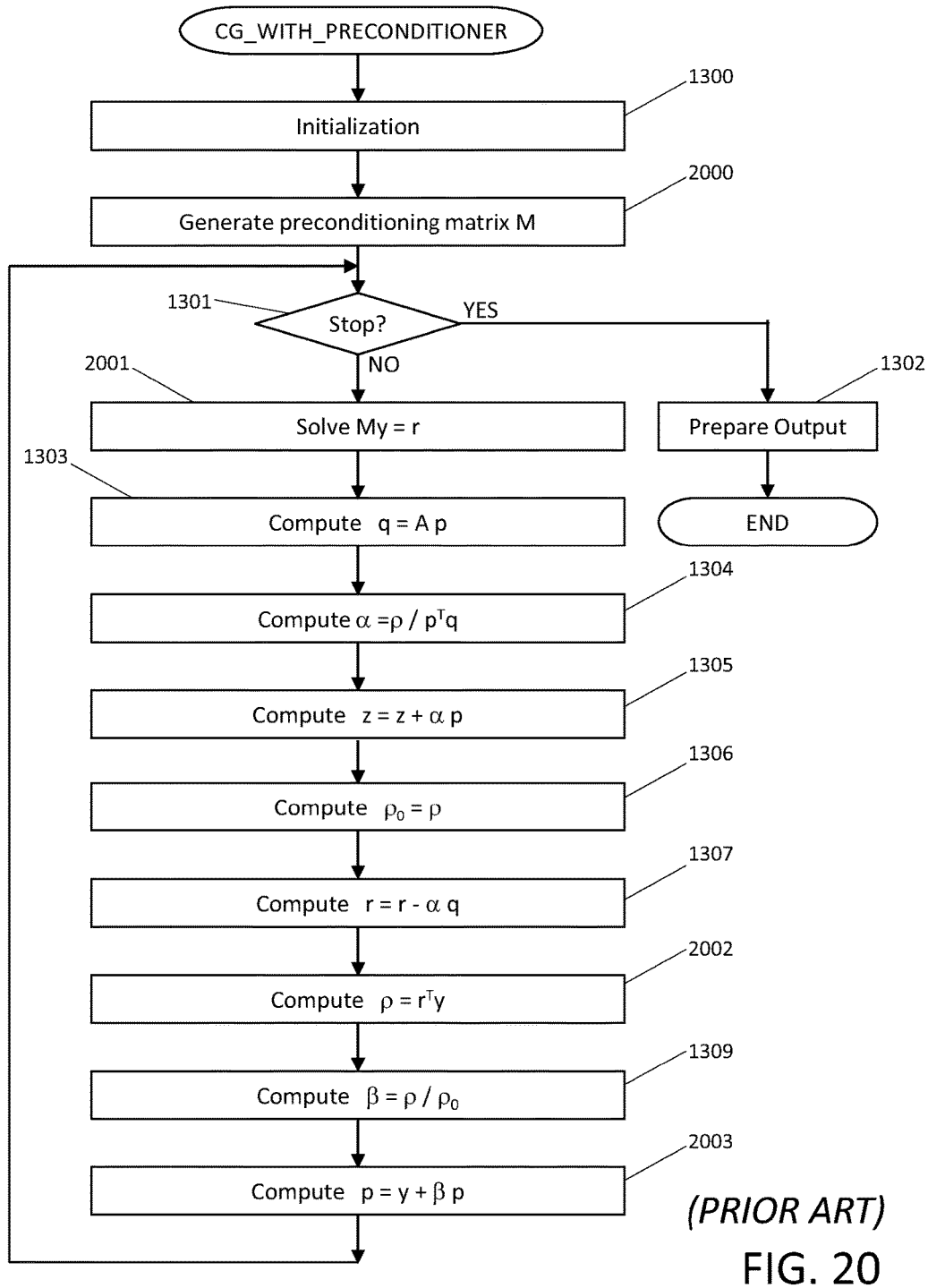
FIG. 20 illustrates a preconditioned CG algorithm.

Preconditioning is a well known method for accelerating the convergence rate of iterative methods. In general, a preconditioner is a matrix that transforms an original problem defined by a matrix A, into an approximated problem described by a matrix M, with said problem M having nicer properties (for convergence) than the original problem A. FIG. 20 shows an example of a preconditioned CG. The preconditioned CG implementation of FIG. 20 is based on the CG of FIG. 13. Then, the problem setup and initialization 1300 contains the same operations than in the implementation of FIG. 13. In item 2000, a preconditioning matrix M is generated. This matrix M is used later in 2001 for solving an approximated problem My=r. Alternatives for generating matrix M are known in the field. For example, M could be defined such that its elements $m_{ij}$, i, j=1, 2, . . . , N, and N is the size of matrix A, are $m_{ij}=a_{ii}$, if i=j, and 0 otherwise. This definition is typically known as Jacobi preconditioning. Similarly, a set of indices (i,j) from the original matrix A may be defined in a Block Jacobi preconditioning, such that $m_{ij}=a_{ij}$, if (i, j) is in said set of indices (i,j), and 0 otherwise. Another exemplary alternative for generating M is by using incomplete factorization. In an incomplete factorization, the problem matrix A is factored, for example, in a lower triangular matrix L and an upper triangular matrix U, in such a way that A=LU. Then, M could be built by ignoring some of the nonzero elements in A. Using a factored form, the solution of the resulting linear system My=r could be done faster, as it would involve two call to what is known as backward and forward triangular solves. Although there are various ways of constructing M, the ultimate goal is to find M such that convergence of the algorithm is faster, and that the solution of the approximated problem is simpler than the solution of the original matrix problem. The solution of an approximated problem is done in 2001, where the goal in 2001 is to find a solution y that, when used in other operators of the preconditioned CG, accelerates the convergence rate of the CG. The solution of the problem My=r in 2001 may be done using any linear system method, such as Cholesky, LU, CG, among many others. For example, if M is defined using a Jacobi preconditioner, the solution y is obtained by computing $y_i=r_i/m_{ii}$, for i=1, . . . , N. Or, if an incomplete factorization is used, then the solution is defined by finding h in Lh=r, and then solving the system Uy=h. In the latter case, the solution of both systems, Lh=r and Uy=h, is straightforward given that both problems are defined by triangular matrices. After the execution of item 2001, CG_WITH_PRECONDITIONER continues with operators 1303-1307, as in the basic CG. Note that these operators may also incorporate embodiments that pack data into higher memory, for accelerating, for example, the matrix vector multiplication in 1303. In 2002, the value of a scalar ρ is computed, using the approximated solution y. Then, this value is used in 1308 for computing β, and finally in 2003 for updating the vector of directions p.

Figure 21:
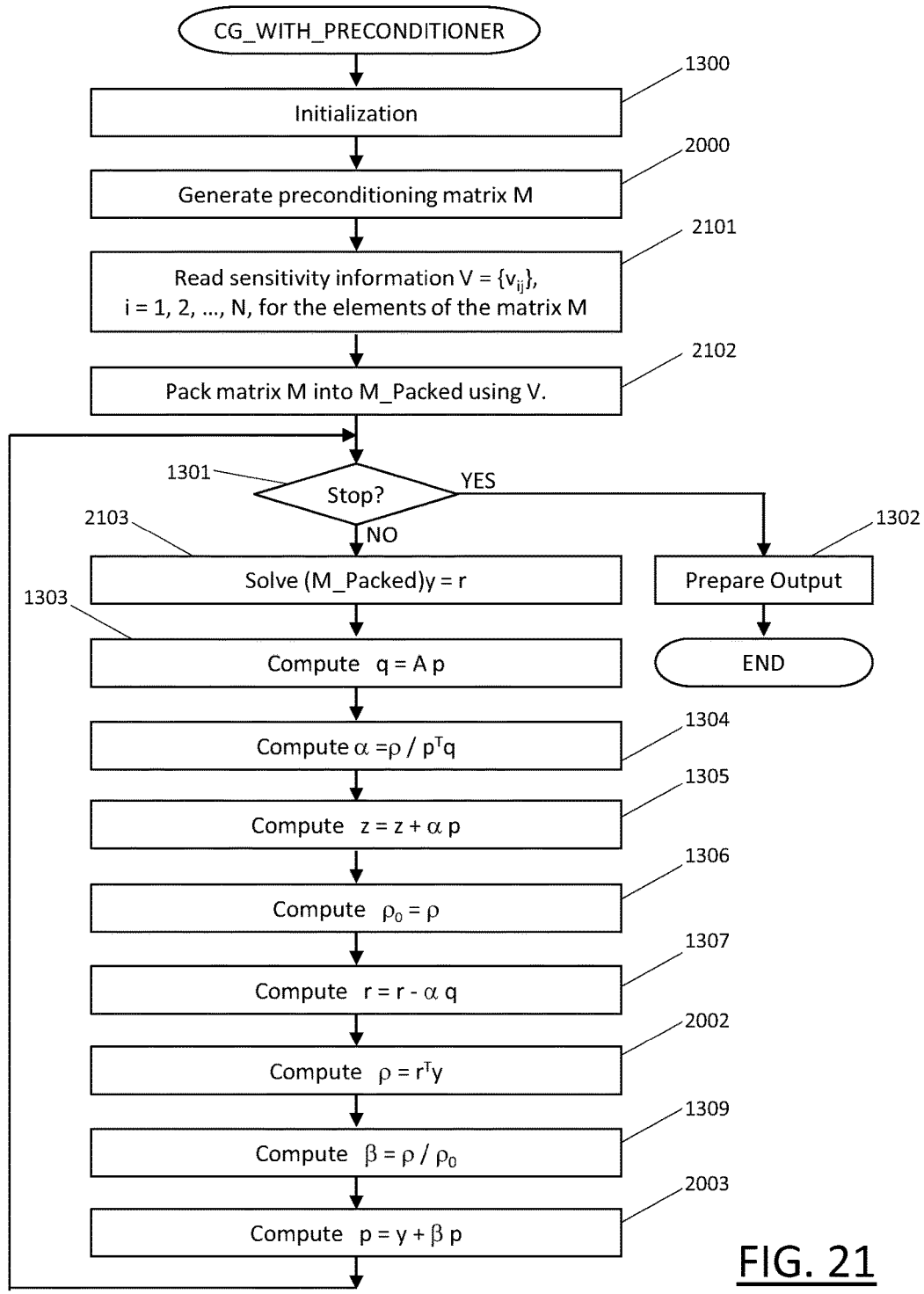
FIGS. 21-28 show embodiments.

Since preconditioners use approximations to an original problem A, then an embodiment may use more aggressive MAP packing to reduce the number of data transfers from a higher-level memory hierarchy. Given that, by definition, the preconditioners provide an approximation of the solution, such an aggressive packing may be used for the preconditioner M without jeopardizing the accuracy of the ultimate algorithm result. FIG. 21 illustrates an exemplary embodiment of a preconditioned CG, where sensitivity information is used. In this embodiment, a preconditioner matrix M is generated in 2000, as in the basic CG_WITH_PRECONDITIONER of FIG. 20. Then, sensitivity information may be read, generated, or received from a user, in 2101. This sensitivity information may be used in 2102 for packing M into M Packing using sensitivity information in V. After this, the execution of the CG_WITH_PRECONDITIONER goes to 1301 and continues as in the embodiment of FIG. 20, with the difference being that the solution of the preconditioner problem, in 2103, is done using the packed matrix M_Packed so that the number of bits that may need to be transferred between memory hierarchies in the execution of 2103 may be less than that of 2001.

Figure 22:
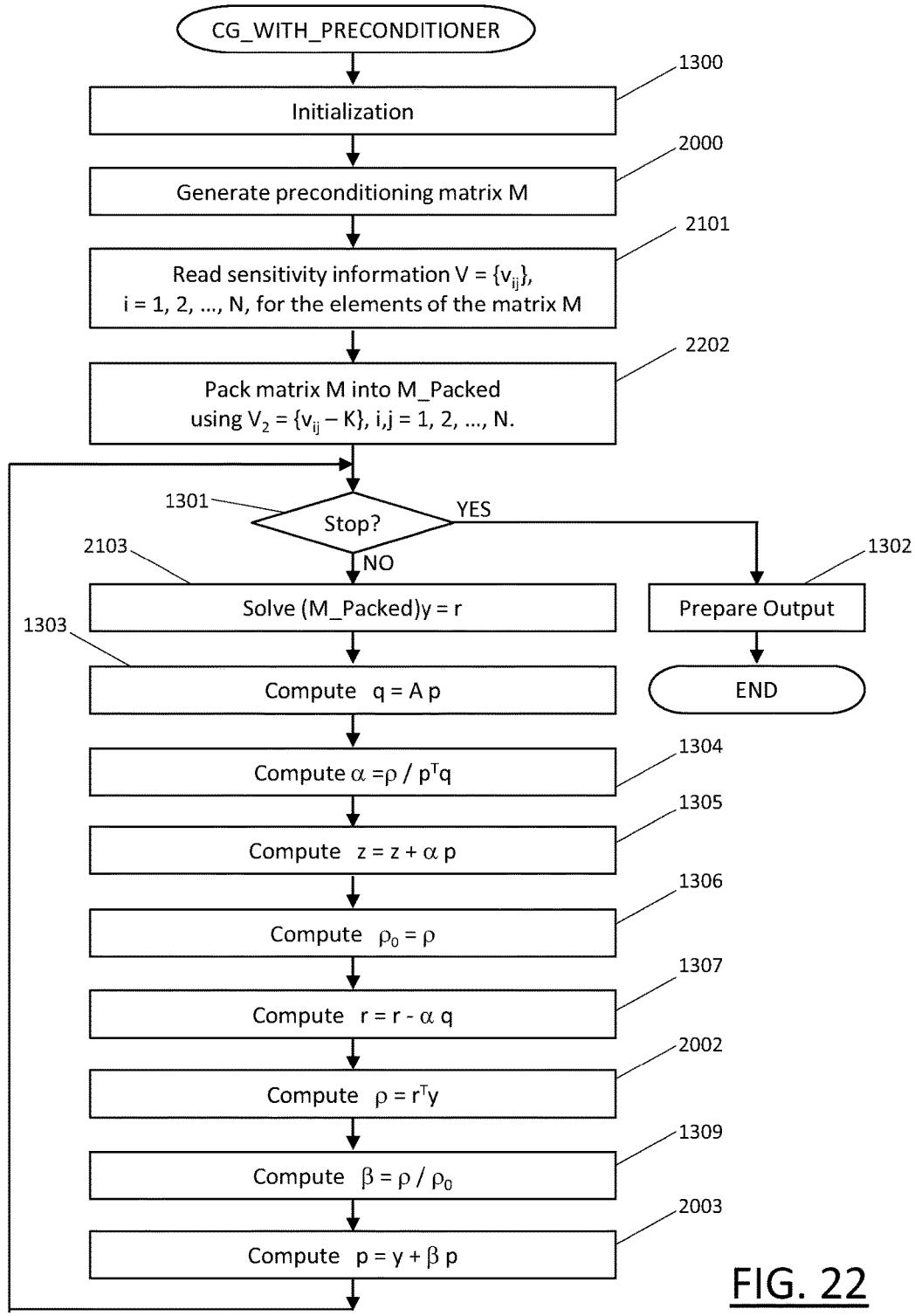

Based on the exemplary embodiment of FIG. 21, FIG. 22 shows a variation in which the data corresponding to elements of the matrix M is packed using less bits. This packing, which occurs in 2202, is done in such a way that the sensitivity values used for packing of the elements of M, uses the values $v_{ij}$, i, j=1, 2, . . . , N, corresponding to sensitivity information, minus a constant K that may be read from a user through any user interface. The sensitivity values used for packing are bounded by 0 (i.e., if the subtraction renders a negative number, sensitivity values used for packing in this case are 0).

Figure 23:
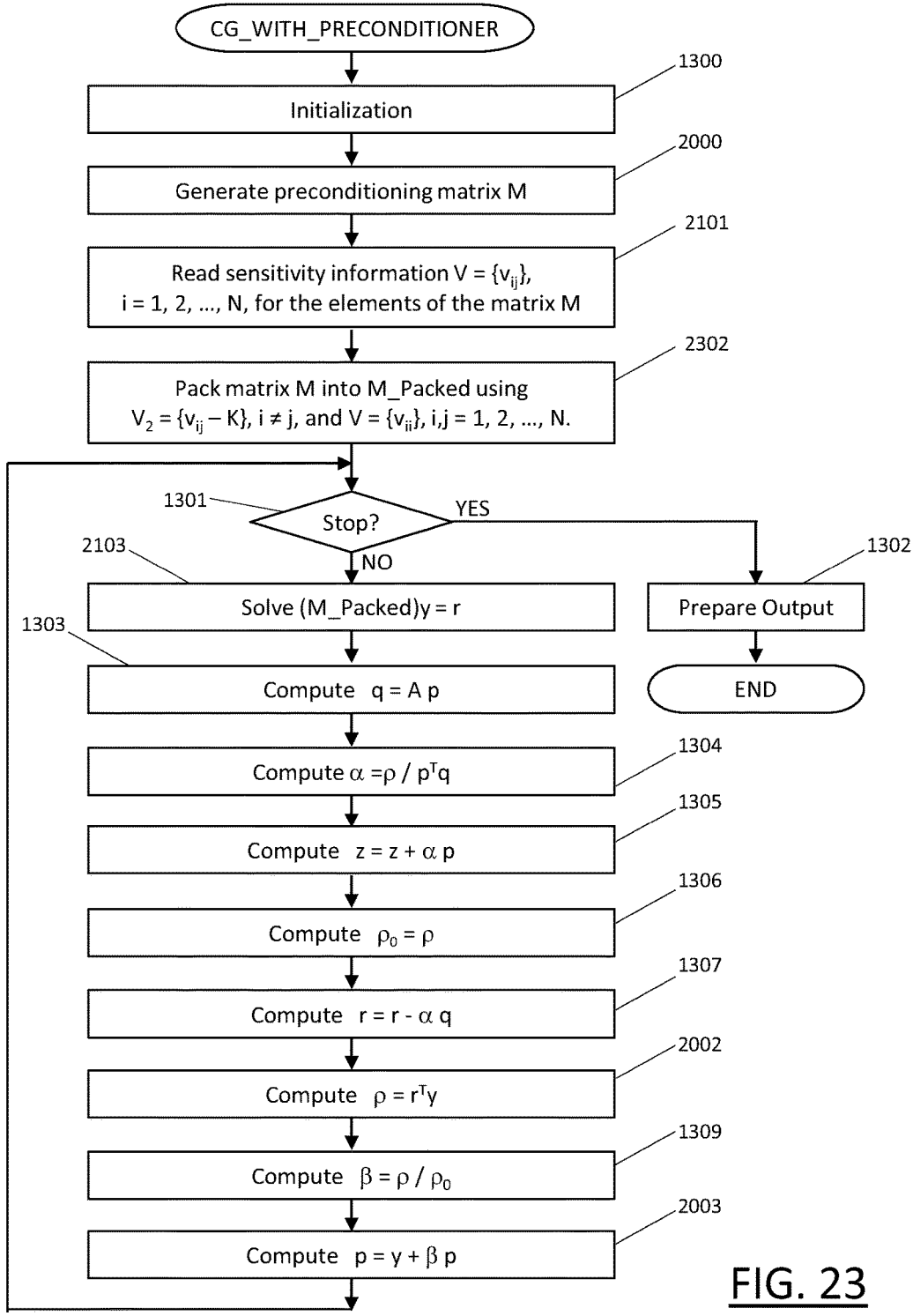

Similar to the embodiment of FIG. 22, FIG. 23 shows an embodiment with a packing of data corresponding to matrix M using a subtraction of sensitivity values and a constant K. This packing, which in the embodiment of FIG. 23 is in 2303, does not subtract K from the diagonal elements. This type of packing aims at preserving sensitivity information of the diagonal elements of the preconditioner matrix M, which may increase stability and convergence rate of the preconditioned CG algorithm. A skilled in the art would notice that many variations within the spirit of the invention are possible for packing of preconditioned matrices, in which more aggressive (e.g., lossy) packing may be done than in a regular (i.e., not preconditioned) solver, due to the definition of preconditioner matrices as approximated problems.

Packing into Map Format and Unpacking from MAP Format

Figure 24A:
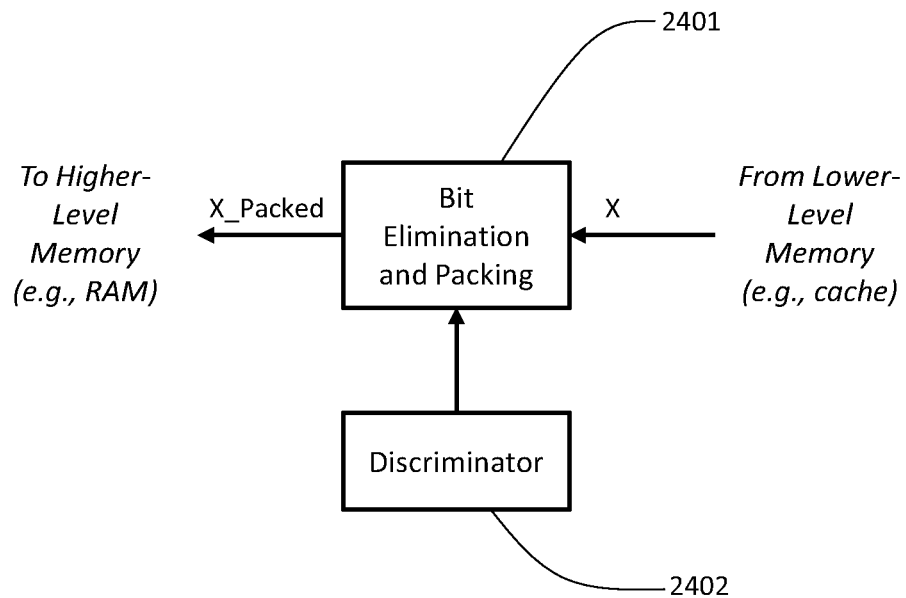

Data storage 501 may be converted into data storage 502 (i.e., MAP) using a bit elimination and packing component. FIG. 24A shows an exemplary embodiment of a bit elimination and packing component 701 that takes data X from a lower-level memory (e.g., cache), with said data X stored using data storage 501, and renders data X_Packed, which may correspond to data storage 502. Then, said data X_Packed may be transferred to a higher-level memory. In an exemplary embodiment, information or knowledge about the structure of an algorithm, operations to be executed in an algorithm, variables or subsets of variables in an algorithm, or other forms of context information may be used for reducing the number of bits used for data movement. Said information or knowledge may be used for reducing the number of transmitted bits as illustrated in the exemplary embodiment in FIG. 24A, where a discriminator 2402 provides additional input to a bit elimination and packing component 2401 for producing X_Packed. A discriminator 2402 may provide, for example, information about the sensitivity values of numbers X to be packed by component 2401. In general, a discriminator may be any component able to provide information or knowledge for the packing, including, for example, sensitivity of data elements, information about the structure of an algorithm, variables that exist at a receiving entity, operations to be executed at a receiving entity, or any other context information. Examples of discriminators are systems that run experiments to determine the position of bits that are equal in all the words of X, either a priori or at run time; systems that identify repeating binary patterns within X; parsers that analyze distributed algorithms; or user input, among others.

Figure 24B:
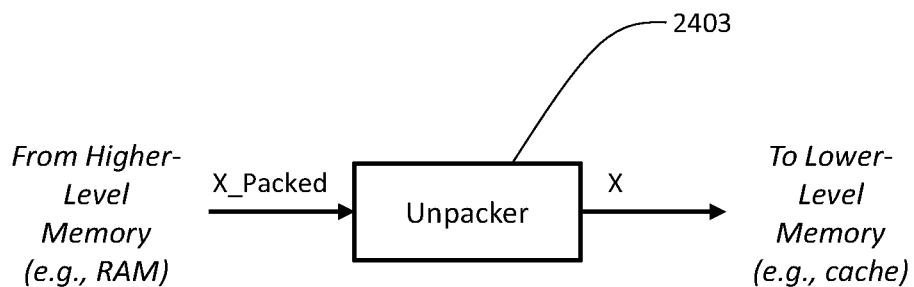

Data storage 502 (i.e., MAP) may be converted into data storage 501 using an unpacker component. FIG. 24B shows an exemplary embodiment of an unpacker component 2403 that takes data X_Packed, coming from a higher memory hierarchy, with said data X_Packed stored using data storage 502, and renders data X, which may correspond to data storage 501.

Figure 25:
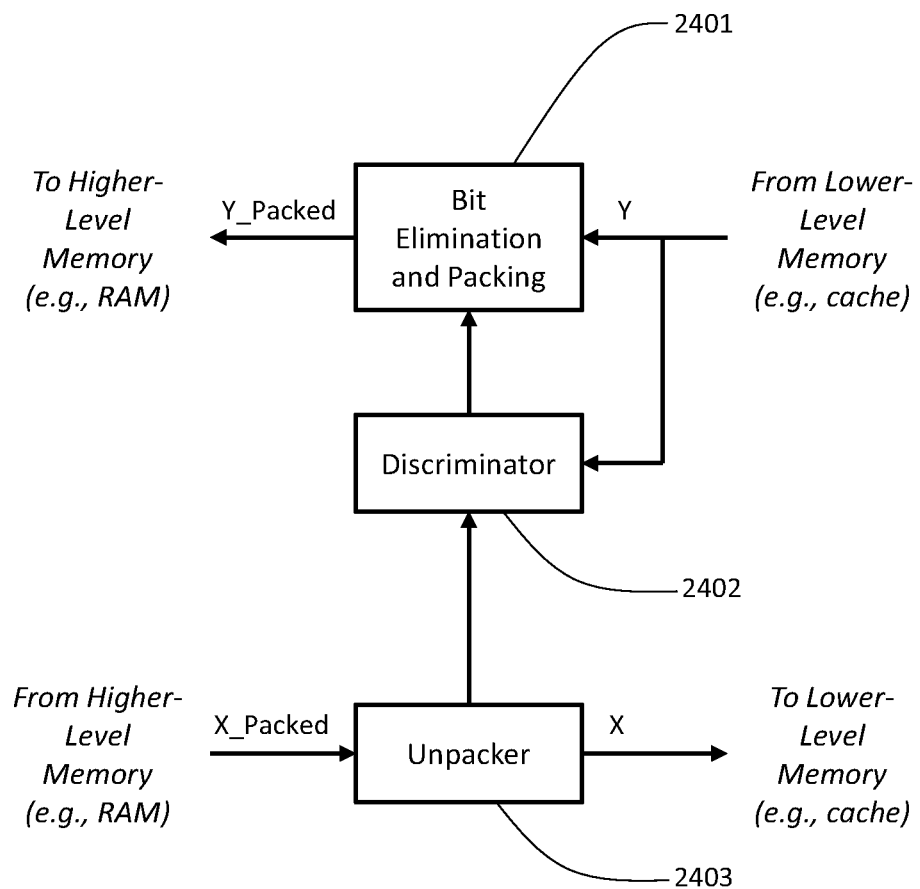

FIG. 25 shows an exemplary embodiment in which a discriminator 2402 may receive information from an unpacker 2403. In this exemplary embodiment a discriminator 2402 may also receive information from unpacked data Y. Note that Y may be equal to X, or it may contain data elements from X. Similarly, Y_Packed may be stored in the same memory space assigned to X_Packed, or it may be stored in parts of the memory space assigned to X_Packed. A discriminator 2402 that uses information from Y and/or from an unpacker 2403 may provide information for a bit elimination and packing component 2401 to produce more compact representations Y_Packed.

Figure 26A:
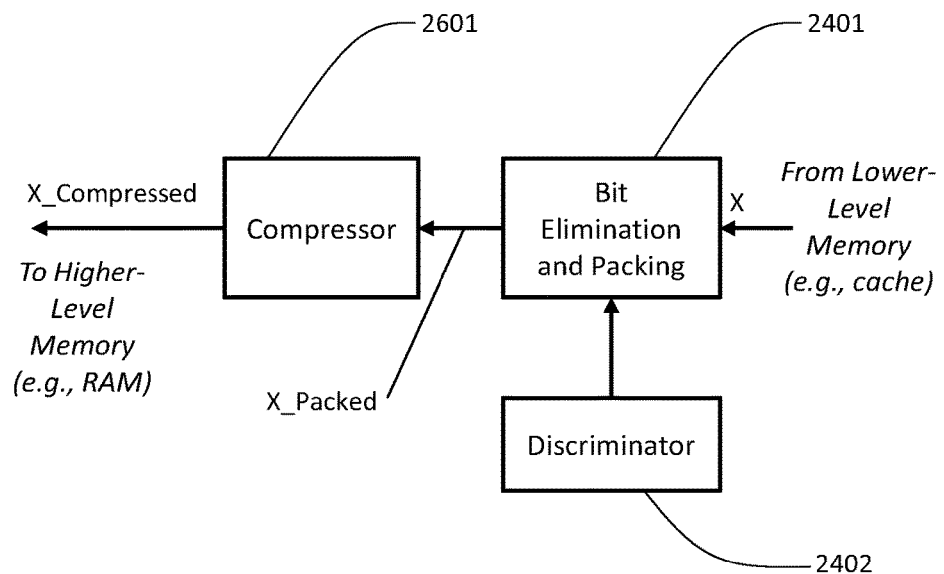
Figure 28:
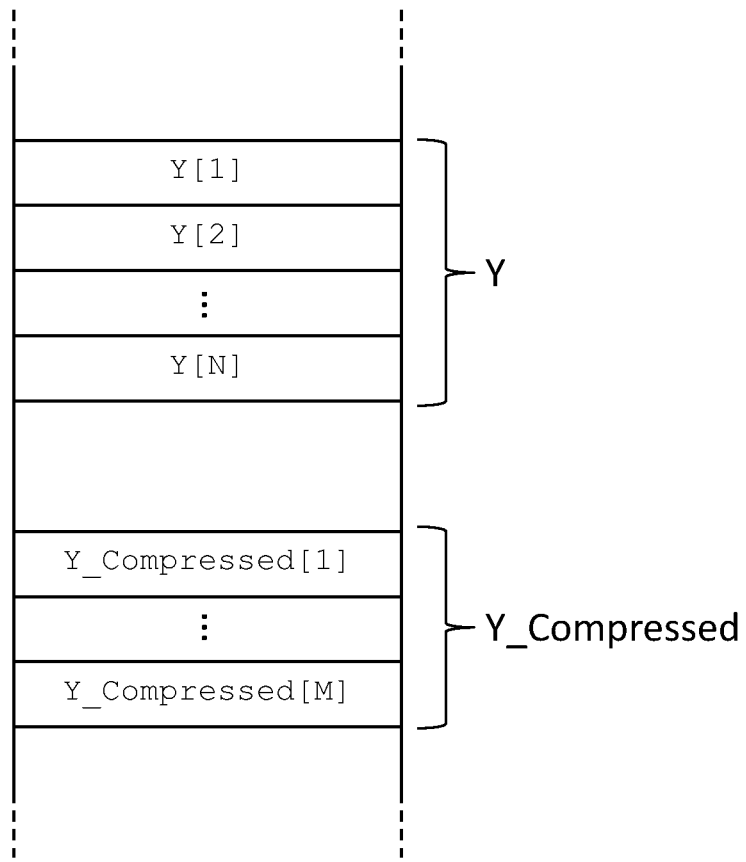

FIG. 26A illustrates and exemplary embodiment in which the number of bits produced by a bit elimination and packing component 2401 may be further reduced by a compressor 2601. The compressor 801 may be designed to implement any suitable compression scheme, such as Lempel-Ziv, Hamming, arithmetic encoding, delta encoding, etc. The compressor 2601 is preferably designed to implement a lossless compression scheme, but lossy compression schemes may be also used. The compressor receives some data X_Packed and renders compressed data X_Compressed. FIG. 28 illustrates an example in which a memory system 102 containing both data Y and Y_Compressed. Data Y may be divided into N words. Data Y_Compressed may be divided into M words. If the word length of data in Y and data in Y_Compressed is the same, and a compressor 2601 successfully compresses Y, then M<N.

Figure 26B:
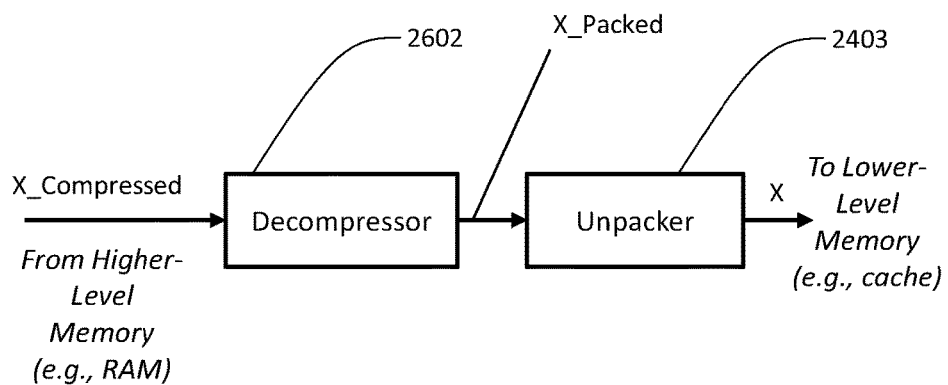

FIG. 26B illustrates and exemplary embodiment in which compressed data X_Compressed is decompressed by a decompressor 2602, which then renders input data to an unpacker 2402 to produce the corresponding data X.

Figure 27:
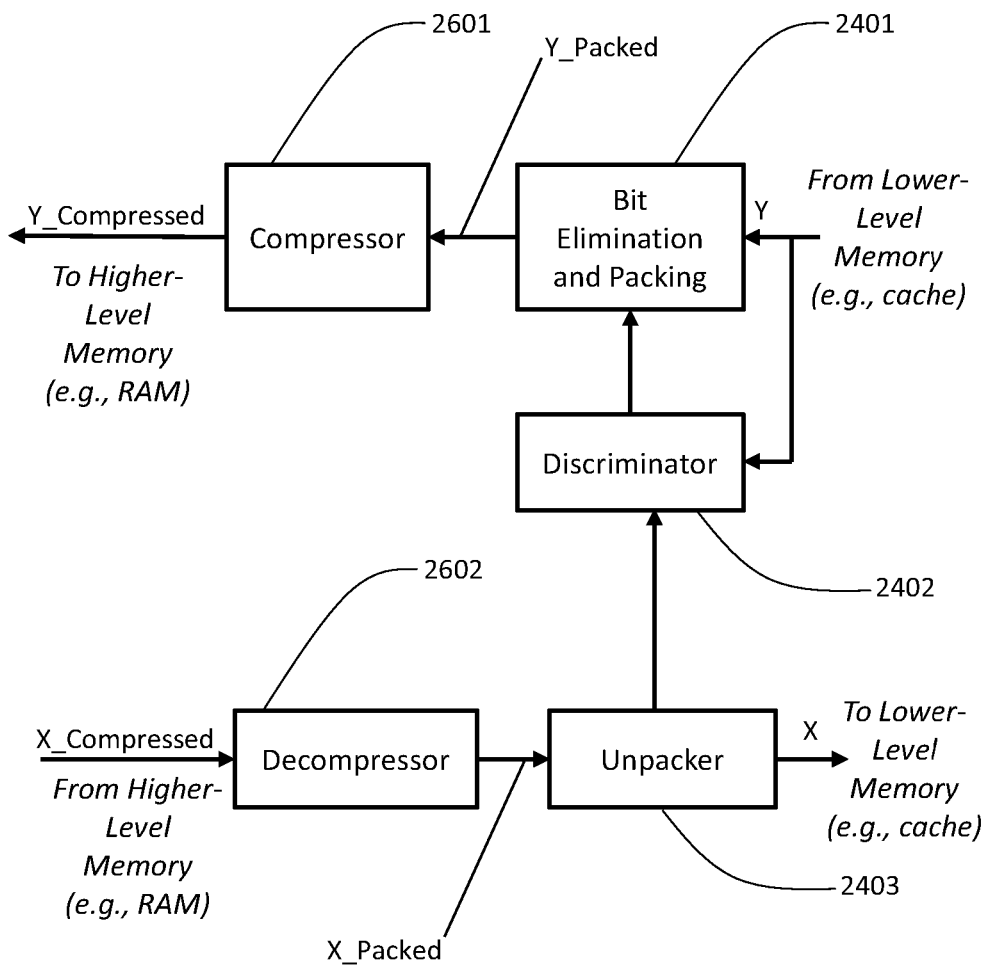

Similar to the way a compressor 2601 and a decompressor 2602 may be combined with the embodiments of FIGS. 24A and 24B, respectively, FIG. 27 illustrates an exemplary embodiment in which a compressor 2601 may process the output of a bit elimination and packing 2401 in the embodiment of FIG. 25, and a decompressor 2602 may pre-process the data that an unpacker 2403 receives in the embodiment of FIG. 25.

Data Packing and Compression Components

Figures 29A, 29B:
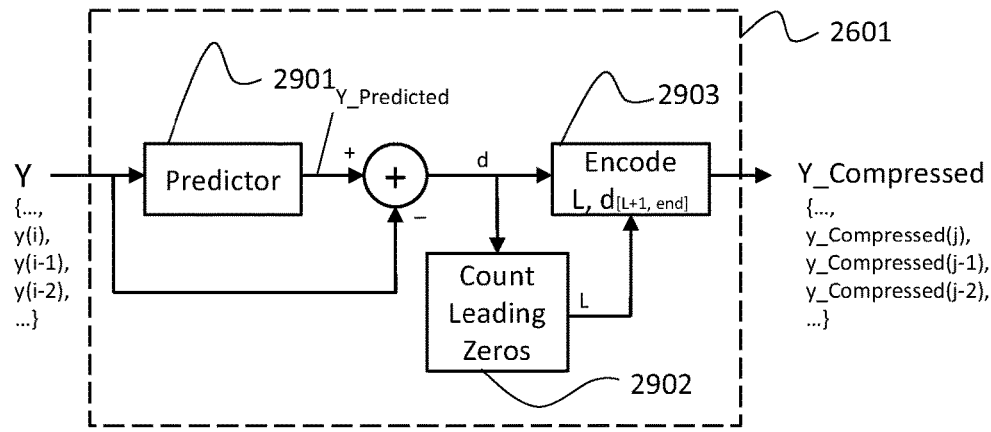
FIGS. 29A-29B illustrate example compressors.

FIG. 29A illustrates an example compressor 2601. The compressor in FIG. 29A may include a predictor 2901, a count leading zeros component 2902, and an encoder 2903. For a data element y(i) in Y, a predictor 2901 uses previous data (i.e., y(i−1), y(i−2), etc.) to estimate a predicted value y_Predicted(i). Then difference between y_Predicted(i) and y(i) is computed, rendering a data element "d". For example, a delta encoder may predict y_Predicted(i)=y(i−1). In this case, d=y_Predicted(i)−y(i−1). It is expected for a encoder 2903 to produce better compression rates when data elements d are used than when elements y(i) are directly used without a predictor. In the example compressor in FIG. 29A, a count leading zeros component 2902 counts the number of leading zeros in a data element d, i.e., the number of zeros going from the Most Significant Bit (MSB) to the Least Significant Bit (LSB) before finding a 1. The output of component 2902 is an integer L, which may be used for indicating a number of bits from the data element "d" that may be truncated by an encoder 2903. An encoder 2903, alternatively, may implement other encoding schemes. The output of an encoder 2903 is the compressed data Y_Compressed corresponding to input data Y.

FIG. 29B illustrates an example function CompressY, which may be used for implementing a compressor system 2601 in a computer device 101. The exemplary function CompressY receives a pointer to an array of 32-bit integers called Y, the size of said array Y, a pointer to an output array of 32-bit integers Y_Compressed, and a pointer to an integer M which, upon returning from the function, will contain the number of integer words in the array Y_Compressed. The exemplary function CompressY defines a delta predictor, in which d=y_Predicted(i)−y(i−1). The count leading zeros component is defined using a standard C built in function called "_builtin_clz". This function returns an integer, which corresponds to the number of leading zeros in |d|, and that is assigned to the variable L. The encoder is implemented using three successive calls to a function PushToArray that stores the encoded data element into Y_Compressed, with the first call to PushToArray storing the number of leading zeros using 5 bits, the second call to PushToArray storing 1-bit corresponding to the sign of d, and the third call to PushToArray storing a truncated version of d. The function PushToArray in the exemplary implementation of FIG. 29B has the function prototype:

void PushToArray(int Input, int FromBit, int ToBit,
    int *Output, int *OutputIndex, int *OutputP), which copies the group of bits defined by "FromBit" to "ToBit" from the input integer "Input", into the output integer array "Output". The arguments "FromBit" and "ToBit" are integer numbers between 1 and 32, where 1 indicates the MSB of Input, and 32 the LSB of Input. The group of bits extracted from Output are copied into Output starting at the bit position "*OutputP" in the element "*OutputIndex", where "*OutputIndex" is a nonnegative integer that indicates the element of the array "Output" that is being processed, and "*OutputP" is an integer between 1, the MSB, and 32, the LSB, indicating the first bit available for writing in "Output[*OutputIndex]". Upon return, the values of "*OutputIndex" and "*OutputP" are updated, depending on the values of "FromBit", "ToBit", as well as on the previous values of "*OutputIndex" and "*OutputP".

Figures 30A, 30B:
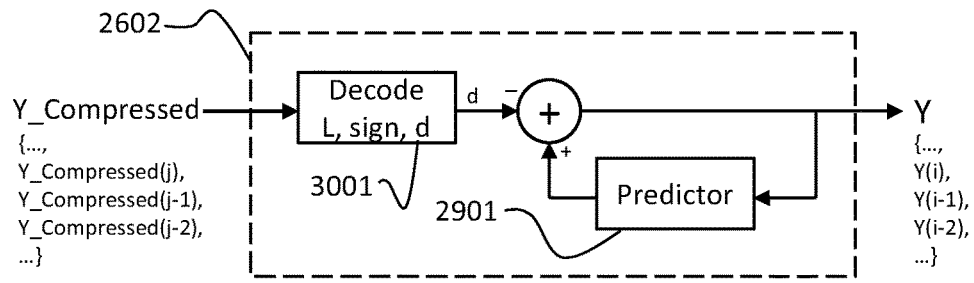
FIGS. 30A-30B illustrate example decompressors.

FIG. 30A illustrates an exemplary implementation of a decompressor 2602, which recovers data Y from data Y_Compressed. A decoder 3001 decodes data using any decoding mechanism or algorithm, such as, but not limited to Lempel-Ziv, Hamming, arithmetic decoding, delta encoding, etc. For example, if each data element Y_Compressed(i) of Y_Compressed is encoded with a variable-length encoding, with said encoding having the format (L, sign, d_encoded), such that L is the number of nonzero LSBs of a number d stored at Y_Compressed(i), sign is a bit that encodes the sign of d, and d_encoded contains the L LSBs of d, then the decoder 3001 recovers d by appending zeros to the MSBs of d to complete a the number of bits of data element d. If the number d is the error incurred by a predictor 2901 when trying to predict the data element Y(i), then a predictor 2901 may be used to finally recover a data element Y(i).

FIG. 30B illustrates an exemplary implementation of a decompressor 2602, where the description of the implementation is written in C. The implementation in C is described by the function DecompressY. The function DecompressY receives as arguments a pointer to an array of integers Y_Compressed, the size M of the array Y_Compressed, a pointer to an output array Y, and a pointer to an integer N that contains the size of N upon returning from DecompressY. DecompressY execute decoding and prediction for each data element in Y_Compressed. Decoding is accomplished through three successive calls to a function PullFromArray. This function has the prototype:

void PullFromArray(int *Input, int *ArrayPointer, int *BitPointer,
 int NumberOfBitsToPull).

The first argument in PullFromArray, Input, is a pointer to an array of integers. The second argument is a pointer to an integer that, as an input, indicates the element of the array Input that contains the first bit that will be extracted; as an output, *ArrayPointer indicates the index of the array Input that contains the bit that follows the last bit extracted from the call to PullFromArray. The third argument, as an input, indicates the bit number, from MSB to LSB, in Input [*ArrayPointer] that contains the first bit that will be extracted in the call to PullFromArray. As an output, *BitPointer contains the bit number, from MSB to LSB, in Input[*ArrayPointer] that follows the last bit extracted from the call to PullFromArray. The fourth argument, NumberOfBitsToPull, is an integer that indicates the number of bits to extract from the call to PullFromArray, starting in the bit *BitPointer of Input[*ArrayPointer]. The first call to PullFromArray in DecompressY extracts the number of bits L of the unsigned component d that is stored in Y_Compressed. The second call to PullFromArray obtains the sign of d. Finally, the last call to PullFromArray in DecompressY completes the decoding portion of the decompression. Then, the data element Y[i] in the output Y is recovered using a delta encoding based on Y[i−1] and d. Upon recovering Y[i], the value of *N is incremented in 1.

Figure 31:
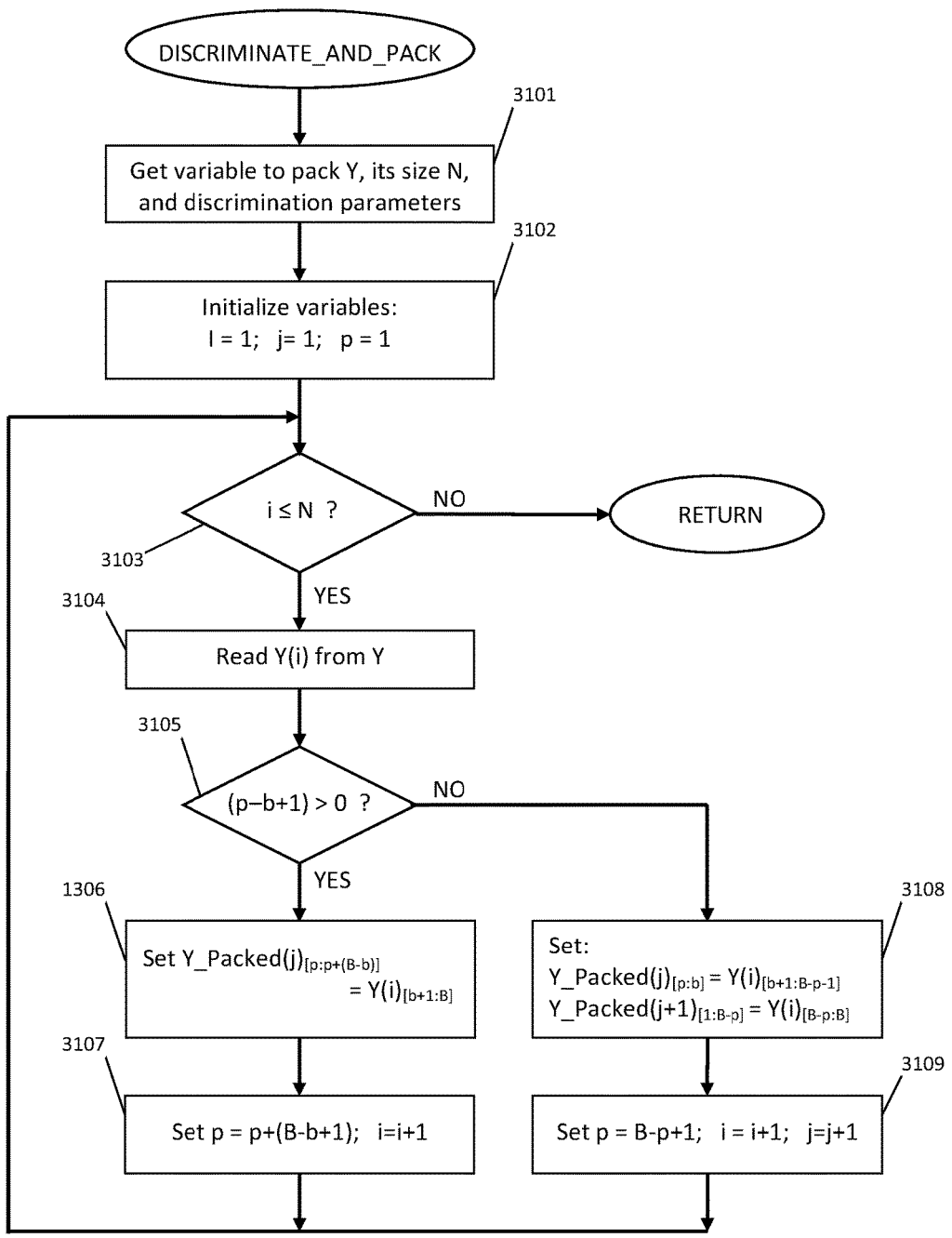

According to an aspect of the invention, sensitivity information of data elements may be used throughout the execution of an application. This may include the use of sensitivity information in data packing, unpacking, compression, or decompression operations. FIG. 31 illustrates an exemplary joint implementation DISCRIMINATE_AND_PACK of the elements 2401 and 2402 that may be used in an embodiment. DISCRIMINATE_AND_PACK receives an array Y of one or more data elements to pack, as well as any additional data that characterizes said data Y and a discriminator 2402 in the element 3101. These parameters may be, but are not limited to: size "N" of the array Y, the number "b" of MSBs that may be changed in elements of Y, the number "B" of bits of each data element in Y (e.g., 64 bits in ANSI/IEEE 754 double-precision floating point format, 32 bits of unsigned integer data), discrimination parameters, and/or any other information for discriminating and/or packing the variable. A set of control data may be initialized in 3102. For example, this set may include the three variables named "i", "j", and "p" that are shown in FIG. 31. Each data element Y(i) in Y may be processed in consecutive order, with said processing being controlled by a condition, as illustrated in 3103, which is an example condition in which, if "N" is not greater than or equal to "i" DISCRIMINTE_AND_PACK ends, whereas if N is less than or equal to "i", DISCRIMINATE_AND_PACK continues by moving to 3104. The i-th element of Y, Y[i], is retrieved in 3104. Following, as is shown in 3105, the condition "p−b+1>0" may be evaluated; if the result of the condition is positive (i.e., the remaining values of Y(i) fit in the current empty bits in the j-th position of the array Y_Packed) the process moves to 1406; if the result of the condition is negative (i.e., the remaining values of Y(i) do not fit in the current empty bits in the j-th position of the array Y_Packed, and therefore a (j+1)-th position in Y_ToSend may be allocated with the values that may not fit in the j-th position), the process moves to 3108. For elements 3106 and 3108 the following notation is used: Y_Packed(j)$_{[a:b]}$=Y(i)$_{[c:d]}$. This notation describes that the a-th bit through the b-th bit in the j-th position of the array Y_Packed get assigned the values of the c-th bit through the d-th bit in the i-th position of the array Y. The element 3106 describes the assignment that may be done to Y_Packed as per the notation described. After 3106, the process moves to 3107, where the updates of "p" and "i" are performed. Element 3107 leads back to 3103 to reevaluate whether the condition of (i≤N) is met. The element 3108 describes the assignment that may be done to Y_Packed as per the notation described. Also, the j-th plus 1 vector of the variable Y_Packed is assigned a value coming from Y, as described in 3108. Following 3108 comes the element 3109, where the updates of "p", "i", and "j" are executed. The exit of element 3109 leads back to 3103 to reevaluate whether the condition of (i≤N) is met.

FIG. 32 contains an exemplary implementation of bit elimination and packing 701. In this exemplary implementation, a discriminator indicates that a number "b" of MSBs of the elements of Y that do not change or are not used by a receiving entity (i.e., are not included in a packed version of Y). This exemplary implementation is based on a C function that considers the data type "int" as having 32 bits, but other programming languages or implementation methods or systems may be used. Examples of other implementation methods or systems are bit elimination and packing and discriminators defined in software, hardware, or combinations of software and hardware.

Figure 33:
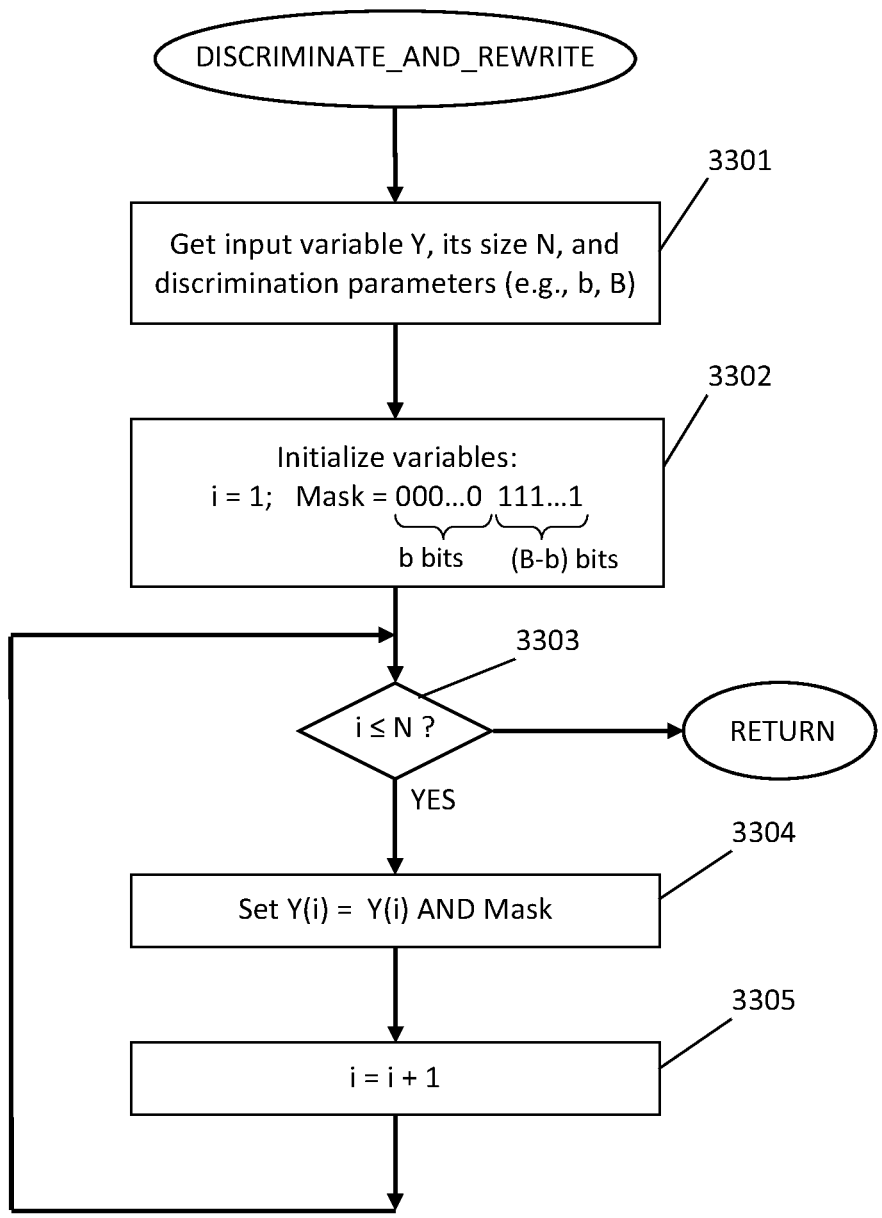

FIG. 33 illustrates an implementation of a DISCRIMINATE_AND_REWRITE component that may be used to discriminate and eliminate unnecessary bits in a variable Y in exemplary embodiments. The DISCRIMINATE_AN- D_REWRITE implementation rewrites an array Y of data elements Y(i) in such a way that a number "b" of MSBs of each data element are set to a given pattern. In FIG. 33, the array Y to be discriminated and rewritten may be retrieved along with other parameters from a memory system as it is depicted in 3301. These parameters may be, but are not limited to: size N of the variable Y, the number "b" of MSBs that will be changed in elements of the array Y, the size "B" of a variable or signal "Mask", and/or any other information and parameters that may be used for discriminating and/or rewriting the variable Y. For example, a variable "i" may be initialized to 1, and the "b" Most Significant Bits of a variable "Mask" may be assigned with the value "0", while the "B−b" less significant bits of that variable "Mask" may be assigned the value "1", as it is depicted in 3302. A stop condition is evaluated in 3303. For example, if "i" is not less than or equal to N, DISCRIMINATE_AND_REWRITE ends; whereas if N is more than or equal to "i", the i-th element of Y, Y[i], is assigned the result of the bitwise AND operation between Y[i] and "Mask", as it is shown in 3304. After this, "i" is incremented in 1605. The output of 3305 is directed to 3303 to reevaluate the stop condition.

Figures 34A, 34B, 34C:
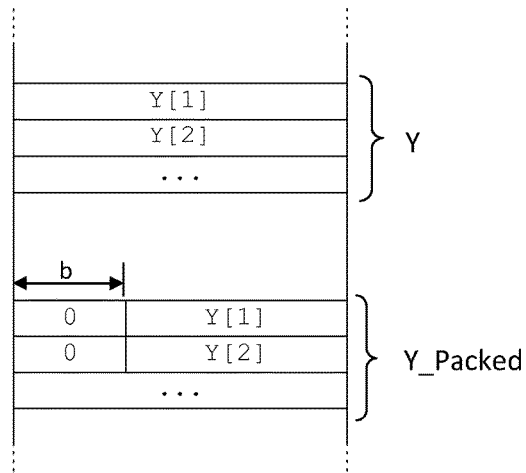

In an exemplary embodiment, bit elimination and packing replaces a number "b" of MSB of data elements in Y with a bit pattern that may support better compression gains if Y is processed by a compressor 2601. FIG. 34A shows an example of the organization of Y_Packed in a memory when a number "b" of MSBs of Y are replaced by a set of "b" zeros. FIG. 34B illustrates an exemplary implementation in which a function "DiscriminateAndRewrite" is used for replacing "b" MSBs of all the elements of Y when producing Y_Packed. When replacing bits instead of eliminating, a compressor 2601 may be able to render higher compression gains. It is known that entropy compressors or compressors that partition Y_Packed into segments may detect and take advantage of sequences of patterns, such as the sequence of zeros illustrated in FIG. 34A. In general, in an embodiment, an algorithm may be organized or rewritten to help a compressor 2601 attaining higher compression gains. FIG. 34C shows an exemplary implementation of this type of rewrite. This strategy may, for example, reduce total execution time of a distributed algorithm when the cost of the additional computations is less than the cost of transmitting the original variable Y.

FIG. 35 depicts an exemplary embodiment of an unpacker 2403 that may be implemented in a computer device 100. This unpacker may be used for unpacking data that was packed using a bit elimination and packing system 2401. The unpacker embodiment of FIG. 35 is defined as a function in C named "Unpack" that considers the data type "int" as having 32 bits. Although FIG. 35 implements an unpacker 2401 as a C function, other programming languages or implementation alternatives are possible. When bits in Y are not eliminated, as is done, for example, in FIG. 34B, unpacking may not be used.

Figure 36:
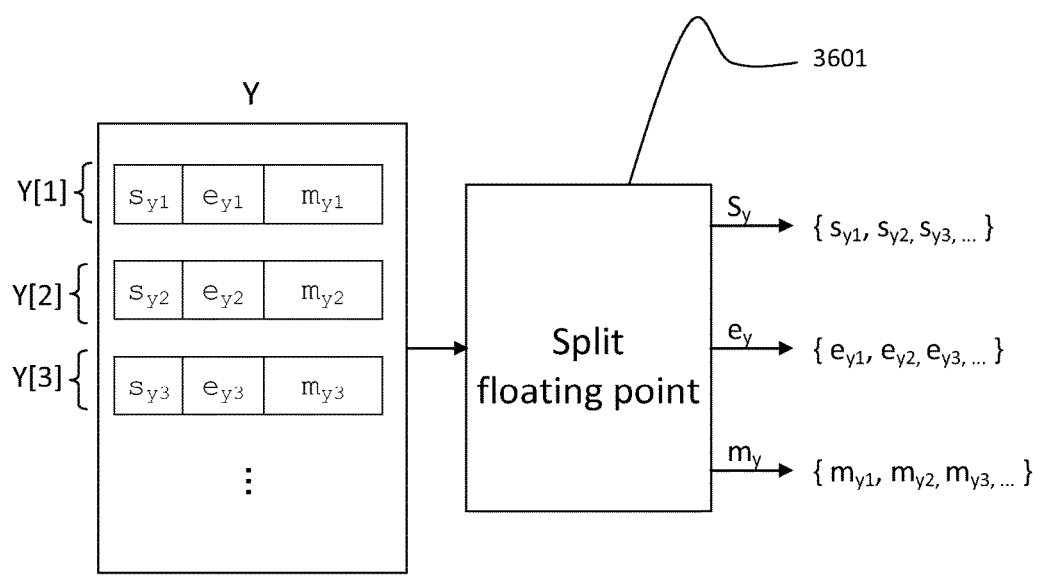
Figure 37A:
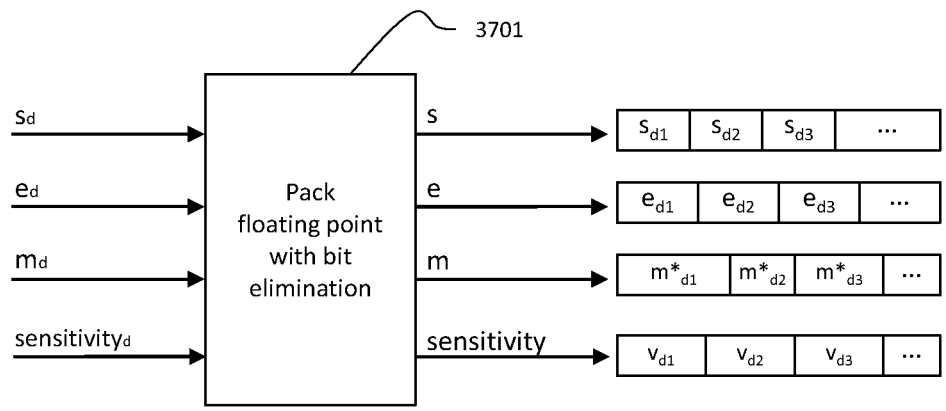
Figure 37B:
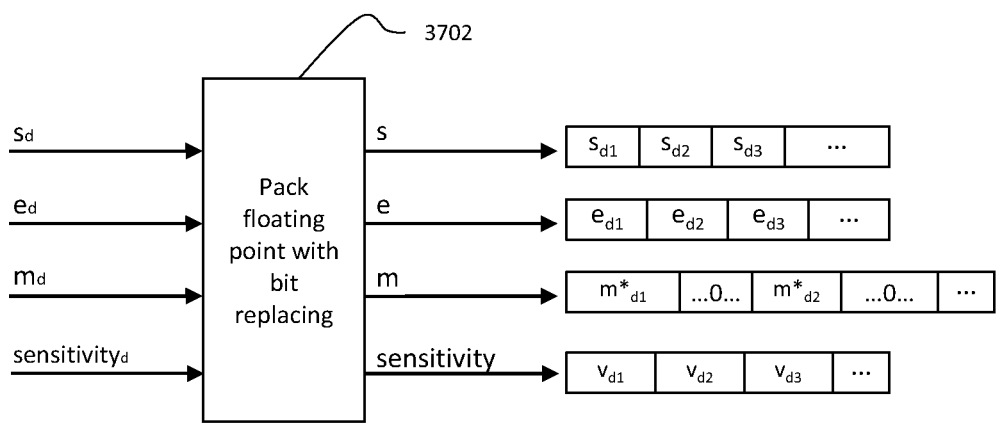

FIG. 36 shows a component in which a system 3601 receives an array of floating point numbers and outputs three sets of data that characterize the numbers in Y: a set of signs $s_y$, a set of exponents $e_y$, and a set of mantissas $m_y$. The sets $s_y$, $e_y$, and $m_y$ may be manipulated and packed into one or more variables for subsequent reduction of bit lengths. For example, FIG. 37A shows an embodiment in which elements in a set $s_d$ are stored as an array of signs s, elements in a set $e_d$ are stored as an array of exponents e, and elements in a set sensitivity$_d$ are stored as an array of sensitivities called "sensitivity". The embodiment in FIG. 37A reads the elements in $m_d$ and creates an output array m in which only the number of MSBs indicated by each element in sensitivity$_d$ are packed for each element in m. FIG. 37B shows an exemplary embodiment in which arrays s, e, and "sensitivity" are generated as in the embodiment in FIG. 37A, but in which all the bits in the elements of $m_d$ are included. In this case, the values of the number of MSB bits of the mantissas in $m_\delta$ indicated by the sensitivity values is left without changes, but all the other bits of the corresponding mantissas are set to zero.

Figure 38:
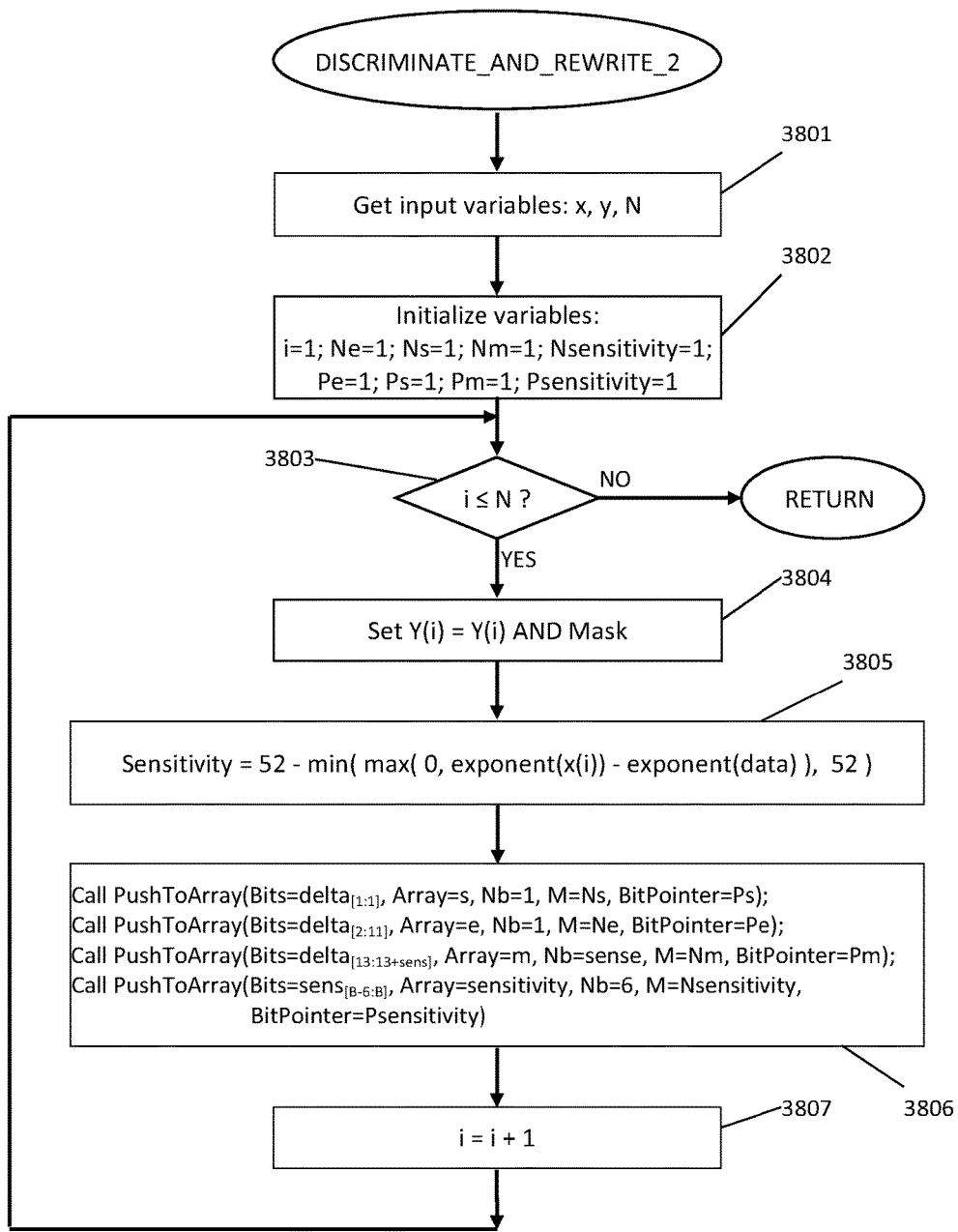

FIG. 38, illustrates an embodiment that executes a set of operations for a joint implementation of the embodiments illustrated in FIG. 36 and FIG. 37A. The embodiment in FIG. 38 may initially split two floating-point variables (X and Y) into their signs, exponents, and mantissas, as per the ANSI/IEEE 754 standard or any other standard. The embodiment may also estimate the sensitivities of the two variables X and Y. The embodiment may also eliminate any unnecessary bits in the output information, and pack the remaining information into a separate array of signs, a separate array of exponents, a separate array of mantissas, and a separate array of sensitivities. Initially, the embodiment in FIG. 38 retrieves the variables X, Y, and N (the size of Y) as explained in 3801. This information may be retrieved from a memory system where it may have been stored. Several variables are then initialized to "1" as described in 3802. In 3803, if "i" not less than or equal to "N" (i.e., both X and Y have been effectively packed into separate arrays of signs, exponents, mantissas, and sensitivities) the whole process ends; whereas if N is more than or equal to "i" (i.e, not all the bits in X and Y have been packed), the process moves on to 3804. In 3804 the value $\delta$ may be calculated as the difference between Y[i] and X[i]. In 3805 the sensitivity value is calculated as a function of X[i] and $\delta$ as described. Item 3806 calls a function "PushToArray" in order to pack the information into separate arrays of signs, exponents, sensitivities, and mantissas. The function "PushToArray" has the following prototype unsigned long PushToArray(unsigned long IntegerToPush,
  unsigned long NumberOfLSBsToPush, unsigned long *Array,
  unsigned long *ArrayIndex, unsigned long *BitPointer).

The function PushToArray reads the number IntegerToPush, extracts its leftmost number of bits indicated by NumberOfLSBsToPush, and writes them at Array[*ArrayIndex] starting at the bit position indicated by *BitPointer. *BitPointer is a number between 1 and 64. If NumberOfLSBsToPush is larger than (64−*BitPointer), then the (64−*BitPointer) MSBs of the group of bits extracted from IntegerToPush are copied to the rightmost part of Array[*ArrayIndex], and the (NumberOfLSBsToPush+BitPointer−64) LSBs of the group of bits extracted from IntegerToPush are copied to the leftmost part of Array[*ArrayIndex+1], followed by an increment of *ArrayIndex in 1. Before returning, PushToArray sets *BitPointer to indicate the position of the next bit available for writing at Array[*ArrayIndex]. Although FIG. 38 illustrates an embodiment in which the output is delivered as four separate variable arrays, other possible packing strategies may be implemented. For example, a user may prefer to pack a combined s and e representation in one array, and m and "sensitivity" in a separate array. It should be evident for a skilled in the art that other implementations using other programming languages or implementation techniques may be used for producing alternative embodiments. After 3806 the process moves to 3807, where the value of "i" is incremented in one. The process is directed to 3803 to reassess whether (i≤N) and the process may continue or not. The process goes on until the condition (i≤N) in 3803 presents a false result.

Figure 39:
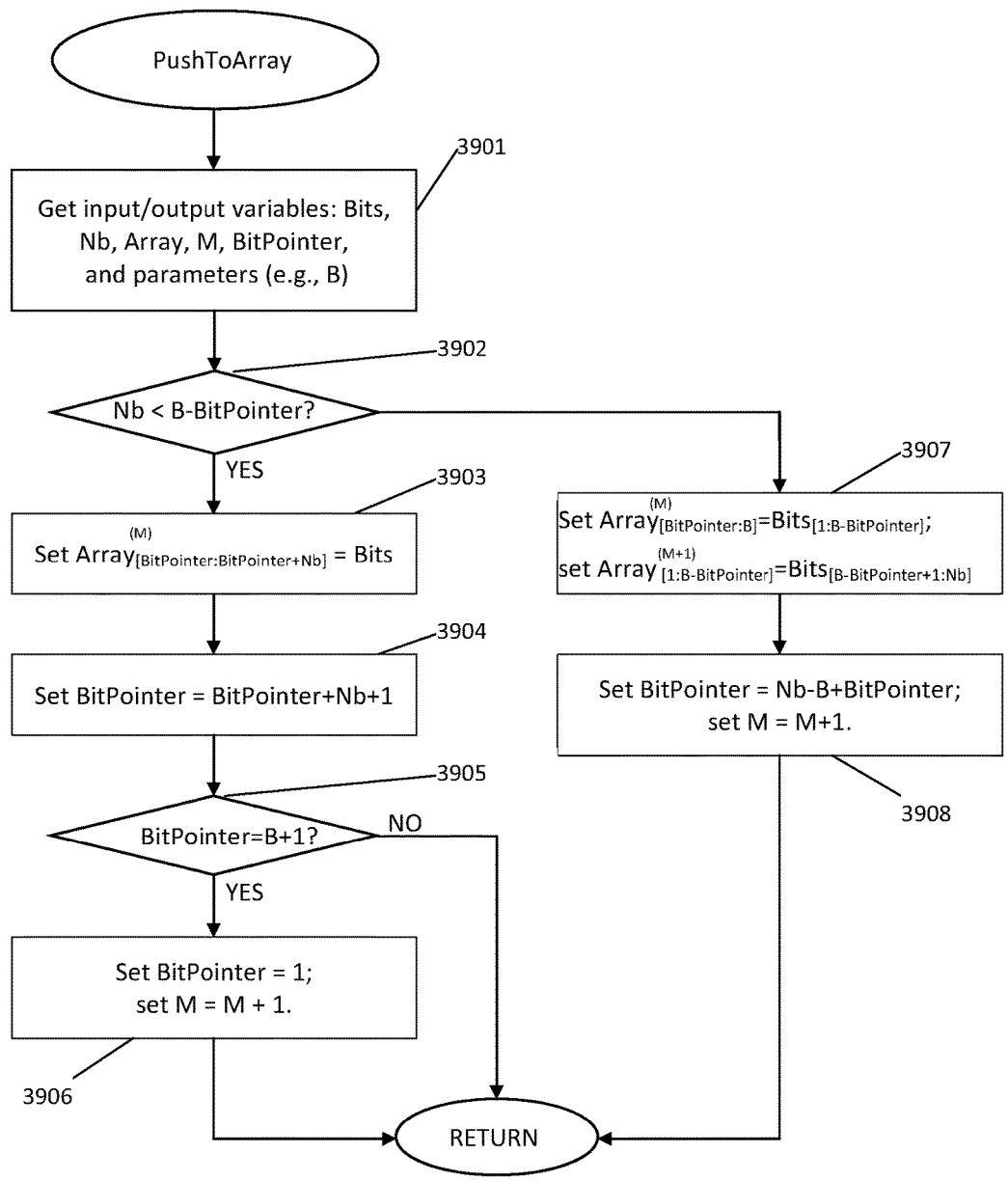

FIG. 39 illustrates an embodiment that may be used to push elements to an array called "Array" with size B. In 3901, the embodiment may retrieve input/output variables, such as, but not limited to: the number of bits "Nb" of the element to be pushed into "Array", the "Array", the number "M" of the element being pushed into the array, the element to be pushed which may be named as "Bits", a pointer to "Array", "BitPointer" as the pointer to a specific bit of the "Array". The embodiment may also retrieve parameters such as B and/or any other parameters to push elements into "Array". In 3902 the condition "Nb<B-BitPointer" may be assessed, and if the result is negative the process may go to item 3907; if the result is positive the process will goes to 3903. For items 3903 and 3907 the following notation, or a part of it, is used: Array(M)[a:b]=Bits(i)[c:d]. This notation details that the a-th bit through the b-th bit in the M-th position of the array "Array" get assigned the values of the c-th bit through the d-th bit in the i-th position of the array Bits. The process goes into 3903 if the condition "Nb<B-BitPointer" has a positive result, i.e., if the element to be pushed into "Array" will fit in the M-th position of "Array". In 3903 in the M-th position of "Array" from the positions pointed by BitPointer to (BitPointer+Nb) may get assigned the value of the element to be pushed, i.e., the value in "Bits". After 3903, item 3904 is shown, where "BitPointer" gets updated as shown in FIG. 39. Then a conditional 3905 evaluates whether "BitPointer=B+1"; if the result is negative the whole process ends, whereas if the result is positive, the process directs to 3906. In 3906 both BitPointer and M get updated as shown in the figure. Then the process ends. The process goes into 3907 if "Nb<B-BitPointer" has a negative result, i.e., if the element to be pushed will not fit in the M-th position of the array and may be split: one portion of the element goes into the M-th position of "Array" and the remaining portion goes into the (M+1)-th position of "Array". This assignment is described in 3907 as per the notation described. After 3907 comes 3908, where BitPointer and M are updated. After this, the process ends.

FIG. 40 contains an exemplary embodiment coded in C that executes a set of operations for a joint implementation of the embodiments illustrated in FIG. 35 and FIG. 36A. The embodiment in FIG. 40 is designed for a compiler or system that defines the type of data "unsigned long" as having 64 bits, and that defines the type of data "double" in the standard double precision floating point representation. However, alternative embodiments may be implemented to accommodate other data type definitions. The embodiment in FIG. 40 calls a function "PushToArray", which has the prototype unsigned long PushToArray(unsigned long IntegerToPush,
  unsigned long NumberOfLSBsToPush, unsigned long *Array,
  unsigned long *ArrayIndex, unsigned long *BitPointer).

The function PushToArray reads the number IntegerToPush, extracts its leftmost number of bits indicated by NumberOfLSBsToPush, and writes them at Array[*ArrayIndex] starting at the bit position indicated by *BitPointer. *BitPointer is a number between 1 and 64. If NumberOfLSBsToPush is larger than (64−*BitPointer), then the (64−*BitPointer) MSBs of the group of bits extracted from IntegerToPush are copied to the rightmost part of Array[*ArrayIndex], and the (NumberOfLSBsToPush+BitPointer−64) LSBs of the group of bits extracted from IntegerToPush are copied to the leftmost part of Array[*ArrayIndex+1], followed by an increment of *ArrayIndex in 1. Before returning, PushToArray sets *BitPointer to indicate the position of the next bit available for writing at Array[*ArrayIndex]. Although FIG. 40 illustrates an embodiment in which the output is delivered as four separate variable arrays, other possible packing strategies may be implemented. For example, a user may prefer to pack a combined s and e representation in one array, and m and "sensitivity" in a separate array. It should be evident for a skilled in the art that other implementations using other programming languages or implementation techniques may be used for producing alternative embodiments. The embodiment in FIG. 40 evaluates if delta<$y_i$. If this condition is not satisfied, then all the bits in the mantissa should be maintained. That is to say, the sensitivity value of the resulting delta is 52. An embodiment may store the original number $y_i$ instead of delta, together with a signaling code that indicates that the stored number is $y_i$ and not delta. Given that the sensitivity value may be computed by subtracting the exponent of delta from the exponent of $x_i$, an exemplary embodiment may avoid storing the sensitivity values array.

Figure 41:
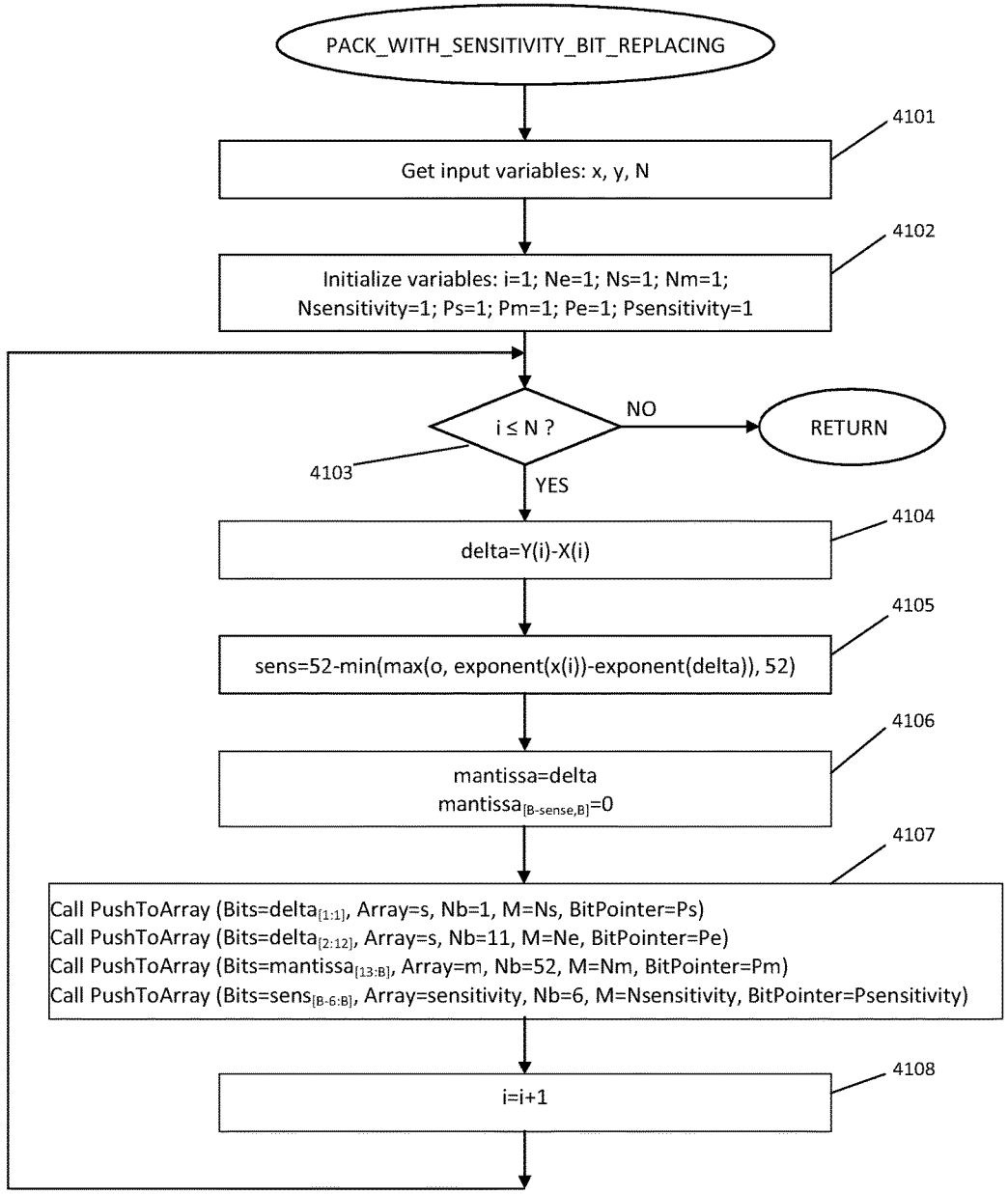

FIG. 41 illustrates an embodiment that executes a set of operations for a joint implementation of the embodiments illustrated in FIG. 35 and FIG. 36B, and a delta encoding in such a way that the difference delta of data elements $y_i-x_i$ is delivered as the packed output. FIG. 41 illustrates an embodiment that analyzes two floating-point variables (X and Y) and splits them into their signs, exponents, and mantissas, as per the ANSI/IEEE 754 standard or any other standard. The embodiment may also estimate the sensitivities of the two variables X and Y. The embodiment may also pack the remaining information into a separate array of signs, a separate array of exponents, and separate array of sensitivities. To pack the array of mantissas, the embodiment may perform a padding operation to add enough zeroes to each mantissa element such that all elements have the same size "B", as explained graphically in FIG. 34B. Initially, the embodiment in FIG. 41 retrieves the variables X, Y, and N (the size of Y) as explained in 4101. This information may be retrieved from a memory system where it may have been stored. Several variables are then initialized to "1" as shown in 4102. As it is shown in item 4103, if "i" is not less than or equal to "N" the whole process ends; whereas if "N" is more than or equal to "i", the process moves on to 4104. In 4104 the value delta may be calculated as the difference between Y[i] and X[i]. In 4105 the sensitivity value is calculated as a function of X[i] and delta. Item 4106 updates the value of "mantissa" to delta, and the value of the last "sens" bits of the mantissa to "0". Item 4107 may call a function "PushToArray" in the same manner in which the embodiment in FIG. 38 calls the function "PushToArray" in 3806. The difference between 4107 and 3806 may be that in 4107 the third call to "PushToArray" assigns to "Bits" the value of all the mantissa bits (from the 13-th to the B-th), which may create a zero padding in the output that ensures that all elements in the mantissa array have the same size (B). Although FIG. 41 illustrates an embodiment in which the output is delivered as four separate variable arrays, other possible packing strategies may be implemented. For example, a user may prefer to pack a combined sign and exponent representation in one array, and m and "sensitivity" in a separate array. It should be evident for a skilled in the art that other implementations using other programming languages or implementation techniques may be used for producing alternative embodiments. Following item 4107 is item 4108, where the value of "i" is incremented by one. The process is directed to 4103 to reassess whether (i≤N) or not. The process goes on until the condition (i≤N) in item 4103 becomes false.

FIG. 42 illustrates an exemplary embodiment constructed in a similar way to the embodiment in FIG. 40. The embodiment in FIG. 42, however, does not truncate bits in the mantissas. Instead of truncating bits in the mantissas as in the embodiment illustrated in FIG. 40, the embodiment in FIG. 42 replaces the bits in the mantissas that are not included in the range indicated by the sensitivities of the corresponding floating point numbers by zeroes, as is shown in FIG. 37B. Replacing these bits by zeroes may be useful when the output arrays of the embodiment in FIG. 42, or the outputs of embodiments constructed using this strategy, are delivered to a compressor 2601 that may identify and efficiently compress said patterns of zeroes.

Figure 43:
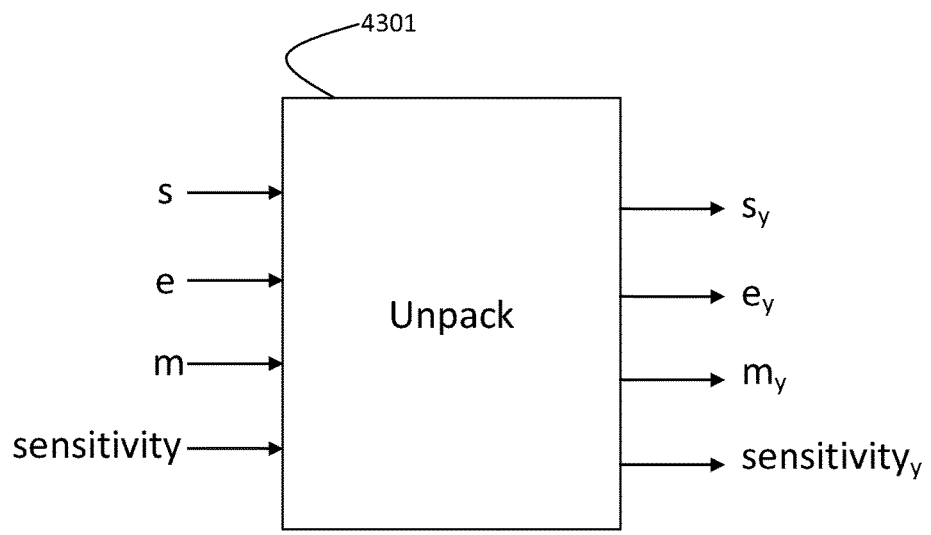

FIG. 43 shows an Unpack system 4301 that may be used to process arrays of packed signs s, exponents e, mantissas m, and sensitivities "sensitivity". After partially or fully receiving one or more input arrays, the unpack system 4301 generates sets $s_y$, $e_y$, $m_y$, and sensitivity$_y$, which should be equivalent to the corresponding sets used in the implementation in FIG. 36. In an embodiment, the output of system 4301 may be used for regenerating a variable array of floating point numbers Y.

Figure 44:
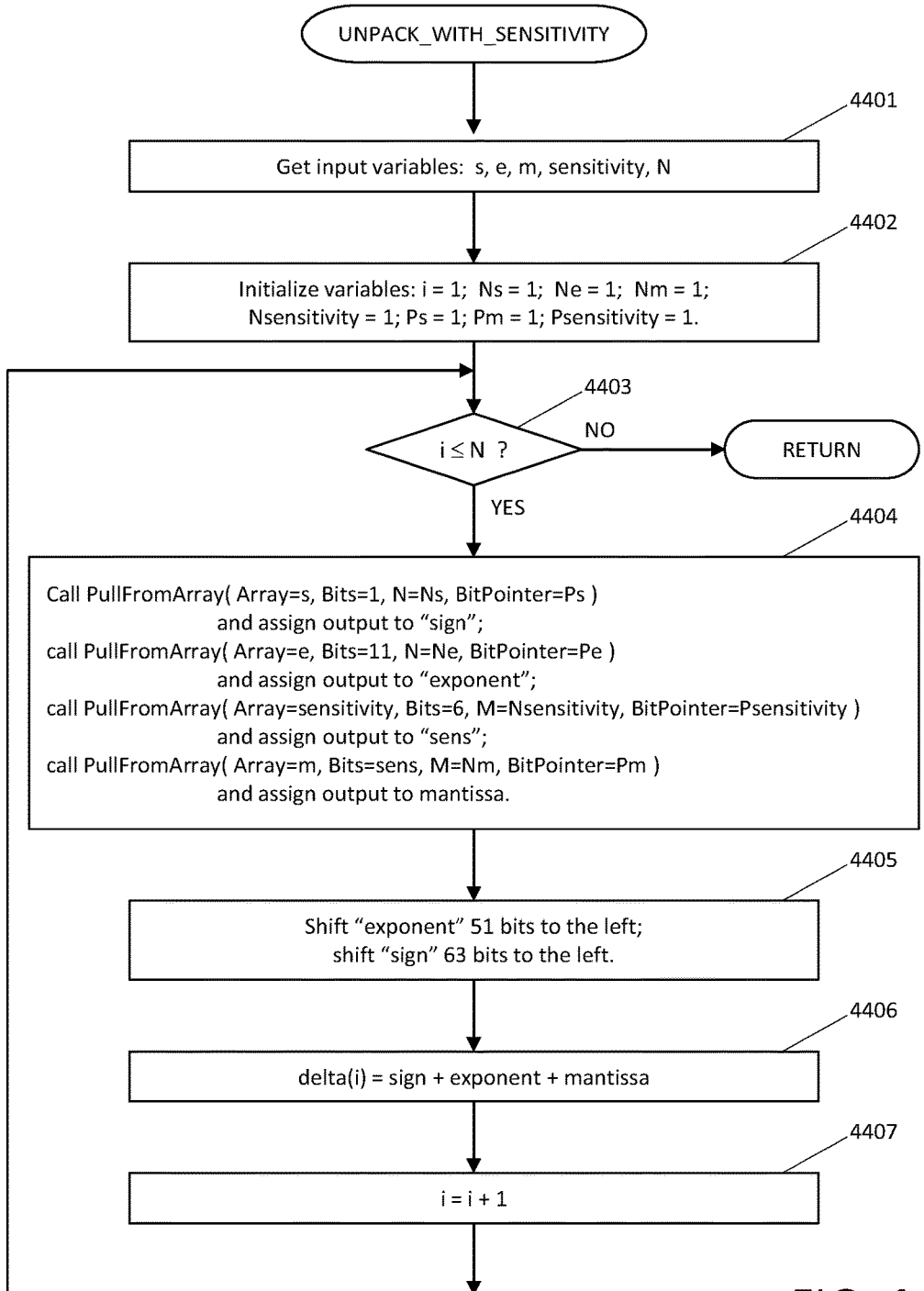

FIG. 44 illustrates an embodiment that implements an unpack system similar to the one described in FIG. 43. The embodiment in FIG. 44 may be used to process separate arrays of packed signs "s", exponents "e", mantissas "m", and sensitivities "sensitivity". After partially or fully receiving one or more of these input arrays the embodiment in FIG. 44 may perform a process to unpack the arrays into unpacked arrays named "sign", "exponent", "mantissa", and "sens", respectively. In 4401, input variables/arrays "s", "e", "m", "sensitivity", and the array N (which carries the values of the sizes of the elements in the arrays) are gathered. This information may be retrieved from a memory system. Several variables/signals are then initialized to "1" as shown in 4402. As is shown in item 4403, if the value of "i" is larger than "N" the unpacking ends; otherwise, UNPACK_WITH_SENSITIVITY continues with item 4404. In item 4404 the process "PullFromArray" gets called for each of the arrays of data that may have been retrieved (i.e., "s", "e", "m", and "sensitivity"). Through "PullFromArray", UNPACK_WITH_SENSITIVITY may pull values from each of the retrieved arrays to place them in an output array. In item 4405 the output arrays "exponent" and "sign" may be shifted 51 and 63 bits to the left respectively to place them in their respective positions as per the ANSI/IEEE 754 floating point standard. In 4406, the value delta(i) is updated with the addition of the "sign", "exponent", and "mantissa" output arrays. In 4407 the value of "i" is incremented by one. The process is directed to 4403 to reassess whether (i≤N). UNPACK_WITH_SENSITIVITY iterates until the condition (i≤N) in 4403 becomes false.

Figure 45:
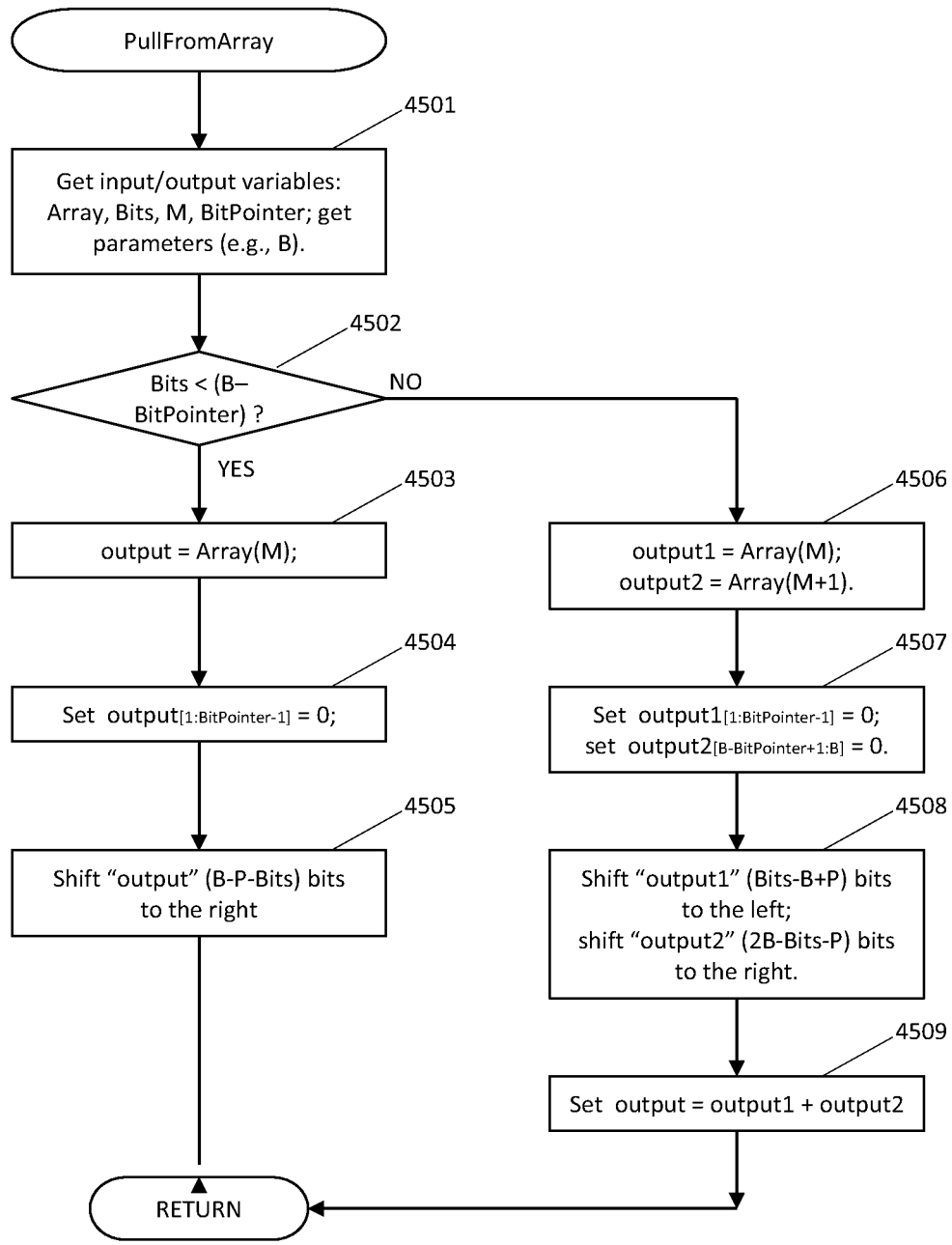

FIG. 45 illustrates an embodiment that may be used to pull elements from an array called "Array" with size B. In 4501, the embodiment may retrieve input/output variables, such as, but not limited to: the number of bits "Nb" of the element to be pulled from "Array", the number "M" of the element being pushed into the array, the element to be pulled and named as "Bits", a pointer to "Array", "BitPointer" as the pointer to a specific bit of the "Array". The embodiment may also retrieve parameters such as "B" and/or any other parameters to pull elements from "Array". In 2802 the condition "Bits<B-BitPointer" may be assessed, and if the result is negative PullFromArray may go to 4506; whereas if the result is positive PullFromArray will go to 4503. For items 4504 and 4507 the following notation, or a part of it, is used: output[a:b]=0. This notation implies that the a-th bit through the b-th bit in the array "output" get assigned the value "0". In 4504 the first (BitPointer−1) bits of "output" get assigned a "0" value. In 4505 "output" gets shifted by (B-P-Bits) to the right. After 4505, PullFromArray ends. In 4506 the M-th portion of "Array" gets assigned to "output1" and the (M+1)-th portion of "Array" gets assigned to "output2". In 4507 the first (BitPointer−1) bits of "output" get assigned a "0" value; and the last (BitPointer−1) bits get assigned a "0" value. In 4508 "output1" gets shifted by (Bits-B+P) to the left; and "output2" gets shifted (2B-Bits-P) bits to the right. Item 4509 sets "output" as the sum of "output1" and "output2". After 4509 PullFromArray ends.

FIG. 46 illustrates an exemplary embodiment of an unpack system 4301 implemented in a computer device 100, which is combined with the generation of a vector "delta". Although the implementation in FIG. 46 is coded in C, and is designed for being compiled or for running on a system that defines the type of data "unsigned long" containing 64 bits, other programming languages or implementations designed according to the spirit of the invention may also be used. The function UnpackWithSensitivity in FIG. 46 calls a function PullFromArray, which has the prototype unsigned long PullFromArray(unsigned long *Array, unsigned long
BitsToExtract, unsigned long *ArrayIndex, unsigned long *BitPointer);

The function PullFromArray reads a number of bits indicated by its argument BitsToExtract from the element Array[*ArrayIndex], starting said reading at the bit number indicated by the argument BitPointer. BitPointer is a number between 1 and 64, with BitPointer=1 corresponding to the MSB of Array[*ArrayIndex] and BitPointer=64 corresponding to the LSB of Array[*ArrayIndex]. If BitPointer+BitsToExtract is larger than 64, the extracted bits are formed by the (64−BitsPointer) LSB of Array[*ArrayIndex], concatenated with the (BitsToExtract+BitPointer−64) MSB of Array[ArrayIndex+1], and *ArrayIndex is incremented in 1. The extracted bits are aligned positioning their LSB at bit 64, and padding with zeroes to the left, so to complete a 64 bit number. Before returning, PullFromArray updates BitPointer to indicate the position of the bit that follows the last bit read. The implementation in FIG. 46 may be used for unpacking numbers that have been packed with bit elimination. The implementation in FIG. 46 may be used for unpacking numbers that have been packed with bit replacing by setting the elements in the set "sensitivity" to 52. The operations and instructions in FIG. 46 may be modified for optimizing for faster execution.

Figure 47A:
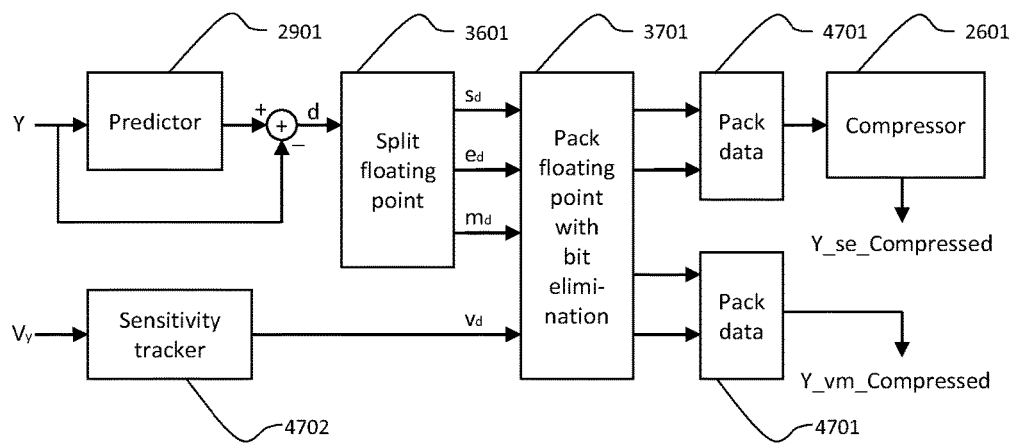
Figure 47B:
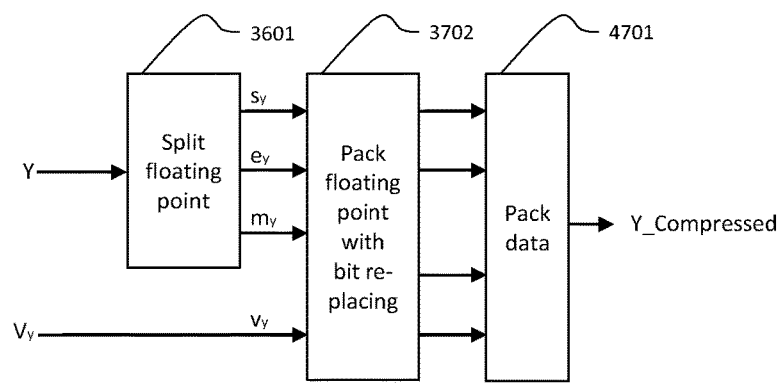

An embodiment may concatenate a compressor 2601 with a sensitivity-based packing with bit elimination 3701. Another embodiment may concatenate a sensitivity-based packing with bit elimination 3701 with one or more compressors 2601. For example, the output arrays s and e from a 3701 component may be combined in a single array of the form $[s_{d1}, e_{d1}, s_{d2}, e_{d2}, \ldots]$, and then this array may be used as input for a compressor 2601. An exemplary embodiment for compression is shown in FIG. 47A. The embodiment in FIG. 47A receives a set of floating point data elements $Y=\{y_1, y_2, \ldots, y_n\}$, n≥1, together with its corresponding set of sensitivities $V=\{v_{y1}, v_{y2}, \ldots, v_{yn}\}$ and produces two sets of compressed data Y_se_Compressed and Y_vm_Compressed, containing compressed signs, exponents, mantissas, and sensitivities of the data elements in Y. A predictor 2901 may be used for generating data elements d that may allow better compression rates for data in Y. Based on the sensitivities of the elements of Y, a sensitivity tracker 4702 may compute the sensitivity value of data elements d. For example, a sensitivity tracker may implement any of the N-conservative or N-aggressive algebras described above. A split floating point component 3601 may be used for splitting data elements d into their floating point components $s_d$, $e_d$, and $m_d$. Then, a pack floating point with bit elimination component 3701 may use the floating point components $s_d$, $e_d$, and $m_d$, as well as sensitivity information $v_d$ for producing data elements s, e, $v_d$, and m, where a data element in m may contains less bits than its corresponding data element in $m_d$ due to the potential truncation of garbage bits enabled by the sensitivity value $v_d$. Then, the resulting sets of data elements s, e, $v_d$, and m may be packed into one or more arrays. For example, a pack data component 4701 may produce an output array taking one data element from each input at the time (e.g., if the inputs are $\{s_1, s_2, s_3\}$ and $\{e_1, e_2, e_3\}$, then the packed output would be $\{s_1, e_1, s_2, e_2, s_3, e_3\}$). Then s and e may be packed into a single array $\{s,e\}$ and $v_d$ and m may also be packed into a single array Y_vm_Compressed=$\{v_{d1}, m_{d1}, \ldots, v_{dn}, m_{dn}\}$. One skilled in the art would notice that this type of sensitivity-based packing may be seen as a variable-length encoding. One or more arrays of data elements generated by 4701 may be further compressed using a compressor 2601. For example, the packed output $\{s, e\}$ generated by a pack data component 4701 may be compressed by a compressor 2601, generating an output Y_se_Compressed that contains the data $\{s_{d1}, e_{d1}, \ldots, s_{dn}, e_{dn}\}$. An embodiment may decompress data elements that were originally compressed using a sensitivity-based packing with bit elimination 3701, by making use of an unpacking that recovers the full bit-length (e.g., 32 bits, 64 bits, other user-defined bit lengths) data. An embodiment may also incorporate a decompressor to decompress data elements or subarrays that were used in sensitivity-based compression.

Figure 48:
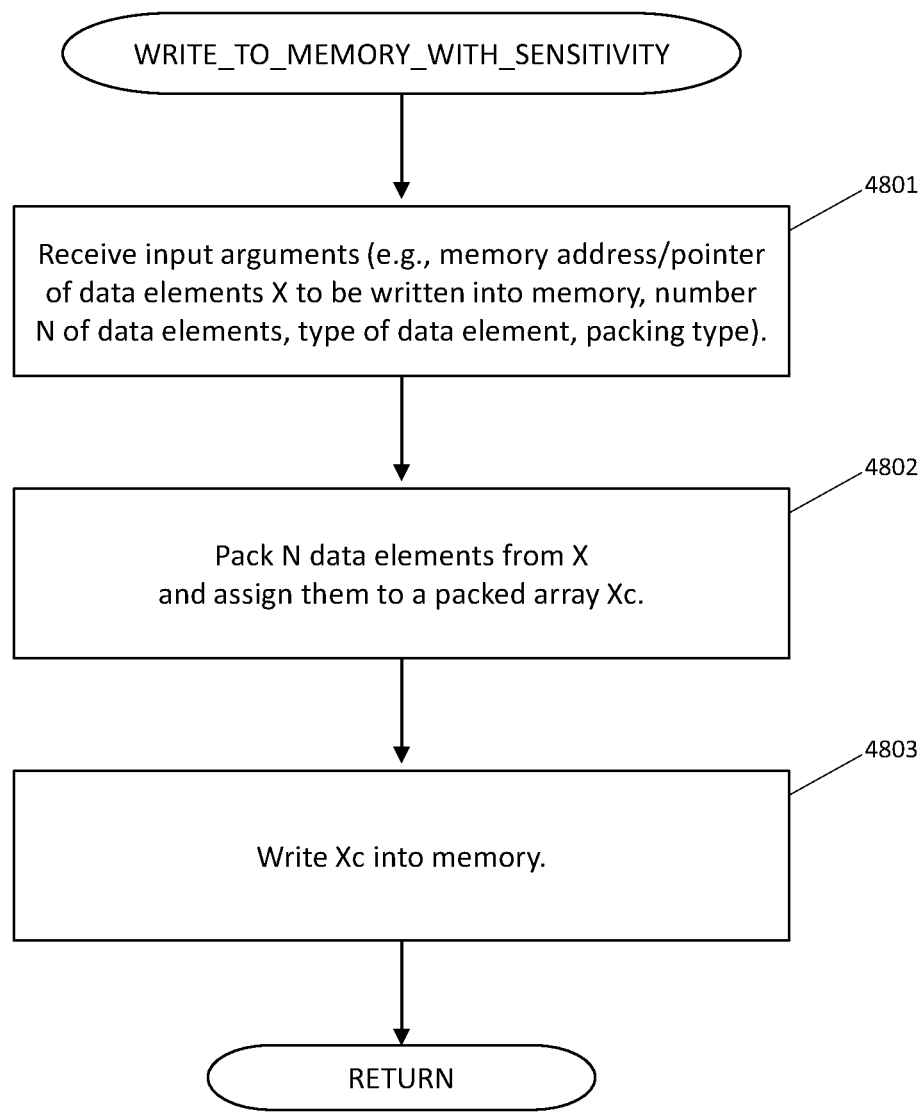

FIG. 48 shows an exemplary embodiment that may be used for writing data elements into memory using sensitivity information. The embodiment of FIG. 48, which we call "WRITE_TO_MEMORY_WITH_SENSITIVITY" receives input arguments in 4801. Input arguments may include memory addresses or pointers to an array of data elements X that are in a lower hierarchy memory system and that should be written into a higher hierarchy memory system, the size of the array X, and any other additional information or parameters, such as type of data element (e.g., floating point, double precision floating point, fixed point, integer), or packing type (e.g., bit elimination/bit replacing, sign-exponent compression, full array compression). Then, in 4802 the elements of the array X are packed accordingly and assigned to an array Xc. Finally, in 4803 the array Xc is transferred to an external memory. One skilled in the art should notice that the elements 4801, 4802, and 4803 may be used in different order or combinations. Also, transfers to external memory may be handled automatically by instructions in a computer device 101. For example, computer devices with different memory hierarchies (e.g., cache memory 309 and memory 302) may automatically try to optimize access to data, keeping some data elements into a lower-level memory, but reaching to higher-level memory when the data is not or does not fit in cache memory 309.

FIG. 49 shows an exemplary embodiment described in the C programming language, and that may be compiled and executed in a computer device 101. The embodiment in FIG. 49 is a function called "WriteToMemoryWithSensitivitiy", and receives a number of parameters: pointer to an array of double precision data X; an integer Nx that contains the number of elements in X; an unsigned 64-bit integer Xv that contains the sensitivities of the data elements in X; a pointer to an array of sensitivity-based packed elements Xc; a pointer to an integer Index_Xc that indicates the data element of the array Xc that has at least one bit available for writing; integer indicating the first number of the first bit, from MSB to LSB, of Xc[*Index_Xc] that is available for writing; an integer called PackingType that may be used for specifying a particular packing implementation mode; and auxiliary pointers to arrays se, sec, and vm, that should be allocated and initialized before calling this function, and that may be used for storing temporary data during the call to WriteToMemoryWithSensitivity. Memory allocation of arrays may be done prior to calling this function to reduce the execution time of the function. The embodiment in FIG. 49 illustrates two packing types, namely bit elimination with compressed sign and exponents, and bit replacing. However, other packing types may be incorporated to the function. The function WriteToMemoryWithSensitivity calls three functions, namely PushToArray (e.g., as described in embodiments related to FIG. 39), Compress (e.g., as described in embodiments related to FIG. 29B), and PushArrayToArray. The latter function has the prototype:

unsigned long PushArrayToArray(unsigned long *SourceArray,
        unsigned long FirstBitFromSourceToPush,
        unsigned long NumberOfBitsToPush,
        unsigned long *DestinationArray,
        unsigned long *DestinationArrayIndex,
        unsigned long *DestinationArrayBitPointer), where SourceArray is a pointer to an array that contains the bits that are going to be copied to a destination array, and DestinationArray is a pointer to the array that will contain the copied bits. The integer FirstBitFromSourceToPush indicates the bit number, from MSB to LSB, of the first element of SourceArray to be copied. Starting at this bit, the integer NumberOfBitsToPush indicates the number of bits to be copied. As an input, the argument DestinationArrayIndex is a pointer to the element of DestinationArray that will contain the first bit copied from SourceArray. As an output, DestinationArrayIndex is a pointer to the element of DestinationArray that contains bit that follows the last bit copied from SourceArray. Similarly, as an input, the argument DestinationArrayIndex is a pointer to a memory address that contains the bit number of DestinationArray[*DestinationArrayIndex], from MSB to LSB, that will contain the first bit copied from SourceArray. As an output, DestinationArrayIndex is a pointer to a memory address that will contain the bit of DestinationArray[*DestinationArrayIndex] that follows the last bit of SourceArray copied. The function WriteToMemoryWithSensitivity may be further optimized for faster execution. One skilled in the art should notice that the function WriteToMemoryWithSensitivity may be defined using other programming languages, instructions, encodings, data types, etc., while maintaining the spirit of the invention.

Figure 50:
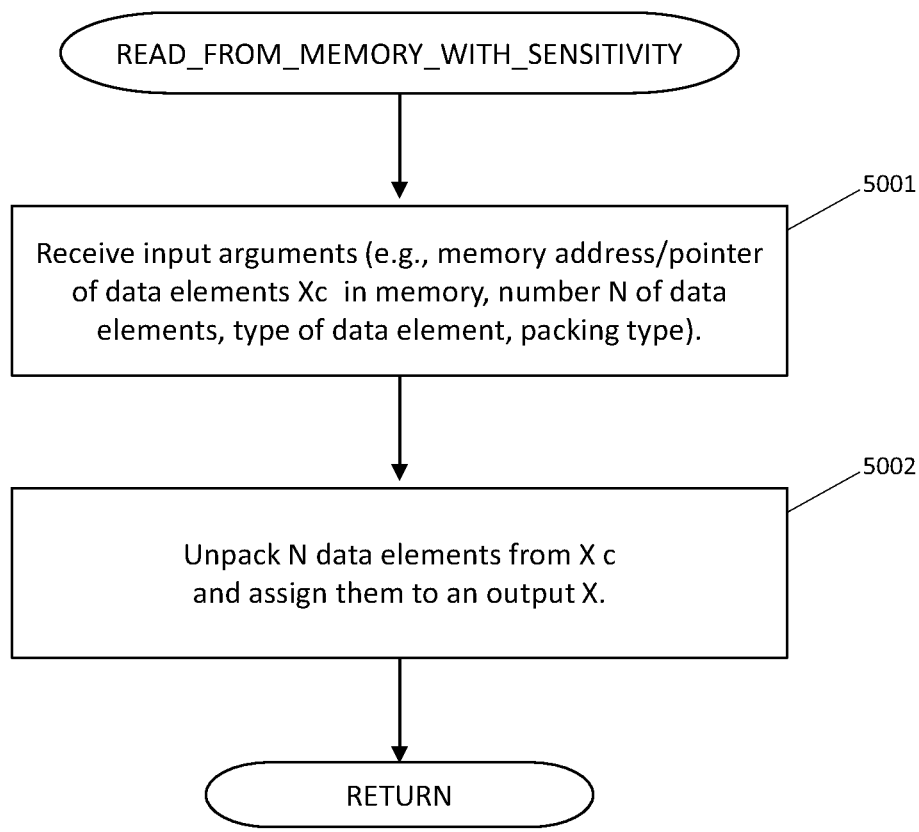

FIG. 50 shows an exemplary embodiment that may be used for reading data that has been stored into a higher hierarchy memory using sensitivity information. The embodiment of FIG. 50, which may be defined or invoked by the name "READ_FROM_MEMORY_WITH_SENSITIVITY" receives input arguments in 5001. Examples of input arguments are memory addresses or pointers to arrays of packed data Xc and unpacked data X, the number N of data elements to be read, the type of data element to be processed (e.g., floating point, double precision floating point, fixed point, integer), packing type, and compression specifications, among others. Based on the information received in 5001, in 5002 N elements are unpacked from Xc and assigned to a variable X. After this is done, READ_FROM_MEMORY_WITH_SENSITIVITY returns.

FIG. 51 shows an exemplary embodiment described in the C programming language, and that may be compiled and executed in a computer device 101. The embodiment in FIG. 51 is a function called "ReadFromMemoryWithSensitivity", and receives a number of parameters: pointer to an unsigned array of 64-bit integers Xc that contains sensitivity-based packed data; number of elements Nx to be read from memory; pointer to an array of double precision floating point data X; a pointer to an array of 64-bit unsigned integers that will contain the sensitivities of floating point data elements in X; a pointer to an integer Index_Xc that indicates the element of Xc that contains the first bit to be read; a pointer to an integer BitPointer_Xc that indicates position of a bit, from MSB to LSB, in the array Xc[*Index_Xc] to be read first; an integer PackingType to specify the type of packing; and auxiliary pointers to arrays se, sec, and vm, that should be allocated and initialized before calling this function, and that may be used for storing temporary data during the call to ReadFromMemoryWithSensitivity. Two packing types are illustrated in FIG. 51, namely bit elimination with compressed sign and exponents, and bit replacing. However, other packing types may be incorporated to the function. The function ReadFromMemoryWithSensitivity calls three functions, namely PullFromArray (e.g., as described in embodiments related to FIG. 45), Decompress (e.g., as described in embodiments related to FIG. 30B), and PullArrayFromArray. The latter function has the prototype:

unsigned long PullArrayFromArray(unsigned long *SourceArray,
        unsigned long *SourceArrayIndex,
        unsigned long *SourceArrayBitPointer,
        unsigned long *DestinationArray,
        unsigned long NumberOfBitsToPull), where SourceArray is a pointer to an array that contains the bits that are going to be copied to a destination array, and DestinationArray is a pointer to the array that will contain the copied bits. As an input, the argument SourceArrayIndex is a pointer to the element of SourceArray that will contain the first bit copied from SourceArray. As an output, SourceArrayIndex is a pointer to the element of SourceArray that contains bit that follows the last bit copied to DestinationArray. Similarly, as an input, the argument SourceArrayIndex is a pointer to a memory address that contains the bit number of SourceArray[*SourceArrayIndex], from MSB to LSB, that contains the first bit copied to DestinationArray. As an output, DestinationArrayIndex is a pointer to a memory address that contains the bit of SourceArray [*SourceArrayIndex] that follows the last bit of SourceArray copied. The integer NumberOfBitsToPush indicates the number of bits to be copied. The function ReadFromMemoryWithSensitivity may be further optimized for faster execution. One skilled in the art should notice that the function ReadFromMemoryWithSensitivity may be defined using other programming languages, instructions, encodings, data types, etc., while maintaining the spirit of the invention.

It is to be understood that all of the embodiments described in this document are merely illustrative of numerous and varied other embodiments which may constitute applications of the principles of the invention. Such other embodiments may be readily devised by those skilled in the art without departing from the spirit or scope of this invention and it is our intent they be deemed within the scope of our invention.

The patent applications, patents, and literature references cited herein indicate the knowledge of those of ordinary skill in this field and are hereby incorporated by reference in their entirety. In the case of inconsistencies between any reference cited herein and the specific teachings of the present disclosure, this disclosure will prevail. Similarly, any inconsistencies between an art-understood meaning of a term and a meaning of a term as specifically taught in the present disclosure will be resolved in favor of this disclosure.

What is claimed is:

1. A method for use in a computer system having a hierarchical memory system with at least first and second memory tiers, the first memory tier being faster than the second memory tier, the method enabling more data to be stored in the first memory tier so as to be more quickly accessed by a processor, the method being performed by a processor and comprising:
    performing an operation with two operands to determine an initial result of the operation, each operand being associated with a sensitivity value, wherein each sensitivity value indicates a number of bits of at least a portion of an associated data value that are not garbage bits, and wherein the initial result is computed without regard to the sensitivity value of either of the operands;
    determining a sensitivity value for a final result based at least on the sensitivity values of each of the operands;
    developing the final result as a function of the initial result and the determined sensitivity value for the final result;
    compressing only that portion of the final result that does not correspond to garbage bits as indicated by the sensitivity value of the final result; and
    storing the compressed final result and a representation of its sensitivity value in the first memory tier.

2. The invention of claim 1, wherein the final result is retrieved from the first memory tier and used as one of the operands during a repetition of the method.

3. The invention of claim 1, further comprising:
    determining a sensitivity value for at least one of the operands.

4. The invention of claim 1, wherein at least one of the operands is retrieved from the first memory tier.

5. The invention of claim 1, wherein each of the operands is retrieved from the second memory tier.

6. The invention of claim 1, wherein the representation of the sensitivity stored in the first memory tier is a compressed representation.

7. The invention of claim 1, wherein the operands, initial result, and final result are represented in a format having an exponent and a mantissa.

8. The invention of claim 1, wherein the wherein the operands are represented in a format having an exponent and a mantissa and wherein the sensitivity value of the final result is further based on the values of the exponents of the operands.

9. The invention of claim 1, wherein each operand is in a floating point representation such that each operand comprises a sign bit, a plurality of exponent bits, and a plurality of mantissa bits, and wherein each sensitivity value indicates how many most significant bits of the mantissa of its associated respective value are not garbage bits.

10. The invention of claim 1, wherein the determining of the sensitivity value of the final result is further based on at least one of the group consisting of: the operation performed with two operands and a purpose for which the final result will be used.

11. The invention of claim 1, wherein the sensitivity value of the final result is determined using a garbage tracking consistent algorithm.

12. The invention of claim 1, wherein the sensitivity value of the final result is determined using one of the group consisting of: a 0-conservative algebra; an N-conservative, algebra, where N is a positive integer number; an N-aggressive algebra, where N is an integer number; a 0-conservative backward sensitivity; a windowed 0-conservative backward sensitivity; and a progressive 0-conservative backward sensitivity.

13. The invention of claim 1, wherein the final result is stored in the first memory tier using a massively asymmetric precision data representation.

14. A rule-based method for speeding computations performed on values of an array by a computer having at least two memories, a first memory of the two memories having faster access thereto by a computational processor of the computer than a second memory of the two memories, the method comprising:
   a) performing an operation with a set of two operands to determine an initial result of the operation, wherein a first of the two operands of the set is a member of the array and wherein each of the operands is associated with a sensitivity value that indicates a number of bits of at least a portion of a value of each operand that are not garbage bits, and wherein the initial result is computed without regard to the sensitivity value of either of the operands;
   b) obtaining a predicted value for the initial result;
   c) determining an error value between the predicted value and the initial value;
   d) performing a secondary operation according to a prescribed set of rules based on the sensitivity value of each of the operands to determine a sensitivity value for the initial result;
   e) developing a final result as a function of the error value and the determined sensitivity value for the initial result wherein the final result retains only bits of the error value that are not garbage bits;
   f) assigning the sensitivity value for the initial result as a sensitivity value of the final result;
   g) packing the final result and the sensitivity value of the final result into a representation of the array at a location in the first memory corresponding to the location in the array of the first of the two operands;
   h) storing the final result in association with its sensitivity; and
   i) repeating steps a through h wherein two different operands make up the set of two operands and wherein a first of the two different operands is a member of the array;
   whereby less storage capacity in the first memory is used than had the array be represented in its native representation.

15. The invention of claim 14, further comprising repeating step i until all members of the array are processed.

16. The invention of claim 14, wherein the array is initially stored in the second memory.

17. The invention of claim 14, wherein the array is initially stored in the first memory.

18. The invention of claim 14, wherein the operands, initial result, and final result are represented in a format based on an exponent and a mantissa.

19. The invention of claim 14, wherein the wherein the operands are represented in a format having an exponent and a mantissa and wherein the sensitivity value of the initial result is further based on the values of the exponents of the operands.

20. The invention of claim 14, wherein each operand is in a floating point representation such that each operand comprises a sign bit, a plurality of exponent bits, and a plurality of mantissa bits, and wherein each sensitivity value indicates how many most significant bits of the mantissa of its associated respective value are not garbage bits.

21. The invention of claim 14, wherein there is insufficient storage capacity in the first memory to store the array in its native representation.

22. The invention of claim 14, wherein the prescribed set of rules is determined based on at least one of the group consisting of: the particular operation performed with set of two operands and the purpose for which the final result will be used.

23. The invention of claim 14, wherein the prescribed set of rules make up a garbage tracking consistent algorithm.

24. The invention of claim 14, wherein the prescribed set of rules correspond to one of the group consisting of: a 0-conservative algebra; an N-conservative, algebra, where N is a positive integer number; an N-aggressive algebra, where N is an integer number; a 0-conservative backward sensitivity; a windowed 0-conservative backward sensitivity; and a progressive 0-conservative backward sensitivity.

25. A method for use by a computing system having a processor, the method improving operation of the computing system when subsequent computations are based on a first set of data elements that represent information, the first set of data elements initially being located in a first memory, by storing at least some of the results of the computations using the first set of data elements as a second set of data elements in a second memory, the second memory being faster but containing less storage capacity than the first memory, the method comprising:
   deriving, by the processor, the second set of data elements by performing respective calculations for each of the data elements of the first set, wherein each calculation takes at least two operands, at least one of the operands being a data element of the first set, to obtain a set of results, each operand of each calculation being associated with a sensitivity value that indicates at least a portion of a value of the associated operand that are not garbage bits, and wherein each calculation is performed without regard for the sensitivity value of any operand;
   performing, by the processor, a secondary operation according to a prescribed set of rules based on the respective sensitivity values of each of the operands and the computation performed on the operands to determine a sensitivity value for each result of the set of results;
   producing, by the processor, the second set of data elements by effectively eliminating from each result all garbage bits as indicated by each result's corresponding sensitivity value to produce corresponding reduced bit data elements; and
   storing as many of the second set of data elements and their associated sensitivity values as will fit into the second memory.

26. The invention of claim 25, wherein the second set of data elements and their associated sensitivity are not stored in the first memory after being developed by the processor prior to being stored in the second memory.

27. The invention of claim 25, wherein any of the second set of data elements and their associated sensitivity that cannot be stored in the second memory because of lack of available storage capacity therein are stored in the first memory.

28. The invention of claim 25, wherein producing the second set of data elements further comprises packing the set of results after all garbage bits are effectively eliminated therefrom.

29. The invention of claim 25, wherein the sensitivity values are packed prior to their storing.

30. The invention of claim 25, wherein the prescribe set of rules is determined based on at least one of the group consisting of: the operation performed with set of two operands and a purpose for which the final result will be used.

31. The invention of claim 25, wherein the prescribed set of rules make up a garbage tracking consistent algorithm.

32. The invention of claim 25, wherein the prescribed set of rules correspond to one of the group consisting of: a 0-conservative algebra; an N-conservative, algebra, where N is a positive integer number; an N-aggressive algebra, where N is an integer number; a 0-conservative backward sensitivity; a windowed 0-conservative backward sensitivity; and a progressive 0-conservative backward sensitivity.

33. The invention of claim 25, wherein the improved operation of the computing system results in at least one of the group consisting of: operating the computing system with lower power and speeding performance of the subsequent computations.

34. A method for speeding computation by a computing system through the transformation of a set of data elements located in a first memory and representing first information into a second set of data elements that represents the information but is stored in a second memory that is faster but contains less storage space than the first memory, the method comprising:
- obtaining from the first memory each data element from its location in the first memory, each data element having associated therewith a sensitivity value that indicates at least a portion of the value of the data element are not garbage bits;
- obtaining the sensitivity value for each data element in conjunction with obtaining the data element;
- reducing the number of bits used in the representation of the value of each data element by eliminating therefrom all bits indicated to be garbage bits by its corresponding sensitivity to produce reduced bit data elements;
- packing as many reduced bit data elements and their associated sensitivity values as will fit into the second memory;
- retrieving the reduced bit data elements and their associated sensitivity from the secondary memory; and
- performing computations using the retrieved values of the reduced bit data elements, wherein each reduced bit data element is expanded to a full bit representation based on its associated sensitivity value prior to performing a computation with it.

35. The invention of claim 34, further comprising:
- determining a sensitivity value for the resulting data element of each computation;
- reducing the number of bits used in the representation of the value of each resulting data element by effectively eliminating therefrom all bits indicated to be garbage bits by its corresponding sensitivity to produce reduced bit resulting data elements; and
- packing as many reduced bit resulting data elements and their associated sensitivity as will fit into the second memory.

* * * * *